US008866511B2

United States Patent
Dally

(10) Patent No.: US 8,866,511 B2
(45) Date of Patent: Oct. 21, 2014

(54) MATRIX PHASE DETECTOR

(71) Applicant: NVIDIA Corporation, Santa Clara, CA (US)

(72) Inventor: William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 39 days.

(21) Appl. No.: 13/688,175

(22) Filed: Nov. 28, 2012

(65) Prior Publication Data

US 2014/0139276 A1     May 22, 2014

Related U.S. Application Data

(63) Continuation-in-part of application No. 13/681,929, filed on Nov. 20, 2012, now Pat. No. 8,760,204.

(51) Int. Cl.
- *H03D 13/00* (2006.01)
- *G01R 25/00* (2006.01)
- *H03L 7/00* (2006.01)
- *H03K 5/00* (2006.01)

(52) U.S. Cl.
CPC ... *H03L 7/00* (2013.01); *H03K 5/00* (2013.01)
USPC .................. 327/9; 327/3; 327/12; 324/76.77

(58) Field of Classification Search
CPC ................ H03D 13/00; H03D 13/003–13/006; H03L 7/091; G01R 25/00; G01R 25/005
USPC ............. 327/2, 3, 7–10, 12; 324/76.77, 76.82
See application file for complete search history.

(56) References Cited

U.S. PATENT DOCUMENTS

| 5,511,100 | A | 4/1996 | Lundberg et al. | |
| 5,694,377 | A * | 12/1997 | Kushnick | 368/120 |
| 6,194,938 | B1 | 2/2001 | Waldrop | |
| 7,304,510 | B2 * | 12/2007 | Matsuta | 327/3 |
| 7,791,377 | B2 * | 9/2010 | Kim et al. | 327/2 |
| 7,804,344 | B2 | 9/2010 | Ma et al. | |
| 7,999,531 | B2 * | 8/2011 | Ichiyama | 324/76.52 |
| 8,018,258 | B2 | 9/2011 | Ma et al. | |
| 8,098,085 | B2 * | 1/2012 | Wang et al. | 327/8 |
| 8,415,983 | B2 * | 4/2013 | Tokairin | 327/12 |
| 8,760,204 | B2 | 6/2014 | Dally et al. | |
| 2012/0069884 | A1* | 3/2012 | Sakurai | 375/224 |
| 2014/0132245 | A1 | 5/2014 | Dally et al. | |
| 2014/0149780 | A1 | 5/2014 | Dally et al. | |

OTHER PUBLICATIONS

Dally, W. J. et al., "The Even/Odd Synchronizer: A Fast, All-Digital, Periodic Synchronizer," IEEE Symposium on Asynchronous Circuits and Systems, IEEE Computer Society, 2010, pp. 75-84.

(Continued)

*Primary Examiner* — Patrick O'Neill
(74) *Attorney, Agent, or Firm* — Zilka-Kotab, PC

(57) ABSTRACT

A method and a system are provided for clock phase detection. A first set of delayed versions of a first clock signal is generated and a second set of delayed versions of a second clock signal is generated. The second set of delayed versions of the second clock signal is sampled using the first set of delayed versions of the first clock signal to produce an array of clock samples in a domain corresponding to the first clock signal. At least one edge indication is located within the array of clock samples.

18 Claims, 47 Drawing Sheets

(56) References Cited

OTHER PUBLICATIONS

Dally, W. et al., U.S. Appl. No. 12/957,262, filed Nov. 30, 2010.
Dally, W. J. et al., U.S. Appl. No. 13/676,021, filed Nov. 13, 2012.
Dally, W. J. et al., U.S. Appl. No. 13/681,929, filed Nov. 20, 2012.

Notice of Allowance from U.S. Appl. No. 13/681,929, dated Feb. 10, 2014.

Non-Final Office Action from U.S. Appl. No. 13/681,929, dated Oct. 4, 2013.

* cited by examiner

MATRIX PHASE DETECTOR

CLAIM OF PRIORITY

This application is a continuation-in-part of U.S. application Ser. No. 13/681,929, filed Nov. 20, 2012, the entire contents of which are incorporated herein by reference.

FIELD OF THE INVENTION

The present invention relates to circuits, and, more specifically to clock phase detection.

BACKGROUND

Many digital systems have multiple clock domains. Thus, when signals move from one clock domain to another, they must be synchronized to avoid metastability and synchronization failure. If the two clocks have fixed frequencies, the phase relationship between the two clocks is periodic, at the beat frequency of the two clocks. By taking advantage of this periodic phase relationship, a periodic synchronizer can be simpler, have lower latency, and a lower probability of failure than a synchronizer that has to handle crossing clock domains where at least one of the clocks operates at a variable frequency.

When at least one of the clocks operates at a variable frequency, the design of the synchronizer is more complicated. Typically, signals passing between clock domains are synchronized with a periodic clock using asynchronous first-in-first outs (FIFOs). A significant area overhead is incurred for the FIFO memory. The FIFOs also add several cycles of delay as the Gray-coded input and output pointers of the FIFO must be synchronized through multiple flip-flops to reliably transmit the signals across clock domains.

There is thus a need for addressing these and/or other issues associated with the prior art.

SUMMARY

A method and a system are provided for clock phase detection. A first set of delayed versions of a first clock signal is generated and a second set of delayed versions of a second clock signal is generated. The second set of delayed versions of the second clock signal is sampled using the first set of delayed versions of the first clock signal to produce an array of clock samples in a domain corresponding to the first clock signal. At least one edge indication is located within the array of clock samples.

DETAILED DESCRIPTION

Figure 1A:
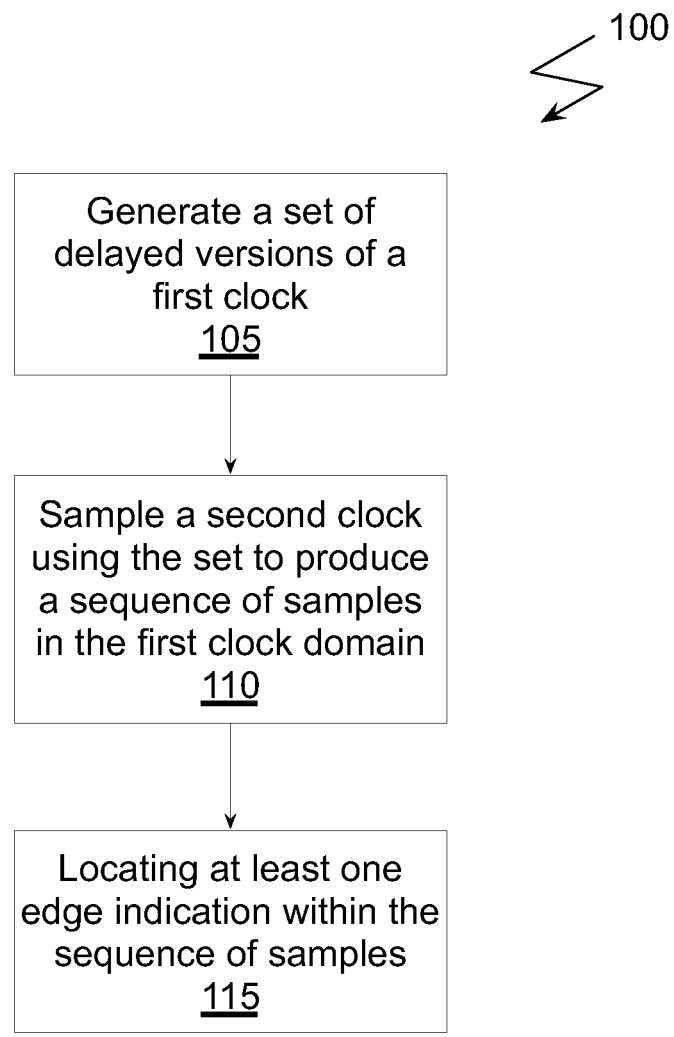
FIG. 1A illustrates a flowchart of a method for locating an edge indication within a sequence of clock signal samples, in accordance with one embodiment.

Processors used in smartphones, tablets, laptops, and other mobile devices sometimes reduce the supply voltage provided to one or more integrated circuit devices to reduce power consumption and extend the time between battery recharging. The integrated circuit devices may also vary the power supply voltage levels to different circuits within the device based on different operating modes. Power supply voltages may also change due to transients in the supply current drawn by a component. As a power supply voltage level is reduced, any clock signals dependent on the particular power supply voltage level may operate at a lower frequency. When the power supply voltage level increases, the frequency of the clock signal also increases. Because the clock frequencies may vary as a function of power supply voltage levels, conventional synchronization techniques that rely on a fixed relationship between different clock domains cannot be relied on for transmitting signals between clock domains where at least one of the clocks has a variable frequency.

Although, clock frequencies may vary in response to varying power supply voltage levels, the techniques described herein may also be applied to situations for which the clock frequencies vary for other reasons. For example, clock frequencies may vary as temperature varies or may vary as a result of programming.

With respect to the present description, a first clock domain is a clock domain of any type of system from which a signal may be sampled. For example, the first clock domain could be a clock domain of a central processing unit (CPU), a graphics processing unit (GPU), a memory controller, and/or any other system with a clock domain. The first clock domain may include a first clock signal having a particular frequency or a frequency that may vary. A second clock domain may include a second clock signal having a particular frequency or a frequency that may vary. Signals that are transmitted from the second domain to the first domain are synchronized to the first clock domain.

Rather that using a conventional synchronizer that passes signals between clock domains using asynchronous first-in, first-out buffers (FIFOs), a low latency synchronizer may be may be designed that uses the relative phase between the two clock domains. Assuming that the first clock signal is in a receiving clock domain and the second clock signal is in a transmitting clock domain, the relative phase is used to determine when signals in the transmitting clock domain may be sampled in the receiving clock domain. A high-resolution phase detector, described further herein, may be configured to track frequency transients and generate the relative phase and period between the two clock domains when one or both clock signals have varying frequencies. The high-resolution phase detector uses the first clock signal that is the local or receiving clock (clkr) and accepts the second clock signal from the transmitting clock domain (clkt). The high-resolution phase detector outputs two signals that encode: a phase value (Phase) and a period value (Period). The phase value represents the time, in clkr unit intervals (UI), from the last transition on clkt to the last transition on clkr. The period value represents the time, in clkr UI, between the last two transitions on clkt.

FIG. 1A illustrates a flowchart of a method 100 for locating an edge indication within a sequence of clock signal samples, in accordance with one embodiment. At step 105, a set of delayed versions of the first clock signal is generated. Each delayed version of the first clock signal is a different phase of the first clock signal. At step 110, the second clock signal is sampled using the set of delayed versions of the first clock signal to produce a sequence of samples in the first clock domain. Then, at step 115, at least one edge indication is located within the sequence of samples. The edge indication is a rising or falling transition of a sample of the sequence of samples. The at least one edge indication may be used to compute the phase and period values.

Figure 1B:
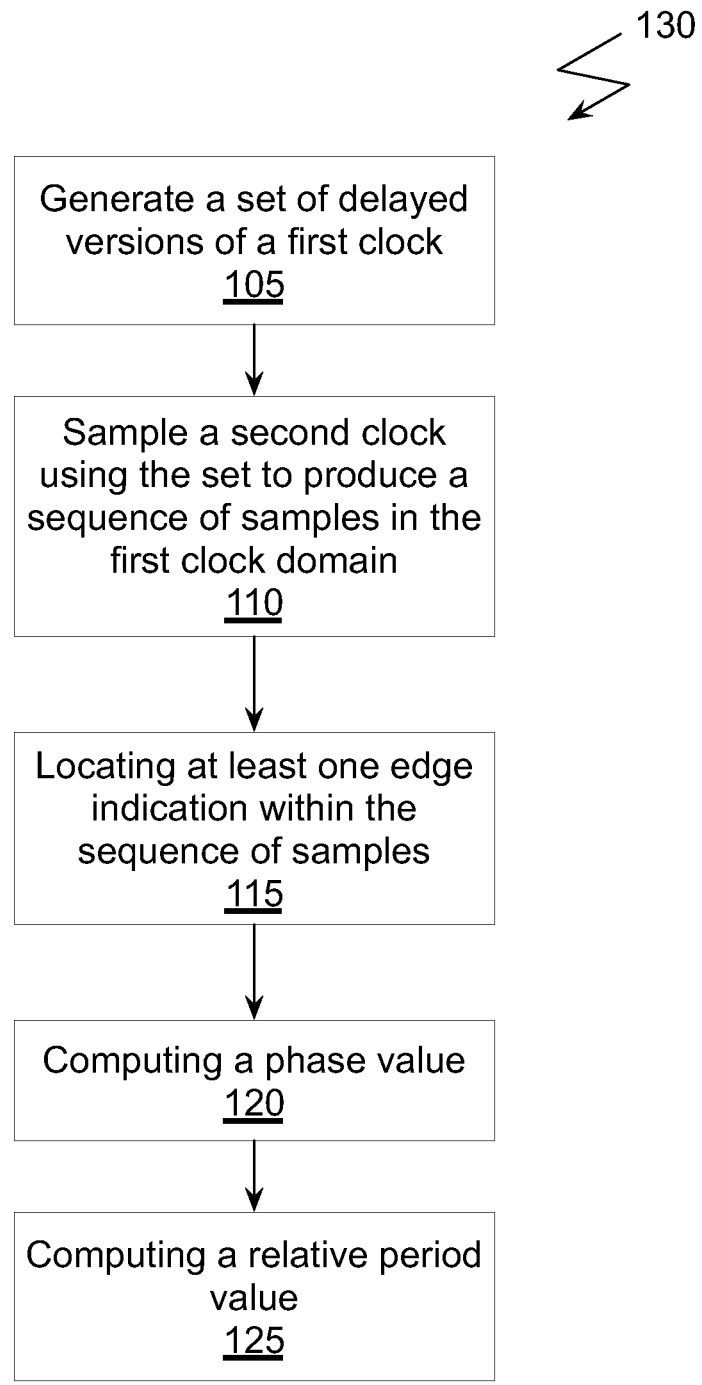
FIG. 1B illustrates a flowchart of a method for using the edge indication to detect a phase, in accordance with one embodiment.

FIG. 1B illustrates a flowchart of a method 130 for using the edge indication to detect a phase, in accordance with one embodiment. Steps 105, 110, and 115 are completed to provide at least one edge indication. At step 120, the most recent edge indication is processed to compute a phase value representing a phase of the second clock signal relative to the first clock signal. At step 125, the two most recent edge indications are processed to compute a period value representing a relative period between the second clock signal and the first clock signal.

Figure 2A:
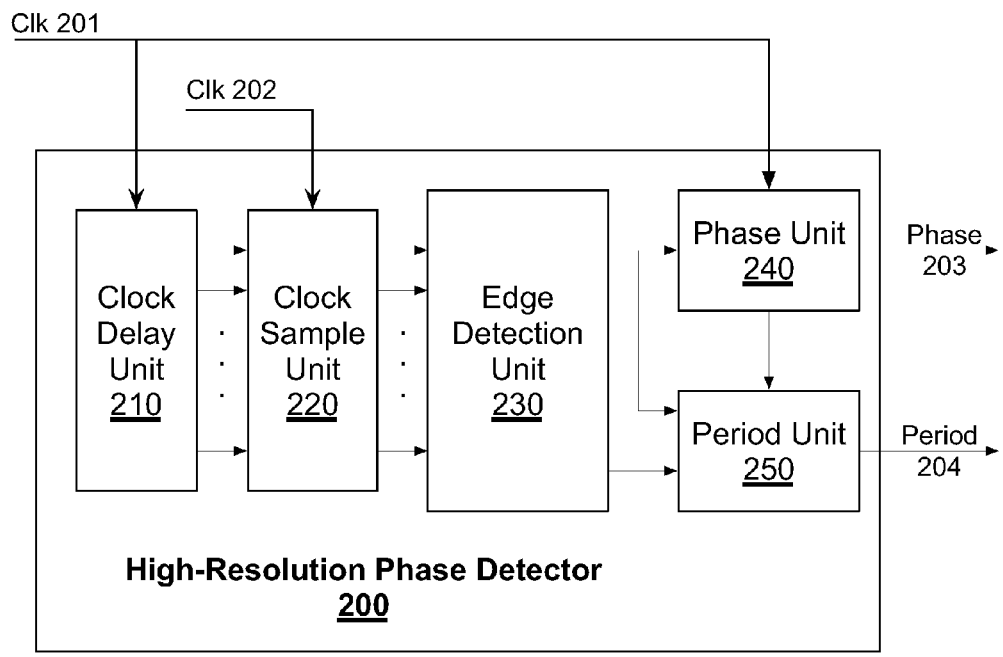
FIG. 2A illustrates a high-resolution phase detector, in accordance with one embodiment.

FIG. 2A illustrates a high-resolution phase detector 200, in accordance with one embodiment. The high-resolution phase detector 200 includes a clock delay unit 210, a clock sample unit 220, an edge detection unit 230, a phase unit 240, and a period unit 250. The high-resolution phase detector 200 receives a first clock signal, Clk 201, and a second clock signal, Clk 202, and generates two values, a phase 203 and a period 204. The phase 203 and period 204 values are each encoded by multi-bit signals. The value of phase 203 represents a phase of the second clock relative to the first clock. The value of period 204 represents a relative period between the second clock and the first clock. At least one of the first clock and the second clock may vary over time. The high-resolution phase detector 200 is designed to continuously measure the phase and period as the frequency of the first clock and/or the second clock varies.

Figure 2B:
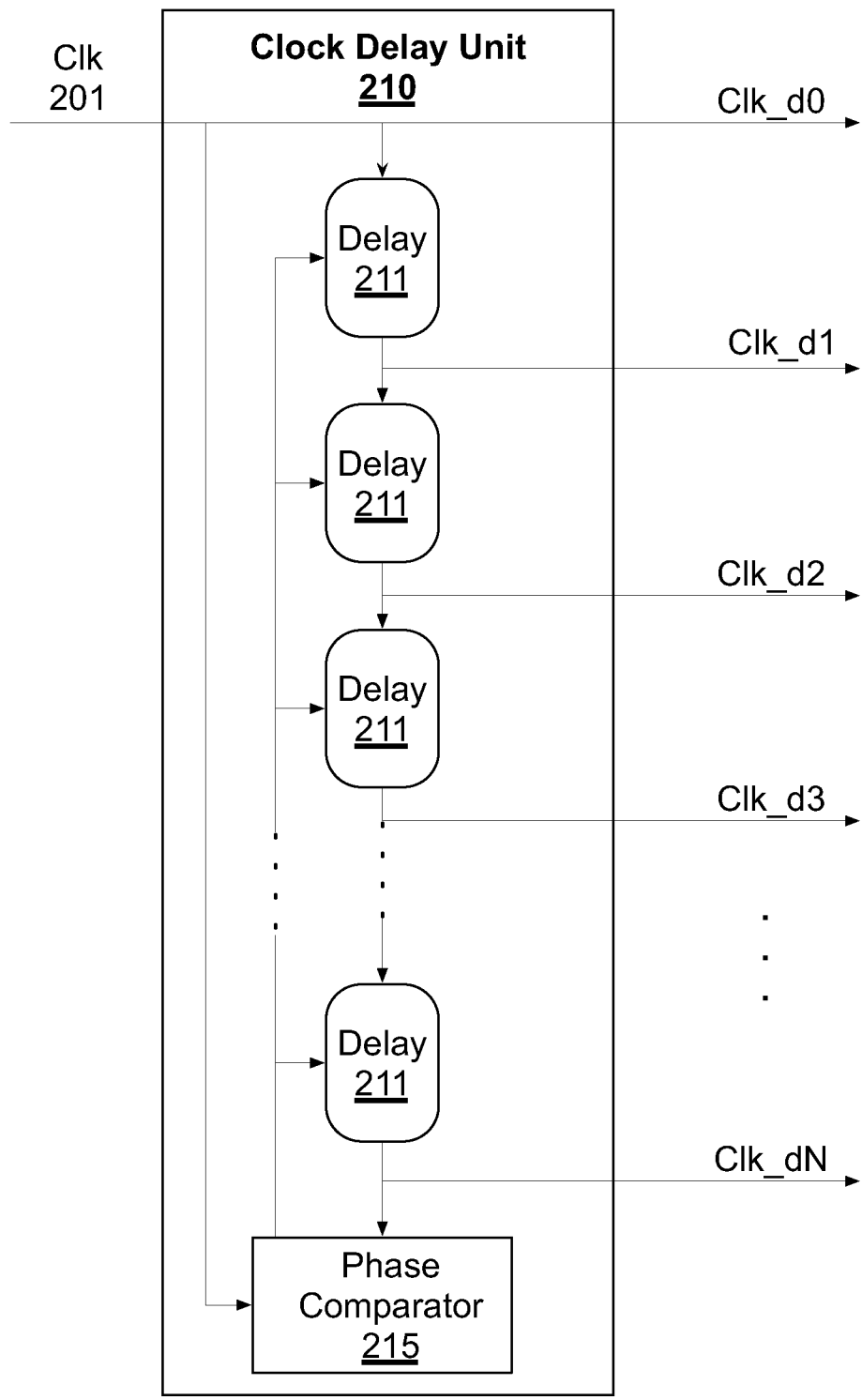
FIG. 2B illustrates a clock delay unit of FIG. 2A, in accordance with one embodiment.

FIG. 2B illustrates the clock delay unit 210 of FIG. 2A, in accordance with one embodiment. A series of N delay elements 211 produces N evenly-spaced different clock phases, delayed versions of Clk 201, specifically Clk_d0, Clk_d1, Clk_d2, Clk_d3, . . . Clk_dN. A phase comparator 215 configures the delay by which the delay elements 211 delay the respective input signals (Clk 201 and delayed versions of Clk 201) to ensure the clock phases span one period of the Clk 201, i.e., so that Clk 201=Clk_d0 has the same phase as Clk_dN. Because the phase comparator 215 controls the delay introduced by the delays elements 211, the clock delay unit 210 is a closed-loop delay circuit. The resolution of the high-resolution phase detector 200 may be increased by increasing the number of delayed versions of Clk 201 generated by the clock delay unit 210. In an alternative embodiment, the phase comparator 215 may be omitted and the clock delay line may be operated in an open-loop manner.

Figure 2C:
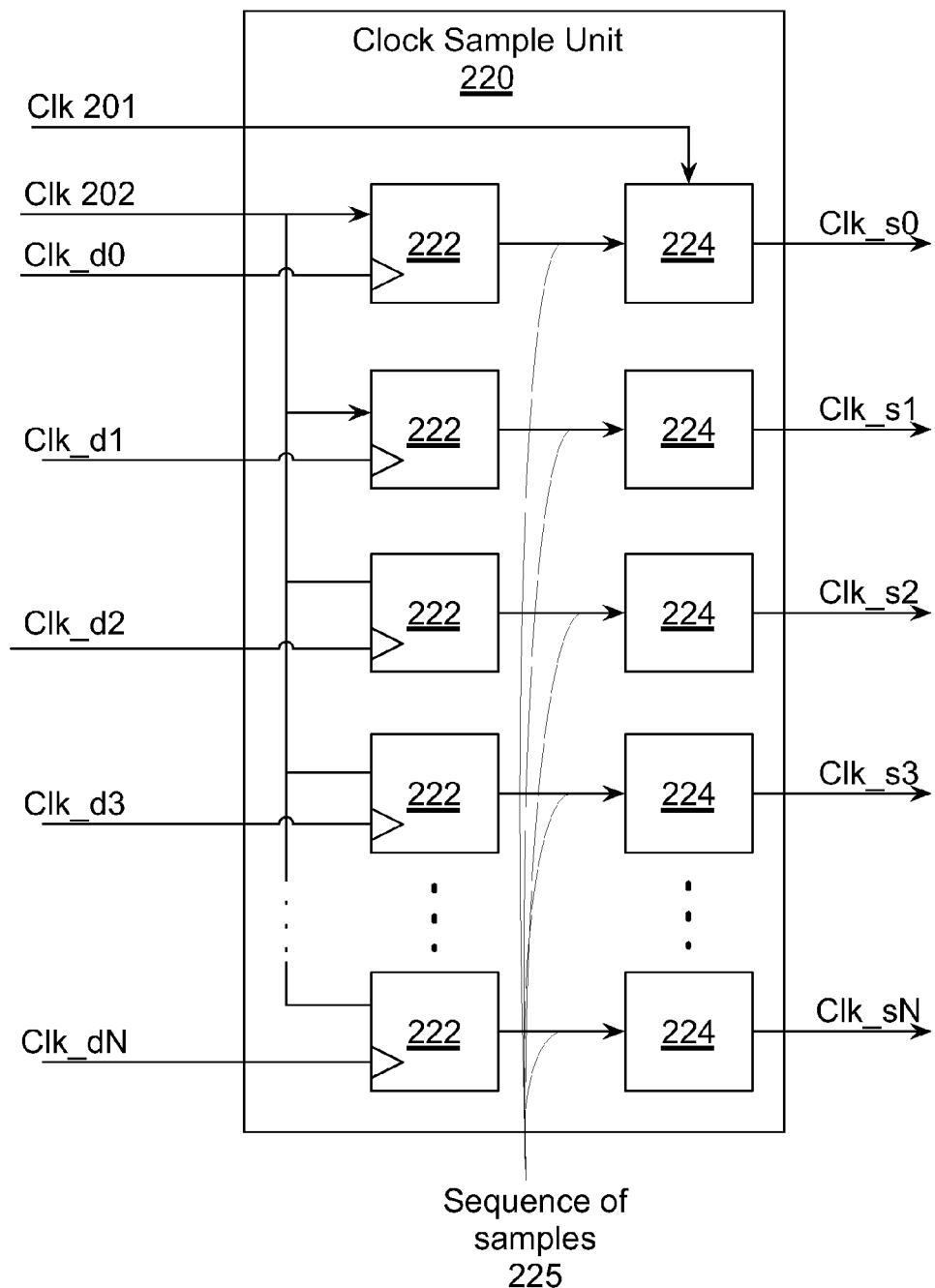
FIG. 2C illustrates a clock sample unit of FIG. 2A, in accordance with one embodiment.

FIG. 2C illustrates the clock sample unit 220 of FIG. 2A, in accordance with one embodiment. The clock sample unit 220 includes a plurality of flip-flops 222 and a corresponding plurality of synchronizers 224. The clock sample unit 220 receives the delayed versions of Clk 201 generated by the clock delay unit 210 and produces a sequence of samples of the second clock signal, Clk 202, in the domain of Clk 201. Each delayed version of the Clk 201, Clk_d0, Clk_d1, . . . Clk_dN is used to sample Clk 202, producing the sequence of samples 225 at the outputs of the flip-flops 222. The samples 225 are then retimed (to align the samples 225 with Clk 201) and synchronized (because the Clk 202 is an asynchronous signal) by the synchronizers 224 to produce the sequence of samples of Clk 202, Clk_s0, Clk_s1, Clk_s2, Clk_s3, . . . Clk_sN. The synchronizers 224 typically include one or more flip-flops, an amount that is high enough to achieve a low probability of synchronization failure. For example, 4 or 5 flip-flops in series results in a failure probability of less than $10^{-40}$.

Figure 2D:
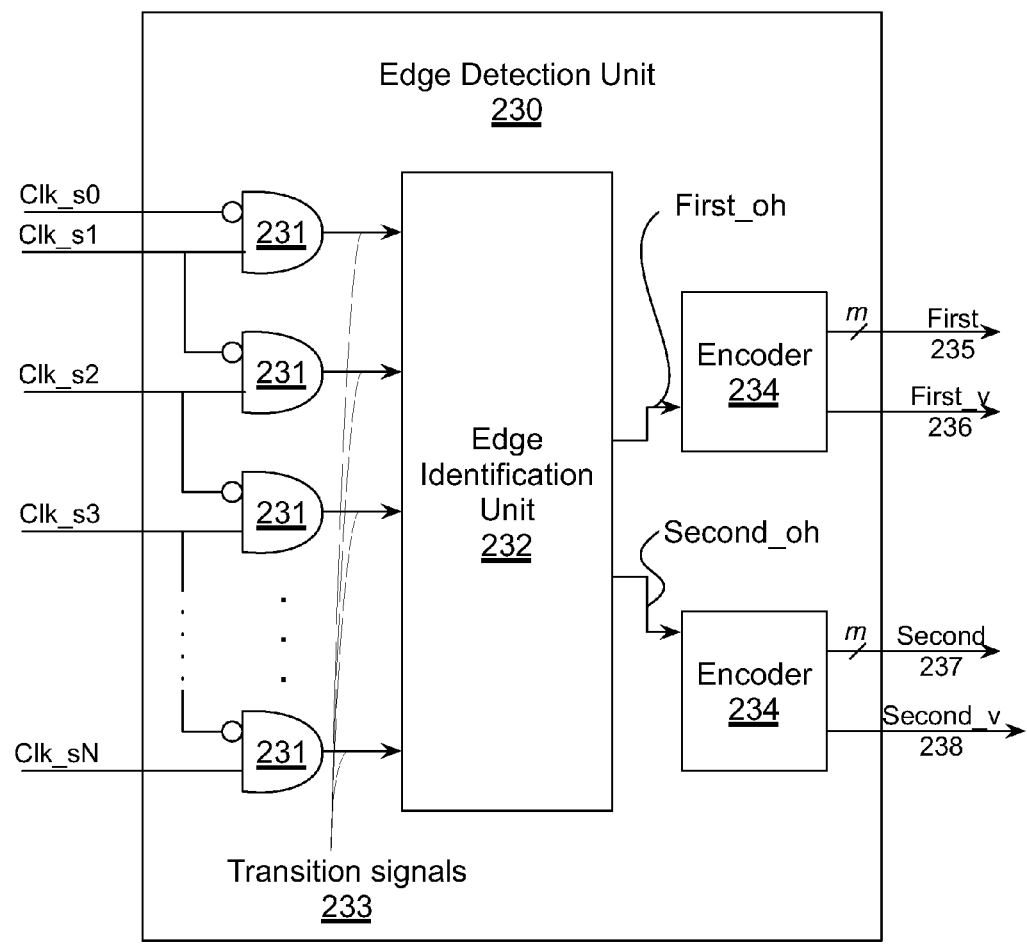
FIG. 2D illustrates an edge detection unit of FIG. 2A, in accordance with one embodiment.

FIG. 2D illustrates the edge detection unit 230 of FIG. 2A, in accordance with one embodiment. The edge detection unit 230 includes an array of AND gates 231, an edge identification unit 232, and a plurality of encoders 234. The edge detection unit 230 receives the sequence of samples Clk_s0, Clk_s1, . . . Clk_sN produced by the clock sample unit 220. The sequence of samples Clk_s0, Clk_s1, . . . Clk_sN are input to an array of AND gates 231 to locate edge indications, e.g., rising transitions within the sequence of samples. In other words, the array of AND gates 231 detect rising edges of the second clock signal, Clk 202 sampled by the first clock signal, Clk 201. In one embodiment, the edge detection unit 230 may be configured to locate edge indications that are falling transitions or both falling and rising transitions.

One or more bits of the transition signals 233, $t_i$=Clk_$s_{i-1}$ are true if a rising edge of the Clk 202 occurred between delayed versions of the Clk 201, Clk_$d_{i-1}$ and Clk_$d_i$, where i ranges from 0 to N. For example, when a rising edge of Clk 202 occurs between Clk_d3 and Clk_d4 and a falling edge of Clk 202 occurs between Clk_d7 and Clk d8, the Clk_s; signals are 000011110 and the transition signals 233 encode the value 000010000 for i ranging 0 to N=8. The transition signals 233, $t_i$, are input to an edge identification unit 232 that finds the first bit that is true and the second bit that is true (starting from $t_N$) in the sequence of transition signals 233—if any of the bits are true. A one-hot encoding of the first bit that is true and the second bit that is true are output on signals first_oh and second_oh that are in turn encoded by the encoders 234 into m=$\log_2$(N)-bit binary signals first 235 and second 237. The transition signals 233 and/or the first_oh and second_oh signals maybe considered as edge indications. The first 235 and the second 237 values are encoded as signals and indicate the locations of the edge indications, as a number of bit positions from $t_N$ where the first and second transitions occurred respectively. For example, when the transition signals 233 encode the value 000100010, the values of first_oh and second_oh, respectively are 000000010 and 000100000. In this case the values of first 235 and second 237 respectively are 1/8 and 5/8. Because there are eight bit positions in this example, an edge detected in position i indicates an edge that occurred i/8 of a cycle before the most recent edge of the Clk 201. Signals encode the values first_v 236 and second_v 238 that are also produced by the encoders 234 to indicate if a first and second transition were found, respectively.

Figure 2E:
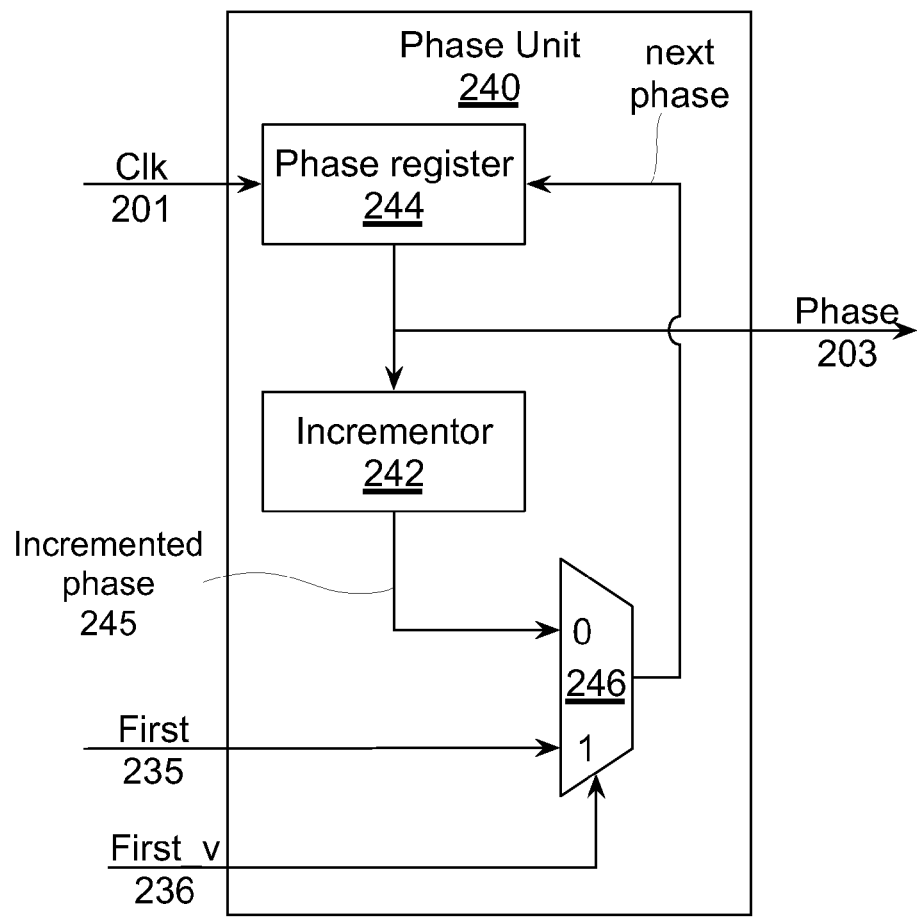
FIG. 2E illustrates a phase unit of FIG. 2A, in accordance with one embodiment.

FIG. 2E illustrates the phase unit 240 of FIG. 2A, in accordance with one embodiment. The phase unit 240 receives the values first 235 and first_v 236 from the edge detection unit 230 and generates the phase 203 value. The phase unit 240 includes a phase register 244, an incrementor 242, and a multiplexor 246. If a transition is detected, e.g., first_v 236 is asserted (is True) and first 235 equals the phase value. First 235 is a measure (in units of time) from the rising edge of Clk 201 to the most recent transition of the Clk 202. When first_v 236 is asserted, the multiplexor 246 selects the first 235 value as the output, next phase. When a transition is not detected, e.g., first_v 236 is not asserted and the multiplexor 246 selects the incremented phase 245 as the next phase. The incremented phase 245 value is computed by the incrementor 242 as phase 203 incremented by ONE. The constant ONE represents one period of the Clk 201. In the previous example— where the phase 203 value is represented in eighths of a UI, the constant ONE has the binary value 01000—representing 8/8.

Figure 2F:
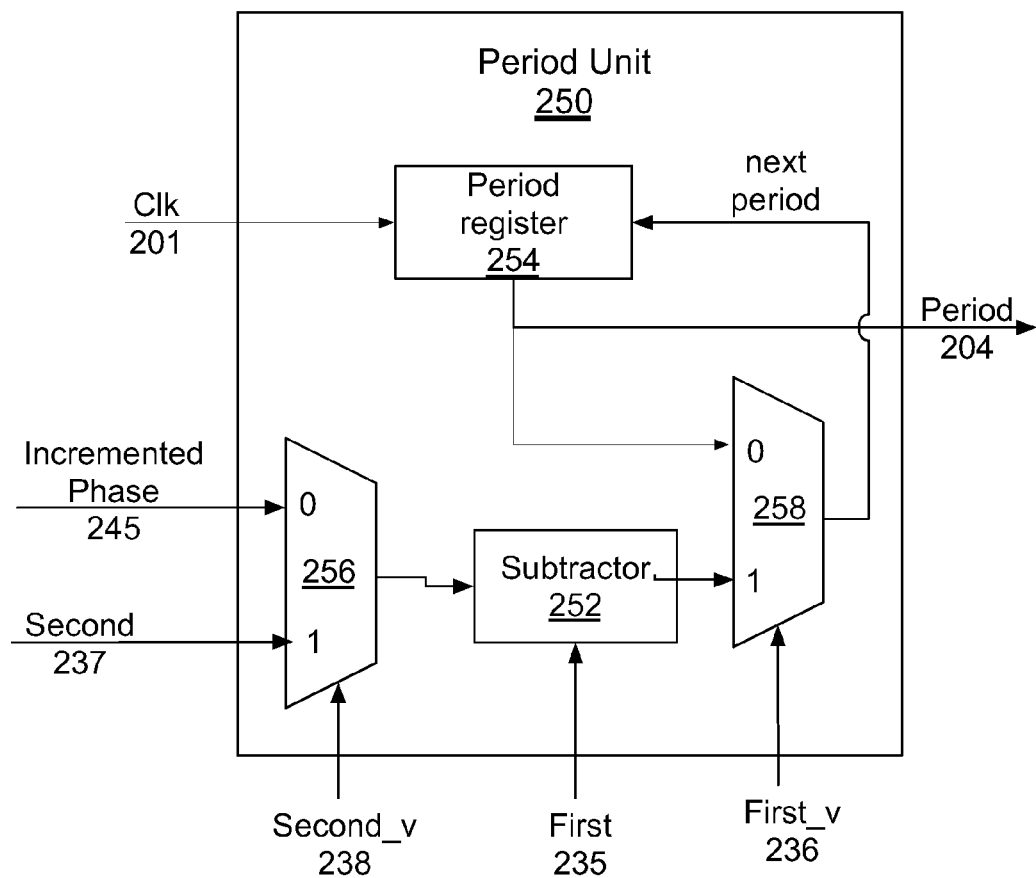
FIG. 2F illustrates a period unit of FIG. 2A, in accordance with one embodiment.

The next_phase value is input to the phase register 244 that outputs the phase 203 signal. The following Verilog may be translated to generate at a least a portion of the logic shown in the phase unit 240, in particular to provide an input (next_phase) to the phase register 244:

assign next_phase=first_*v*?first:phase+'ONE;

FIG. 2F illustrates the period unit 250 of FIG. 2A, in accordance with one embodiment. The period unit 250 includes a period register 254, a subtractor 252, and two multiplexors 256 and 258. The period unit 250 receives first 235, first_v 236, second 237, and second_v 238 from the edge detection unit 230 and incremented phase 245 from the phase unit 240 and generates the period 204 output signal. If no transition is detected, e.g., neither first_v 236 nor second_v 238 is asserted, the next_period (and period 204) is unchanged. Otherwise, if two transitions are detected, e.g., first_v 236 and second_v 238 are both asserted, the next_period is computed by subtracting first 235 from the phase of the previous transition, second 237. If only one transition is detected, e.g., first_v 236 is asserted, the next_period is computed by subtracting first 235 from the phase of the previous transition, incremented phase 245. In other words, the current phase, first 235 is subtracted from the phase of the last transition—either second 237, if a second transition is detected in the same period of the Clk 201, or incremented phase 245, otherwise.

When a second transition is detected, a first transition is also detected. When second_v 238 is asserted, the multiplexor 256 selects the second 237 value as the input to the subtractor 252. When a second transition is not detected, the multiplexor 256 selects the incremented phase 245 as the input to the subtractor 252. The subtractor subtracts the first 235 value from the input to generate an output. When a first transition is detected, the multiplextor 258 selects the output of the subtractor 252 as the next period. Otherwise, the multiplextor 258 selects the output of the period register 254 as the next period and the period 204 value is unchanged.

The following Verilog may be translated to generate at a least a portion of the logic shown in the period unit 250, in particular to provide an input (next_period) to the period register 254:

```
assign next_period = first_v ?
    (second_v ? second : (phase+ ONE))– first) : period ;
```

The next_period value is input to the period register 254 that outputs the period 204 signal.

In one embodiment, when Clk 201 is 1 GHz and delay elements 211 can be trimmed across process-voltage-temperature variations (PVT) to 62.5 ns, N=16 and m=4, and the constant ONE is 010000. When the value of N is a power of 2 the calculations performed by the edge detection unit 230 are simplified. The phase 203 and period 204 are represented in a fixed-point notation with m bits to the right of the binary point. The phase register 244 and period register 254 need to include sufficient bits to encode the largest possible period of Clk 202. For example, if the slowest possible Clk 202 has a period that is 5 times longer than the period of Clk 201, then three bits to the left of the binary point are required.

Because of the delay required for retiming and synchronization the values of phase 203 and period 204 reflect the phase and period of Clk 201 a fixed number of Clk 201 cycles in the past. For example when the synchronizers 224 have a delay of four cycles and a retiming delay of one cycle is introduced by the flip-flops 222, the phase 203 and period 204 values represent the state of Clk 202 five Clk 201 cycles in the past. A fast synchronizer design that uses period 204 (and possibly derivatives of period 204) to predict the phase of Clk 202 on the next cycle of Clk 201—predicts forward six cycles of Clk 201.

Figure 2G:
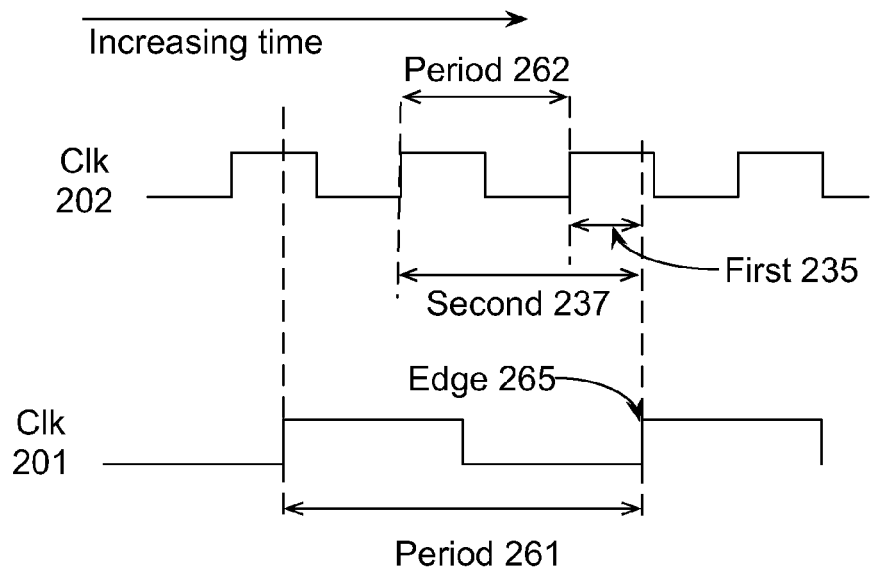
FIG. 2G illustrates waveforms of two clock signals, in accordance with one embodiment.

FIG. 2G illustrates waveforms of two clock signals, Clk 201 and Clk 202, in accordance with one embodiment. The frequency of the second clock, Clk 202 is faster than the frequency of the first clock, Clk 201. Signals are transmitted from a second clock domain corresponding to the Clk 202 to a first clock domain corresponding to the Clk 201. As shown, the period 262 of the Clk 202 is shorter than the period 261 of the Clk 201. Therefore, at least one edge indication for the Clk 202 should be detected within each clock period 261 by the edge detection unit 230. As shown, two edges of the Clk 202 occur within the period 261. At the most recent edge 265 of clock 201, the first 235 value corresponding to a first edge indication within the period 261 is computed by the edge detection unit 230. At the most recent edge 265 of the clock 201, the second 237 value corresponding to a second edge indication within the period 261 is also computed by the edge detection unit 230.

In one embodiment, the edge detection unit 230 is configured to compute a third value corresponding to a third edge indication. The third value may be used to compute a slope of the relative period when at least one of the Clk 201 and the Clk 202 is changing smoothly. The slope may be used by a synchronization unit to predict a more accurate value of the future phase and future period. Predicting the values of the phase 203 and period 204 one or more clocks ahead is useful because the current phase 203 and period 204 are valid for several clock cycles of the Clk 201 in the past due to the latency of the high-frequency phase detector 200.

Figure 2H:
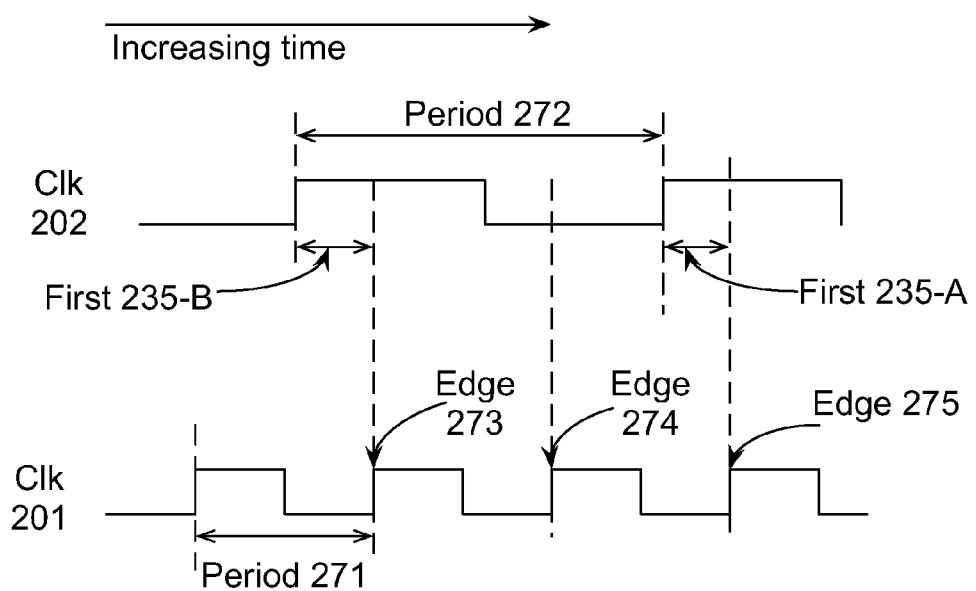
FIG. 2H illustrates other waveforms of two clock signals, in accordance with one embodiment.

FIG. 2H illustrates another example of waveforms of the two clock signals, Clk 201 and Clk 202, in accordance with one embodiment. The frequency of the transmitting clock, Clk 202 is slower than the frequency of the receiving clock, Clk 201. As shown, the period 272 of the Clk 202 is longer than the period 271 of the Clk 201. Therefore, during some periods of the Clk 201 an edge indication for the Clk 202 may not be detected by the edge detection unit 230.

At an oldest edge 273, the first 235 value corresponding to a first edge indication at the start of period 272 is located by the edge detection unit 230 and the first 235-B value is computed by the edge detection unit 230. In this example assume that the first 235-B value equals 7 units of the delay 211. Therefore, the next phase is set to 7 by the phase unit 240 and the next period is computed as the difference between phase 203 summed with N=16 and first 235. The phase 203 and period 204 are updated at the clock edge 274. At a next edge 274, no edge indication is located by the edge detection unit 230 and, the next phase is updated by the phase unit 240 as the phase 203 increased by N=16 so that the phase 203 is updated to 7+16=23. The period 204 is unchanged.

At a most recent edge 275, the first 235-A value corresponding to another first edge indication at the end of the period 272 is located by the edge detection unit 230 and the first 235-A value is computed by the edge detection unit 230. In this example assume that this additional first 235-A value equals 6 units of the delay 211. Therefore, the next phase is set to 6 by the phase unit 240 and the next period is computed as the difference between phase 203 summed with N=16 and first 235-A, i.e., 23+16–6=33. The phase 203 and period 204 are updated at the clock edge 275.

Figure 2I:
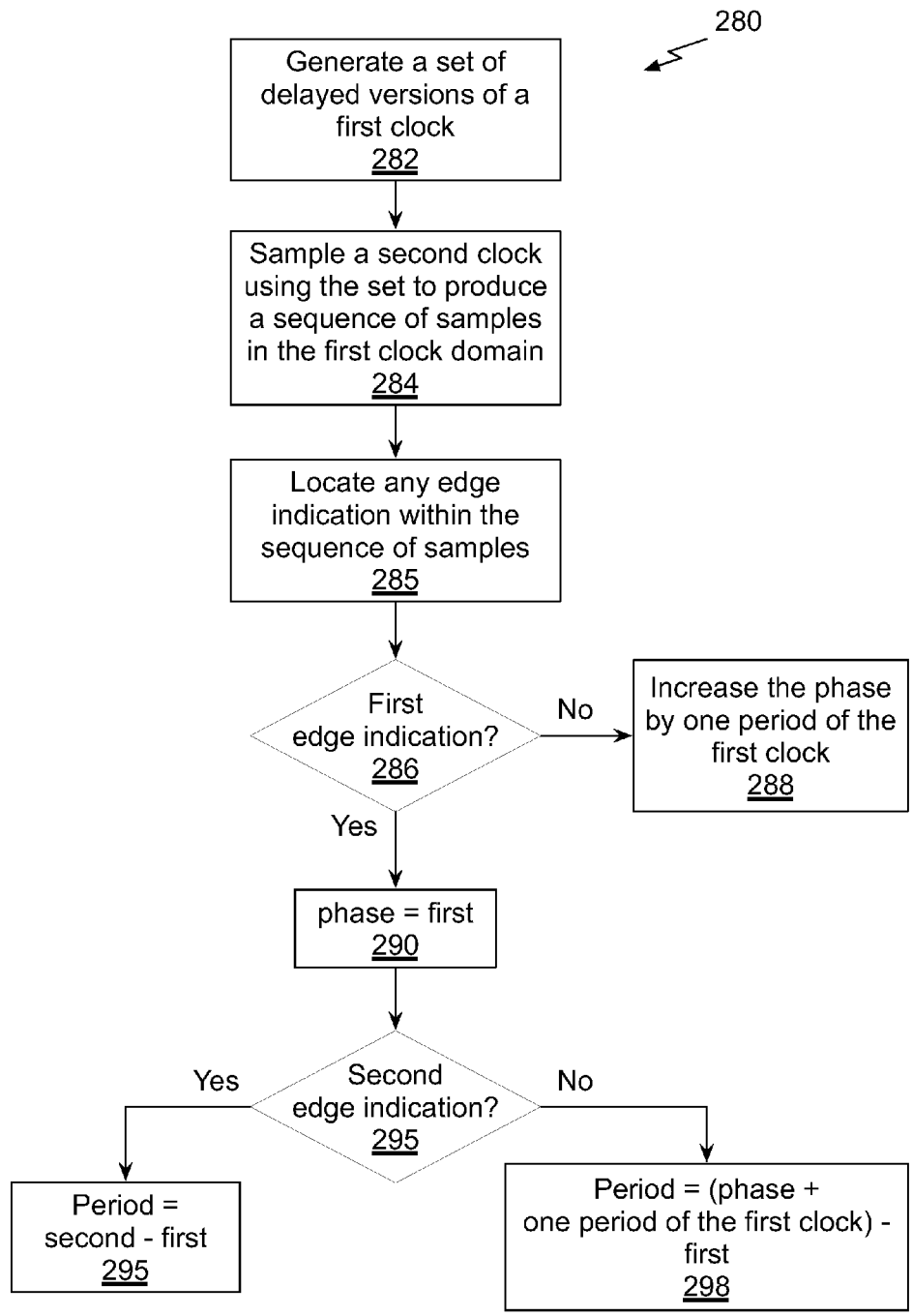
FIG. 2I illustrates a flowchart of a method for determining a phase and a period, in accordance with one embodiment.

FIG. 2I illustrates a flowchart of a method 280 for determining the phase 203 and period 204, in accordance with one embodiment. At step 282, a set of delayed versions of the Clk 201 is generated by the clock delay unit 210. At step 284, the Clk 202 is sampled by the clock sample unit 220 using the set of delayed versions of the Clk 201 to produce the sequence of samples 225 in the domain of the Clk 201. Then, at step 285, the edge detection unit 230 locates any edges, e.g., rising, falling, or rising and falling, within the sequence of samples 225.

At step 286, the phase unit 240 determines if a first edge indication was detected by the edge detection unit 230, and, if not, at step 288 the phase 203 is updated to the phase 203 increased by one period of Clk 201, e.g., phase+ONE. When first edge indication is not detected by the edge detection unit 230, the period 204 is not changed. Otherwise, when a first edge indication is detected, at step 290 the phase unit 240 sets the phase 203 equal to the first 235 signal generated by the edge detection unit 230. At step 295, the period unit 250 determines if a second edge indication is detected by the edge detection unit 230, and, if so, then at step 295 the period unit 250 sets the period 204 equal to the difference between the second 237 signal and the first signal 235. Otherwise, at step 298, the period unit 250 updates the period 204 to the difference between the sum of the phase 203 and one period of the Clk 201 and the first 235 signal.

Figure 3A:
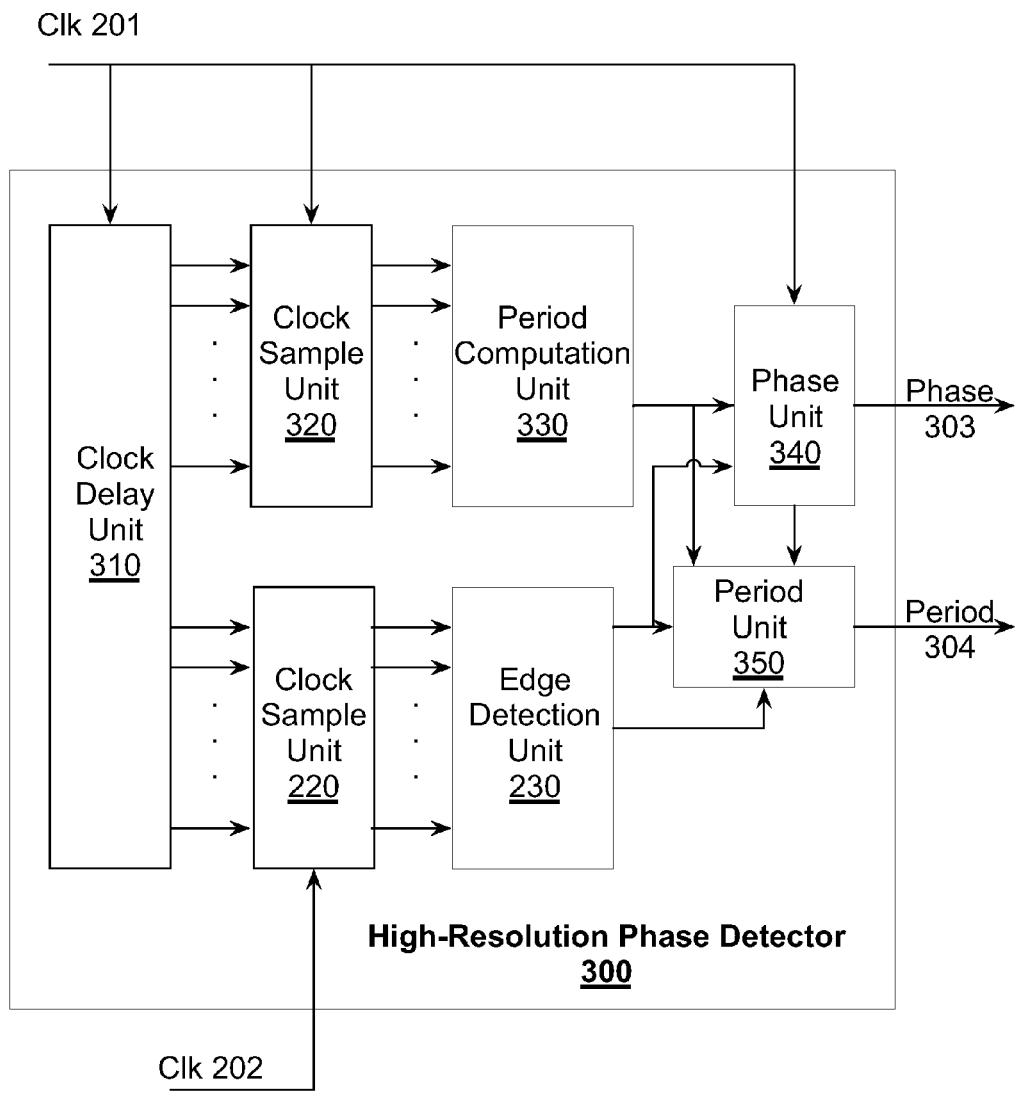
FIG. 3A illustrates another high-resolution phase detector, in accordance with one embodiment.

FIG. 3A illustrates a high-resolution phase detector 300, in accordance with one embodiment. The high-resolution phase detector 300 includes an open-loop clock delay unit 310, the clock sample unit 220, a clock sample unit 320, the edge detection unit 230, a period computation unit 330, a phase unit 340, and a period unit 350. The high-resolution phase detector 300 receives a first clock, Clk 201, and a second clock, Clk 202, and generates two values, a phase 303 and a period 304.

Figure 3B:
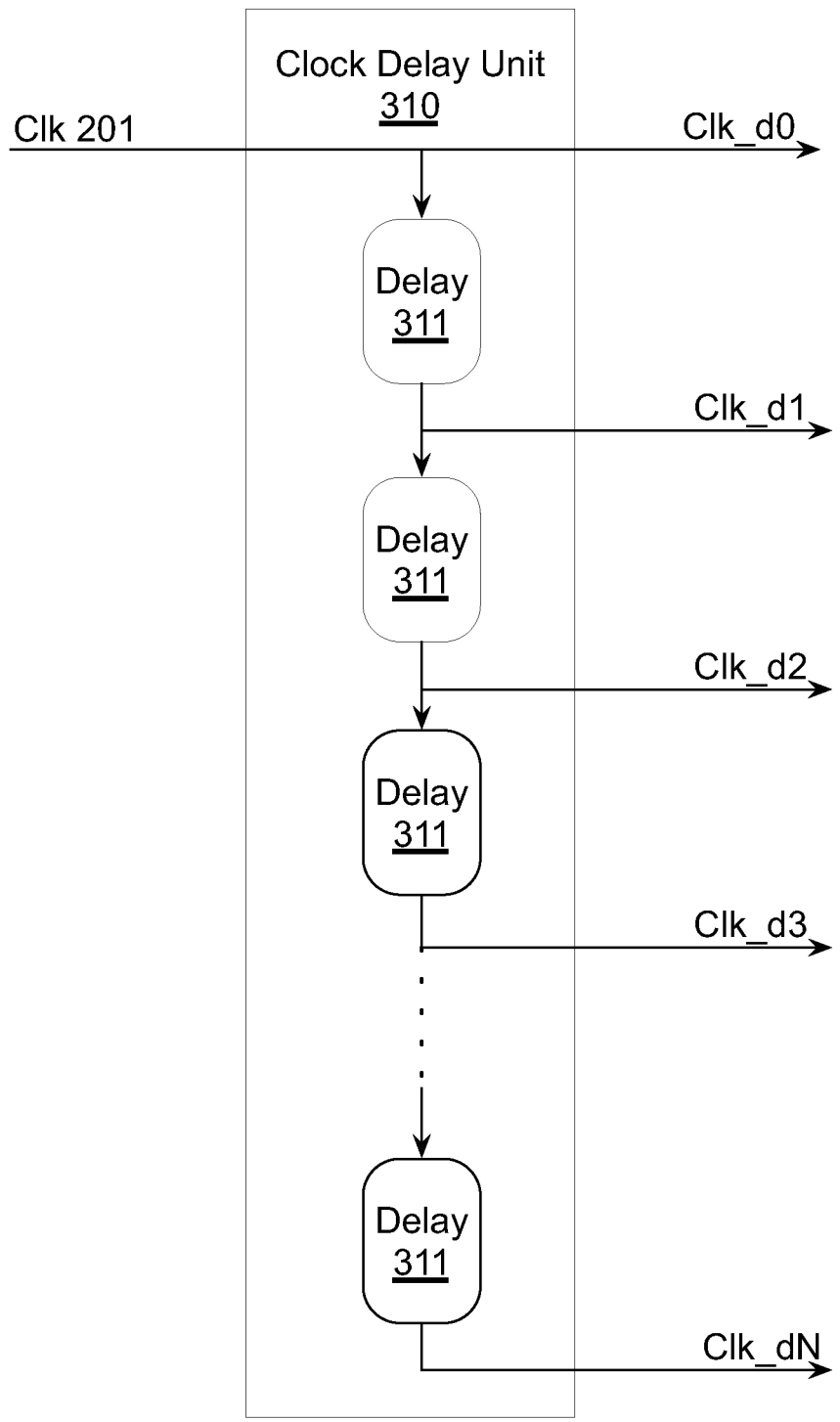
FIG. 3B illustrates an open-loop clock delay unit of FIG. 3A, in accordance with one embodiment.

FIG. 3B illustrates the open-loop clock delay unit 310 of FIG. 3A, in accordance with one embodiment. The open-loop clock delay unit 310 replaces the clock delay unit 210 in the high-resolution phase detector 300 compared with the high-resolution phase detector 200. A series of N delay elements 311 produces N clock phases, e.g., delayed versions of Clk 201, specifically Clk_d0, Clk_d1, Clk_d2, Clk_d3, . . . Clk_dN. Unlike the clock delay unit 210, the N clock phases do not necessarily span exactly one clock cycle because the open-loop clock delay unit 320 does not include a phase comparator 215 to control the amount by which each of the delay elements 311 delays the Clk 201 to generate the delayed versions of the Clk 201. The number of delay elements 311 should be high enough so that at least one period of the Clk 201 is sampled.

Figure 3C:
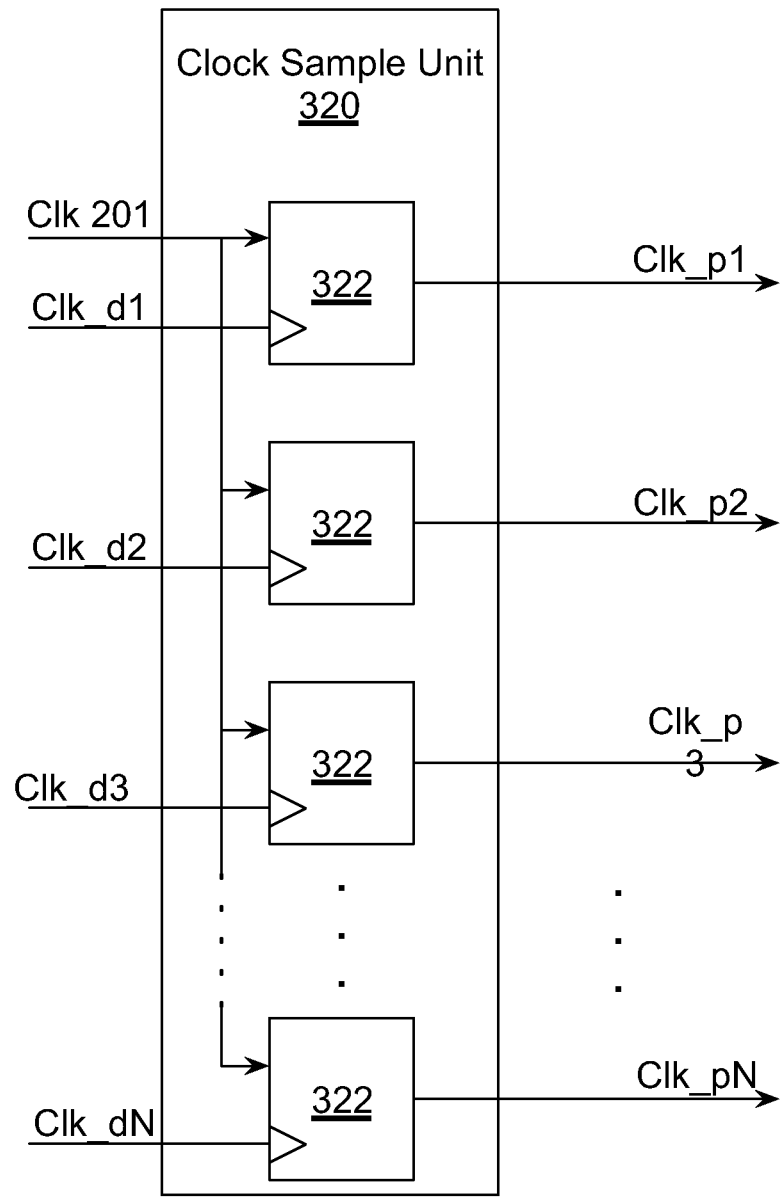
FIG. 3C illustrates a clock sample unit of FIG. 3A, in accordance with one embodiment.

FIG. 3C illustrates the clock sample unit 320 of FIG. 3A, in accordance with one embodiment. The clock sample unit 320 includes a plurality of flip-flops 322. The clock sample unit 320 receives the delayed versions of Clk 201 generated by the clock delay unit 210 and produces a sequence of samples of the first clock signal, Clk 201. Sampling the first clock signal is performed to compute the period of the Clk 201 in units of the delay introduced by one delay element 311. Each clock phase, Clk_d0, Clk_d1, . . . Clk_dN is used to sample Clk 201, producing the sequence of first clock samples at the outputs of the flip-flops 322, e.g., Clk_p1, Clk_p2, Clk_p3, . . . Clk_pN.

Figure 3D:
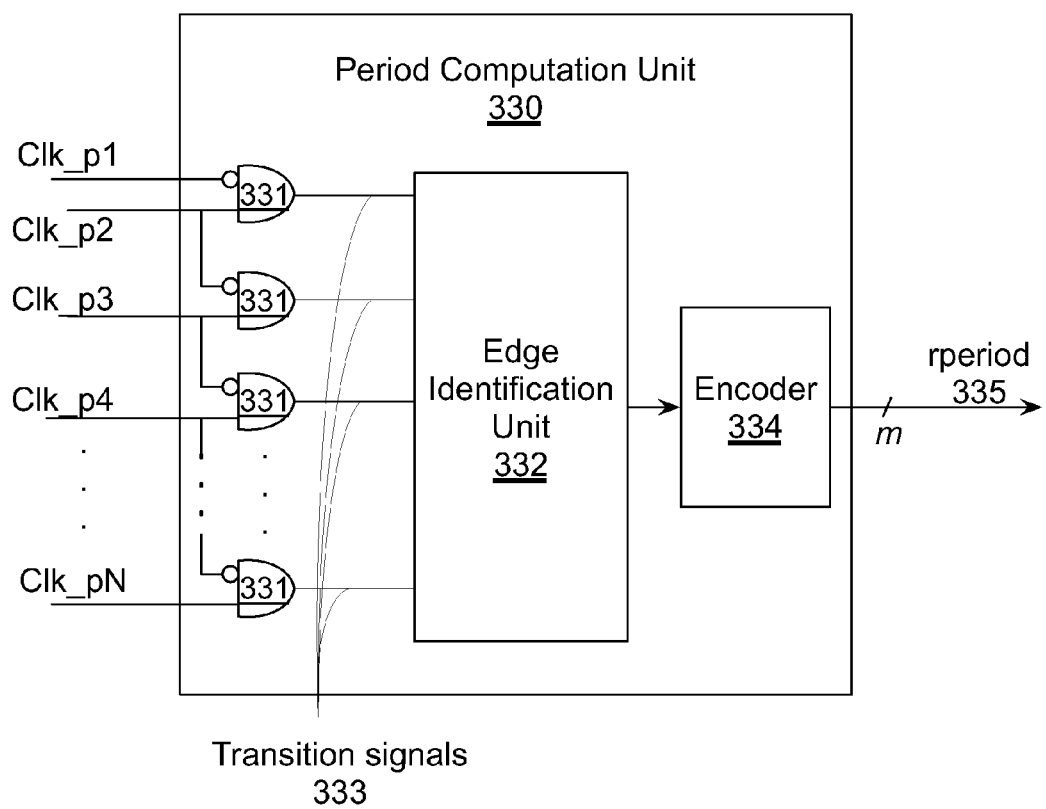
FIG. 3D illustrates a period computation unit of FIG. 3A, in accordance with one embodiment.

FIG. 3D illustrates the period computation unit 330 of FIG. 3A, in accordance with one embodiment. The period computation unit 330 includes an array of AND gates 331, an edge identification unit 332, and an encoder 334. The period computation unit 330 receives the sequence of first clock samples Clk_p1, Clk_p2, . . . Clk_pN produced by the clock sample unit 320. The sequence of first clock samples Clk_p1, Clk_p2, . . . Clk_pN are input to the array of AND gates 331 to locate rising transitions, e.g., edges, within the sequence of first clock samples. In other words, the AND gates 331 detect rising edges of the first clock signal 201 sampled by delayed versions of the first clock signal 201. The AND gates 331 generate transition signals 333 that may be used to compute the period of the Clk 201. The AND gates 331 receiving at least one of Clk_p1 and Clk_p2 may be ignored by the edge identification unit 332 to ensure that metastable signals are not sampled. In one embodiment, the period computation unit 330 may be configured to locate falling transitions or both falling and rising transitions.

One or more bits of the transition signals 333, $t_i$= Clk_$p_i$ & ~Clk_$p_{i-1}$ are true if a rising edge of the Clk 201 occurred between delayed versions of the Clk 201, Clk_$d_{i-1}$ and Clk_$d_i$, where i ranges from 0 to N. The transition signals 333, $t_i$, are input to the edge identification unit 332 that finds the first one (where one is a bit that is true) in the sequence of transition signals 333. The binary encoding of the position at which the first edge is detected is rperiod 335—the period of Clk 301 in units of the delay of one delay 311.

Figure 3E:
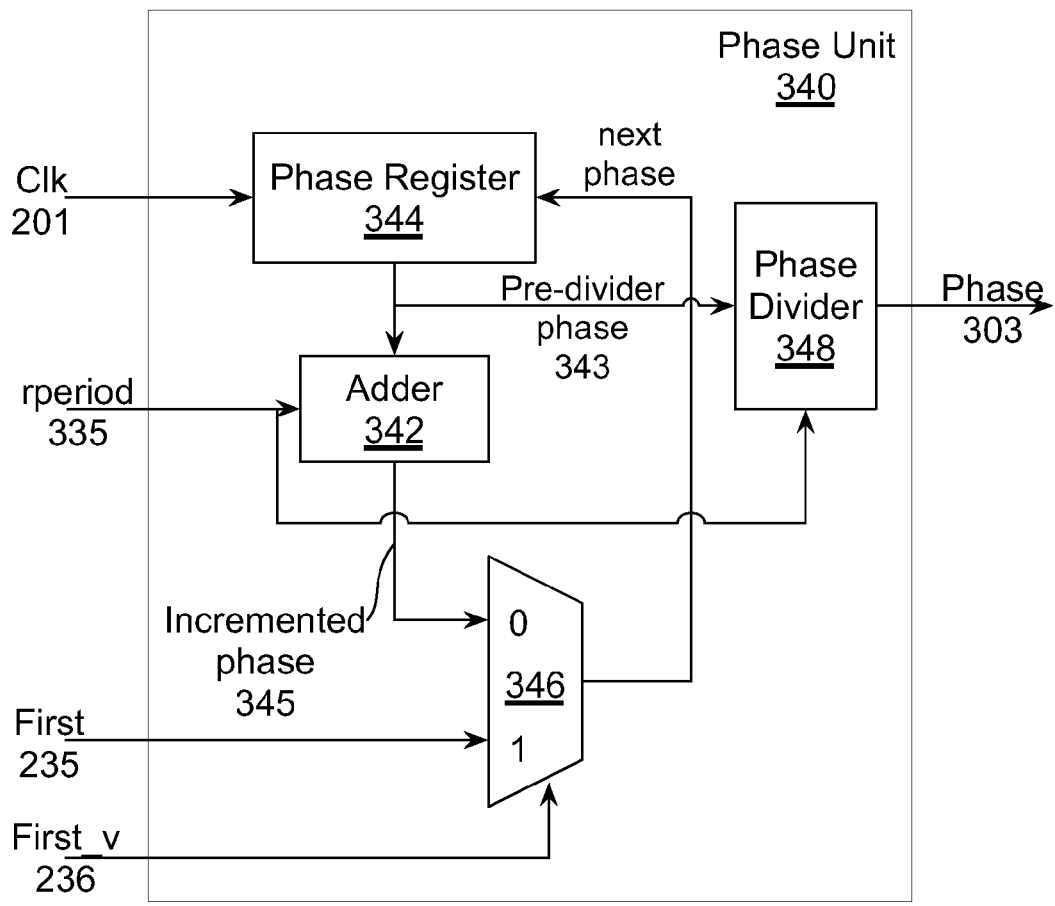
FIG. 3E illustrates a phase unit of FIG. 3A, in accordance with one embodiment.

FIG. 3E illustrates the phase unit 340 of FIG. 3A, in accordance with one embodiment. The phase unit 340 includes a phase register 344, an adder 342, a multiplexor 346, and a phase divider 348. The phase unit 340 receives first 235 and first_v 236 from the edge detection unit 230 and rperiod 335 from the period computation unit 330 and generates the phase 303 output signal. The value rperiod 335 is used in the phase unit 340 in place of the constant ONE in the phase unit 240. Also, the value of phase produced by the phase unit 340 is divided by rperiod 335 for use by a fast periodic synchronizer.

First 235 is a measure (in units of time) from the rising edge of Clk 201 to the most recent transition of the Clk 202. If a transition is detected, e.g., first_v 236 is asserted, first 235 gives the phase value. When first_v 236 is asserted, the multiplexor 346 selects the first 235 value as the output, next phase. When a transition is not detected, e.g., first_v 236 is not asserted, the multiplexor 346 selects incremented phase 345 as the next phase. The incremented phase 345 value is computed by the adder 342 as the pre-divider phase 343 incremented by rperiod 335.

The next_phase value is input to the phase register 344 that outputs the pre-divider phase 343 value. The following Verilog may be translated to generate at a least a portion of the logic shown in the phase unit 340, in particular to provide an input (next_phase) to the phase register 344:

assign next_phase=first_v?first:predivider_phase+
        rperiod;

The output of the phase register 344, e.g., pre-divider phase 343, is divided by rperiod 335 within the phase divider 348 to produce the phase 303 value.

Figure 3F:
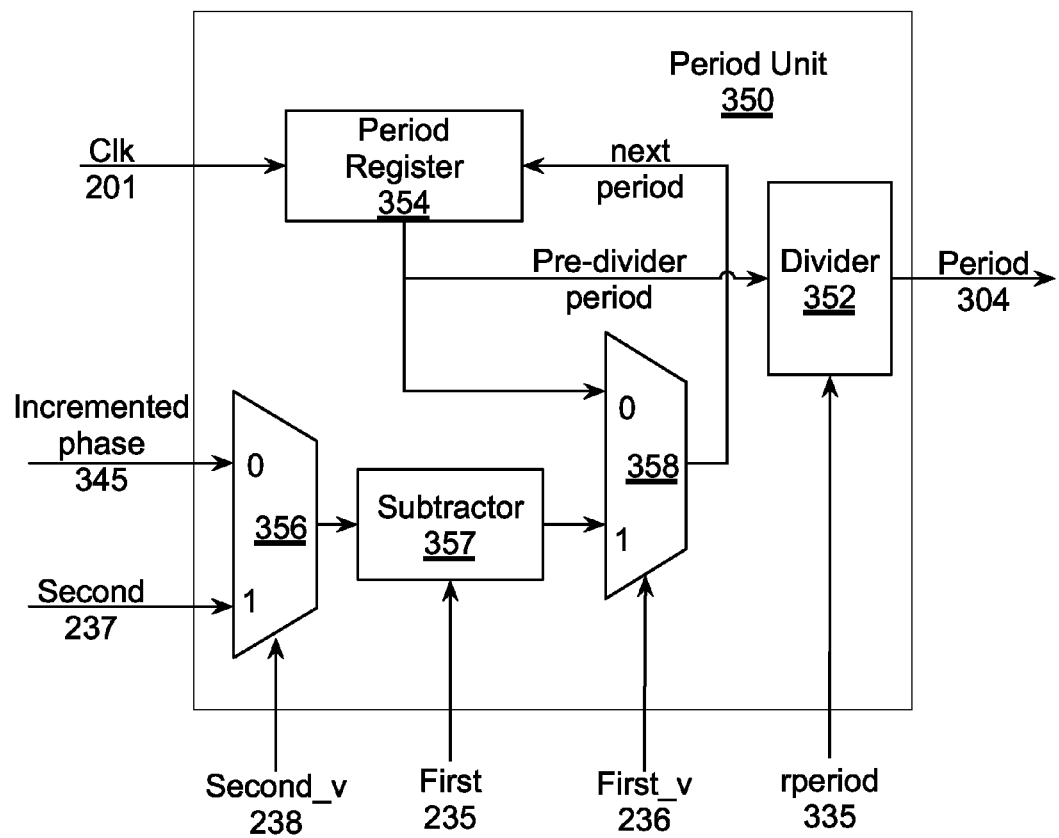
FIG. 3F illustrates a period unit of FIG. 3A, in accordance with one embodiment.

FIG. 3F illustrates the period unit 350 of FIG. 3A, in accordance with one embodiment. The period unit 350 includes a period register 354, a subtractor 357, multiplexor 356, multiplexor 358, and a divider 358. The period unit 350 receives first 235, first_v 236, second 237, and second_v 238 from the edge detection unit 230, rperiod 335 from the period computation unit 330, and incremented phase 345 from the phase unit 340 and generates the period 304 output signal.

If no transition is detected, e.g., neither first_v 236 nor second_v 238 is asserted, the next_period (and period 304) is unchanged. Otherwise, if two transitions are detected, e.g., first_v 236 and second_v 238 are both asserted, the next_period is computed by subtracting first 235 from the phase of the previous transition, second 237. If only one transition is detected, e.g., first_v 236 is asserted, the next_period is computed by subtracting first 235 from the phase of the previous transition, incremented phase 545. In other words, the current phase, first 235 is subtracted from the phase of the last transition—either second 237 if a second transition is detected in the same period of the Clk 201 or incremented phase 345 otherwise. The number of bits for dividers 348 and 352 is determined by the number of bits in rperiod 335, e.g., 4 bits if N=16. Note that N may be any integer value and N need not be a power of two.

When a second transition is detected, a first transition is also detected. When second_v 238 is asserted, the multiplexor 356 selects the second 237 value as the input to the subtractor 357. When a second transition is not detected, the multiplexor 356 selects the incremented phase 245 as the input to the subtractor 357. The subtractor subtracts the first 235 value from the input to generate an output. When a first transition is detected, the multiplexor 358 selects the output of the subtractor 252 as the next period. Otherwise, the multiplexor 358 selects the output of the period register 354 as the next period and the period 204 value is unchanged.

The following Verilog may be translated to generate at a least a portion of the logic shown in the period unit 350, in particular to provide an input (next_period) to the period register 354:

assign next_period = first_v ?
        ((second_v ? second : (pre-divider phase+rperiod))− first) : period ;

The next_period value is input to the period register 354. The output of the period register 354, e.g., pre-divider period, is divided by rperiod 335 within the period divider 352 to produce the period 304 value.

Figure 3G:
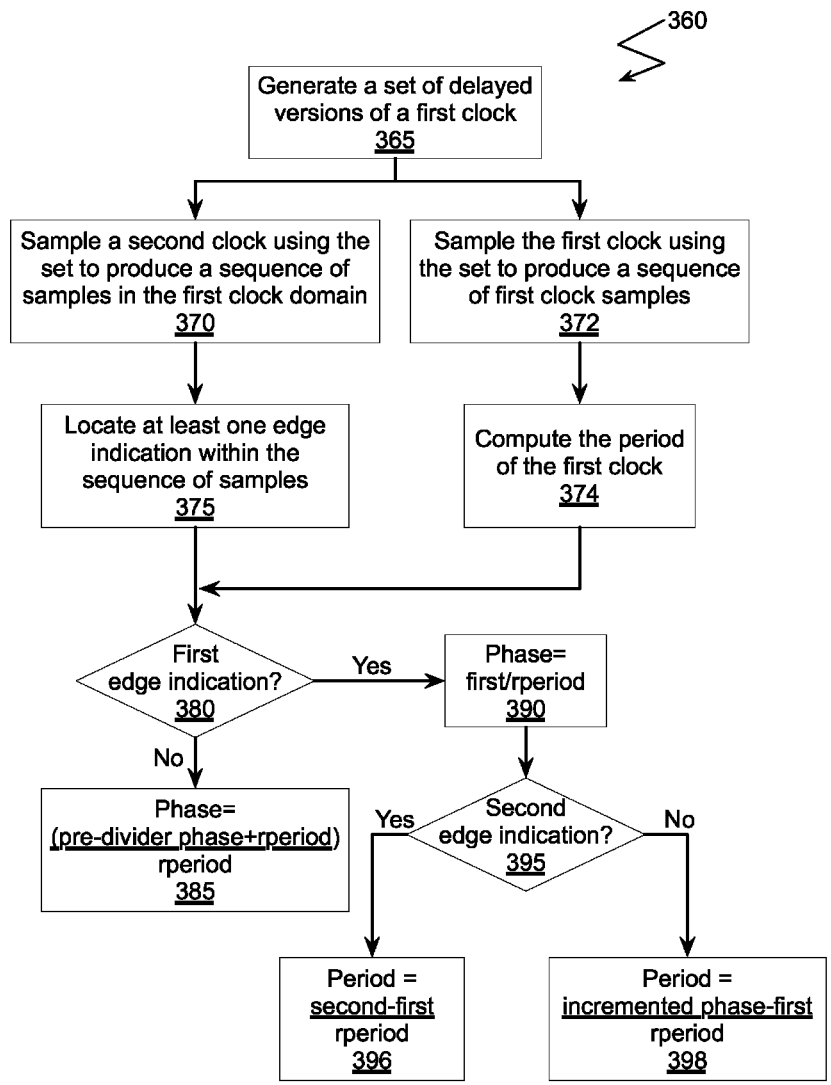
FIG. 3G illustrates another flowchart of a method for determining a phase and a period, in accordance with one embodiment.

FIG. 3G illustrates another flowchart of a method 360 for determining the phase 503 and period 504 using the open-loop high-resolution phase detector 300, in accordance with one embodiment. At step 365, a set of delayed versions of the Clk 201 is generated by the open-loop clock delay unit 510.

At step 370, the Clk 202 is sampled by the clock sample unit 220 using the set delayed versions of the Clk 201 to produce the sequence of samples 225 in the domain of the Clk 201. Then, at step 375, the edge detection unit 230 locates any edges, e.g., rising, falling, or rising and falling, within the sequence of samples 225.

At step 372, the Clk 201 is sampled by the clock sample unit 320 using the set delayed versions of the Clk 201 to produce the sequence of first clock samples 325 in the domain of the Clk 201. Then, at step 374, the period computation unit 330 locates an edge, e.g., rising, falling, or rising and falling, within the sequence of first clock samples 325 and determines the rperiod 335, e.g., the period of the Clk 201. One or more of steps 372 and 374 may be performed in parallel with one or more of steps 370 and 375.

At step 380, the phase unit 340 determines if a first edge indication was detected by the edge detection unit 230, and, if not, at step 385 the next phase is computed as the sum of the pre-divider phase 343 increased by one period of the Clk 201 (rperiod 335). The next phase is then divided by one period of the Clk 201 to generate the phase 303 value, e.g., (pre-divider_phase+rperiod)/rperiod. When first edge indication is not detected by the edge detection unit 230, the period 304 is not changed. Otherwise, when a first edge indication is detected, at step 390, the phase unit 340 the next phase is set equal to the first 235 signal generated by the edge detection unit 230. The next phase is then divided by rperiod 335 to generate the phase 303 value. At step 395, the period unit 350 determines if a second edge indication is detected by the edge detection unit 230, and, if so, then at step 398 the period unit 350 sets the period 304 equal to the difference of the second 237 value and the first 235 value divided by the rperiod 335. Otherwise, at step 398, the period unit 550 updates the period 304 to the difference between the sum of the pre-divider phase 303 and one period of the Clk 201 (incremented phase 342) and the first 235 signal divided by one period of the Clk 201 (i.e., rperiod 335).

A Matrix Phase Detector

The high-resolution phase detectors 200 and 300 use sub-phases (i.e., delayed versions) of the Clk 201 to capture the relative phase of the Clk 202 on each transition of the Clk 202. While the tracking ability of a periodic synchronizer may be designed using the high-resolution phase detector 200 or 300, when the Clk 202 is a low-frequency clock, updates to the period 204 and phase 203 are delayed and the tracking performance is reduced. A matrix phase detector measures evenly-distributed sub-phases of the Clk 202 to improve the tracking performance when the frequency of the Clk 202 is low. A matrix of flip-flops is used to measure the phase of the Clk 202 relative to the Clk 201. To generate each row of an array of samples by a row of flip-flops in the matrix, a sequence of delayed versions of the Clk 202 is input to the different rows of flip-flops and each row of flip-flops is clocked by a different sub-phase of the Clk 201. The outputs of the flip-flops are synchronized, retimed, and then used to compute the period and phase of the transmit clock relative to the receive clock.

Figure 4A:
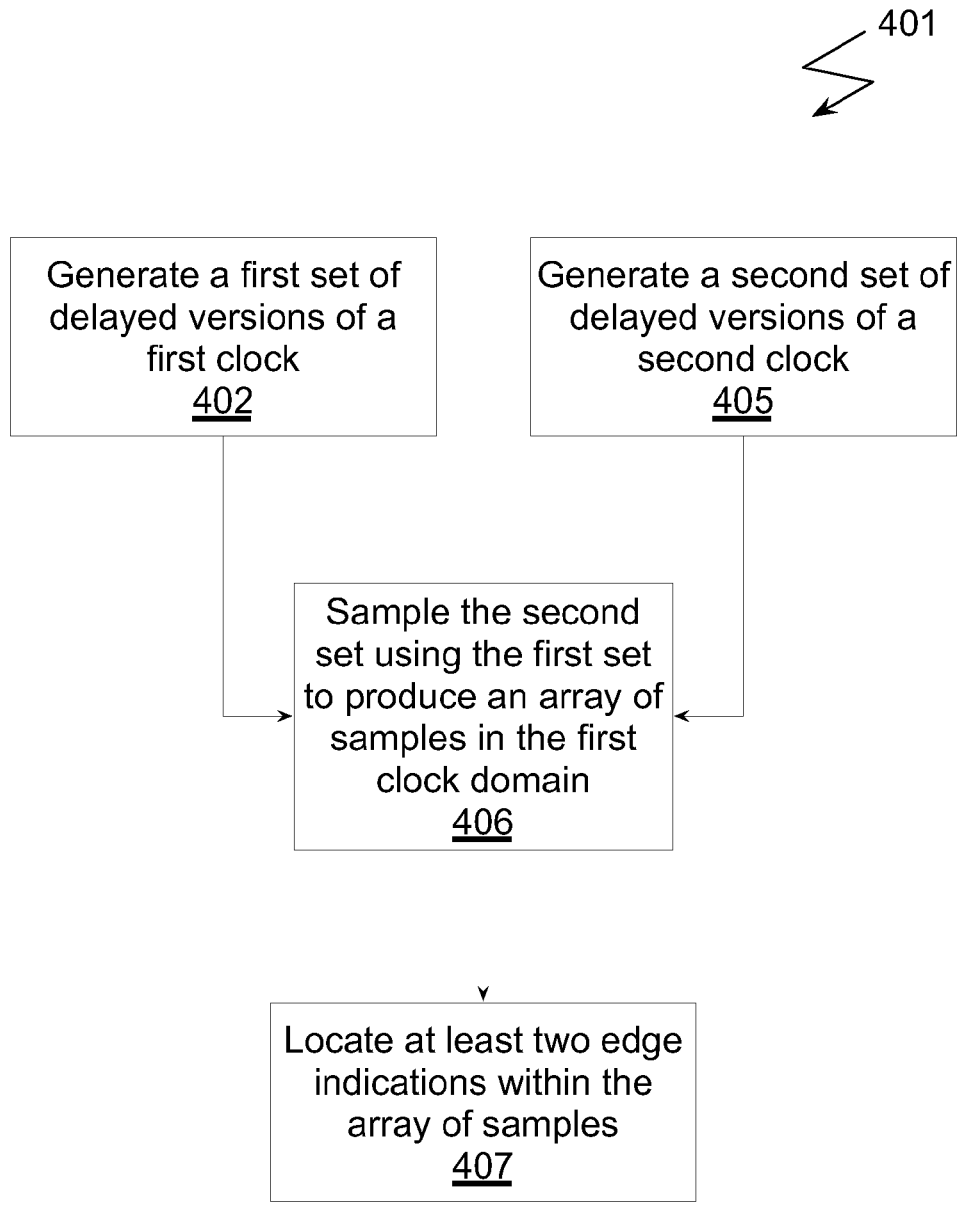
FIG. 4A illustrates a flowchart of another method for locating an edge indication within a sequence of clock signal samples, in accordance with one embodiment.

FIG. 4A illustrates a flowchart of a method 401 for locating at least two edge indications within an array of clock signal samples, in accordance with one embodiment. At step 402, a first set of delayed versions of the first clock signal is generated. Each delayed version of the first clock signal is a different phase of the first clock signal. At step 405, a second set of delayed versions of the second clock signal is generated. Each delayed version of the second clock signal is a different phase of the second clock signal. At step 406, the second set of delayed versions of the second clock signal is sampled using the first set of delayed versions of the first clock signal to produce an array of samples in the first clock domain. Then, at step 407, at least two edge indications are located within the array of samples. The at least two edge indications are each a rising or falling transition of a sample of the array of samples. The at least two edge indications may be used to compute the phase and period values.

Figure 4B:
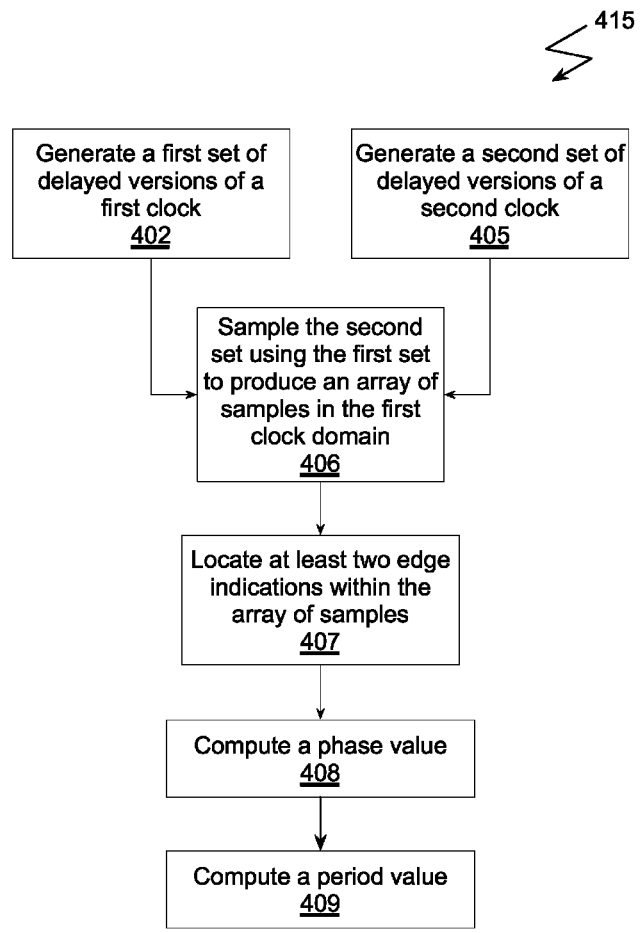
FIG. 4B illustrates a flowchart of a method for using the edge indication to detect a phase and a period, in accordance with one embodiment.

FIG. 4B illustrates a flowchart of a method 415 for using at least two edge indications to detect a phase and a period, in accordance with one embodiment. Steps 402, 405, 406, and 407 are completed to provide at least two edge indications. At step 408, the at least two edge indications are processed to compute a phase value representing a phase of the second clock signal relative to the first clock signal. At step 409, the at least two edge indications are processed to compute a period value representing a relative period between the second clock signal and the first clock signal.

Figure 4C:
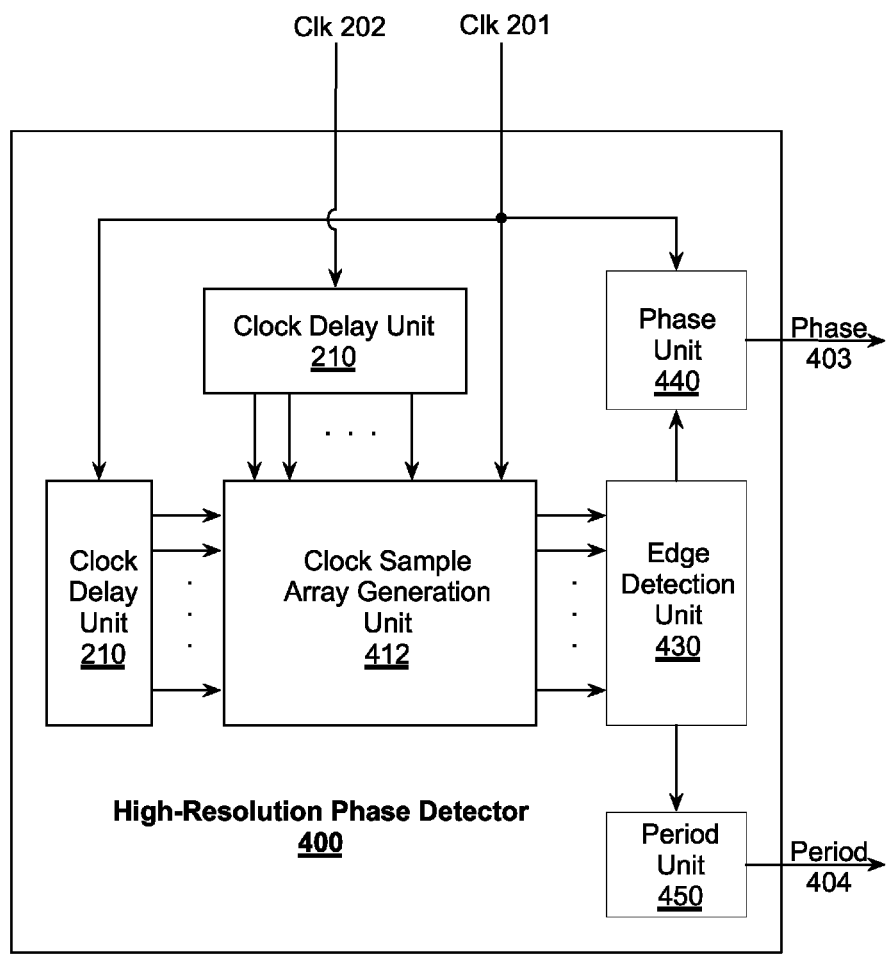
FIG. 4C illustrates a matrix high-resolution phase detector, in accordance with one embodiment.

FIG. 4C illustrates a matrix high-resolution phase detector 400, in accordance with one embodiment. The high-resolution phase detector 400 includes two clock delay units 210, a clock sample array generation unit 412, an edge detection unit 430, a phase unit 440, and a period unit 450. The high-resolution phase detector 400 receives a first clock signal, Clk 201, and a second clock signal, Clk 202, and generates two values, a phase 403 and a period 404. The phase 403 and period 404 values are each encoded by multi-bit signals. The value of phase 403 represents a phase of the second clock signal (Clk 202), relative to the first clock signal (Clk 201). The value of period 404 represents a relative period between the second clock signal 202 and the first clock signal (Clk 201). At least one of the first clock signal (Clk 201) and the second clock signal (Clk 202) may vary over time. The high-resolution phase detector 400 is designed to continuously measure the phase and period as the frequency of the first clock signal (Clk 201) and/or the second clock signal (Clk 202) varies.

A first clock delay unit 210 is a closed delay loop circuit that produces N evenly-spaced different clock phases of the first clock signal (Clk 201) (i.e., delayed versions of Clk 201) specifically Clk_rd0, Clk_rd1, Clk_rd2, Clk_rd3, . . . Clk_rdN that span one period of the Clk 201; i.e., so that Clk 201=Clk_rd0, which has the same phase as Clk_rdN. A second clock delay unit 210 produces N evenly-spaced different clock phases of the second clock signal (Clk 202) (i.e., delayed versions of Clk 202) specifically Clk_td0, Clk_td1, Clk_td2, Clk_td3 . . . Clk_tdN that span one period of the Clk 202; i.e., so that Clk 202=Clk_td0, which has the same phase as Clk_tdN. The delayed versions of the Clk 201 and the delayed versions of the Clk 202 are received by the clock sample array generation unit 412.

In one embodiment, the first clock delay unit 210 is designed to track variation in the period of the Clk 201 due to voltage, temperature, and other effects and the second clock delay unit 210 is designed to track variation in the period of the Clk 202 due to voltage, temperature, and other effects. With this approach the delayed versions of each clock are not simple extrapolations of the last clock edge, but rather signal variations in frequency and phase before the next edge of the clock is available. One approach is to generate the sub-phases of each clock from the oscillator that generates the clock itself.

Figure 4D:
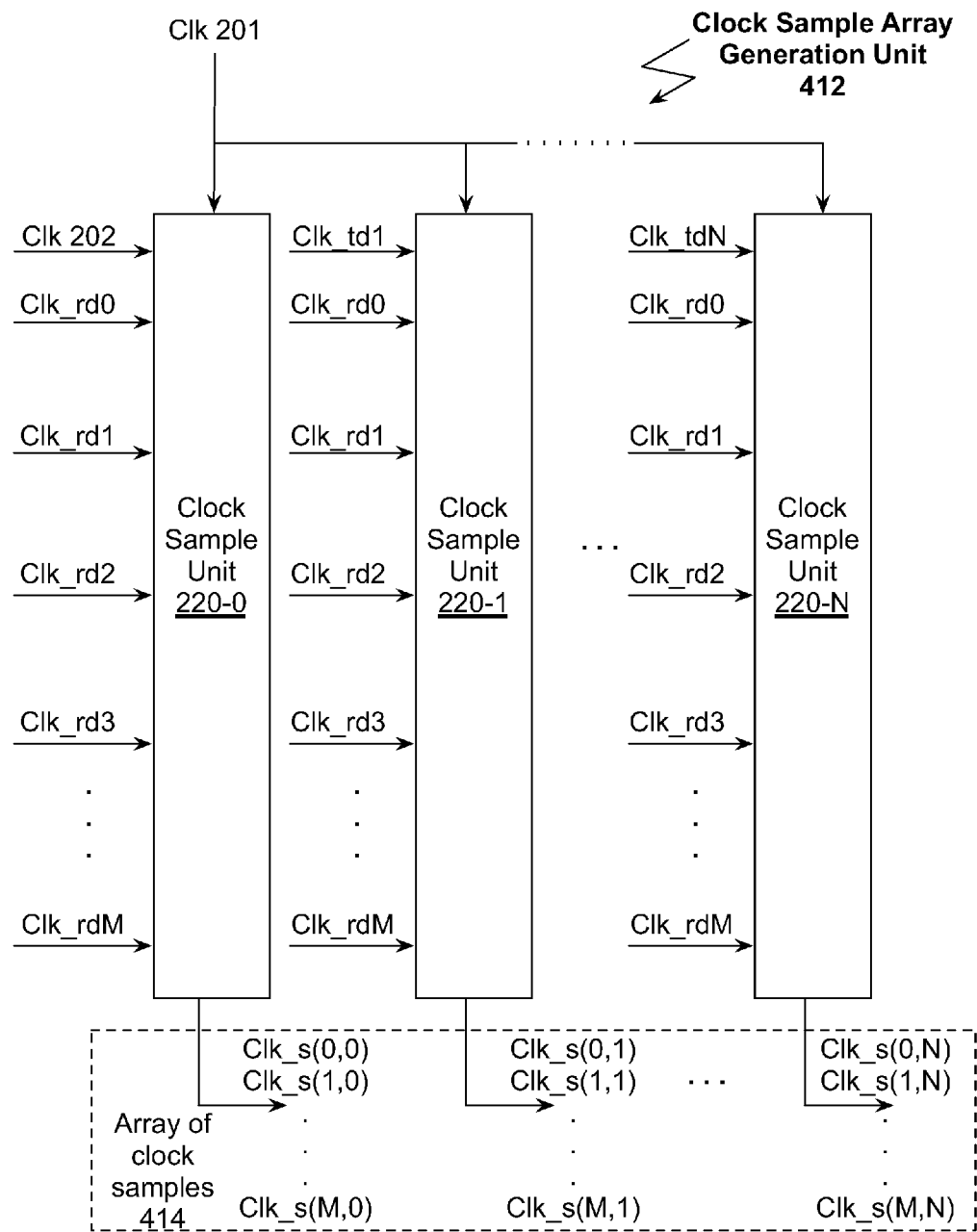
FIG. 4D illustrates a clock sample array generation unit of FIG. 4C, in accordance with one embodiment.

FIG. 4D illustrates a clock sample array generation unit 412 of FIG. 4C, in accordance with one embodiment. The clock sample array generation unit 412 includes a plurality of clock sample units 220 (e.g., clock sample units 220-0, 220-1, . . . 220-N). As previously described, each clock sample unit 220 includes flip-flops 222 and a corresponding plurality of synchronizers 224 and produces a sequence of samples of a different delayed version the second clock signal, Clk 202, in the domain of Clk 201. Each delayed version of the Clk 201, Clk_rd0, Clk_rd1, . . . Clk_rdM is input to a different clock sample unit 220 to generate the array of clock samples 414 Clk_s(i,j), where i ranges from 0 to M and j ranges from 0 to N.

Figure 4E:
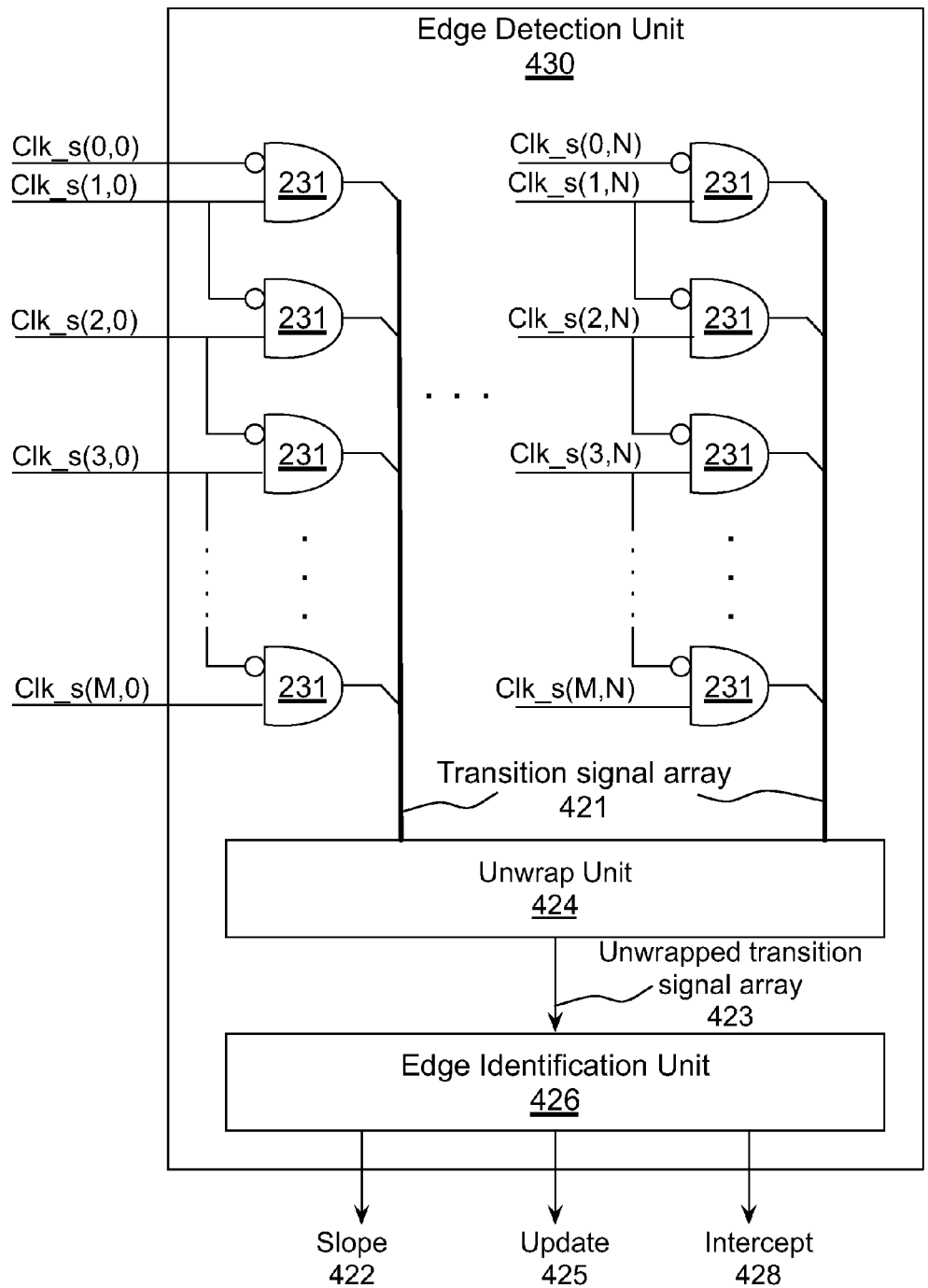
FIG. 4E illustrates an edge detection unit of FIG. 4C, in accordance with one embodiment.

FIG. 4E illustrates the edge detection unit 430 of FIG. 2A, in accordance with one embodiment. The edge detection unit 430 includes an array of AND gates 231, an unwrap unit 424, and an edge identification unit 426. The edge detection unit 430 receives the array of clock samples 414 produced by the clock sample array generation unit 412. The array of clock samples 414 is input to an array of AND gates 231 to locate edge indications, e.g., rising transitions within the array of clock samples. In other words, the array of AND gates 231 detects rising edges of each sub-phase of the clock signal, Clk 202 sampled by the sub-phases of the first clock signal, Clk 201. In one embodiment, the edge detection unit 230 may be configured to locate edge indications that are falling transitions or both falling and rising transitions. To detect rising edges, clock samples in a column of the array of clock samples 414, i.e., vertically adjacent clock samples, are compared to compute a transition signal array 421, m(i,j)=~Clk_s(i,j)&Clk_s(i+1,j).

The transition signal array 421 contains an edge indication (e.g., one or TRUE value) for each sub-phase of the Clk 202 that for which a rising edge was detected during a latest cycle of the Clk 201. An edge indication occurs in the column (j) corresponding to the sub-phase of the Clk 202 and in the row (i) corresponding to the sub-phase of the Clk 201 during which that sub-phase of the Clk 202 had a transition. The line formed by connecting at least two edge indications in the transition signal array 421 indicates both the relative period and phase of the Clk 202 and Clk 201 signals. The slope of the line indicates the relative period 404, and the intercept of the line with a vertical axis indicates the relative phase 403.

When the Clk 202 signal is slower than the Clk 201 signal, all of the sub-phases of the Clk 202 signal will not be detected for each cycle of the Clk 201 signal. Also, no transitions of sub-phases of the Clk 201 will be detected for some sub-phases of the Clk 201. Consequently, the slope of a line connecting two edge transitions may be greater than one. TABLE 1 below illustrates the transition signal array 421 for a condition where a period of the Clk 202 signal is 7/3 that of the period of a period of the Clk 201 signal, i.e., the period 404 is 7/3, and the phase 403 of the Clk 202 signal relative to the Clk 201 signal is −7/8 UI. Based on the period 404 and the phase 403, future transitions of the primary phase of the Clk 202 signal can be predicted to occur at (−7/8+7N/3) for integral N. Note that, as shown in TABLE 1, the vertical axis is inverted compared with a conventional Cartesian coordinate system, i.e., i increases in value moving downward along the vertical axis from i=0 to i=7 and j increases in value moving from left to right along the horizontal axis.

TABLE 1 phase = −7/8 UI and relative period = 7/3

| | | Clk 202 sub-phase (j) | | | | | | | |
|---|---|---|---|---|---|---|---|---|---|
| | | 0 | 1 | 2 | 3 | 4 | 5 | 6 | 7 |
| Clk 201 sub-phase (i) | 0 | | | | 1 | | | | |
| | 1 | | | | | | | | |
| | 2 | | | | | | 1 | | |
| | 3 | | | | | | | | |
| | 4 | | | | | | | | |
| | 5 | | | | | | | 1 | |
| | 6 | | | | | | | | |
| | 7 | | | | | | | | 1 |

As shown in TABLE 2, when the Clk 202 signal is faster than the Clk 201 signal, the slope of a line formed by at least two edge indications (ones) is less than 1. Consequently, several sub-phases of the Clk 202 signal may be detected by the same sub-phase of the Clk 201 signal. Also, some sub-phases of the Clk 202 signal may be detected by multiple sub-phases of the Clk 201 signal.

TABLE 2 illustrates the transition signal array 421 for a condition where the relative period, period 404 is 7/11 and the phase 403 is 1/4 and 7/8 UI (i.e., two different lines connecting edge indications have intercepts at 1/4 and at 7/8 of the Clk 202 signal sub-phases relative to the Clk 201 signal sub-phases). Based on the period 404 and the phase 403 shown in TABLE 2, future transitions of the primary phase of the Clk 202 signal can be predicted to occur at (7/8+7N/11) for integer values of N.

TABLE 2 phase = 1/4 and 7/8 UI and relative period = 7/11

| | | Clk 202 sub-phase (j) | | | | | | | |
|---|---|---|---|---|---|---|---|---|---|
| | | 0 | 1 | 2 | 3 | 4 | 5 | 6 | 7 |
| Clk 201 sub-phase (i) | 0 | | | | | | 1 | 1 | |
| | 1 | | | | | | | | 1 |
| | 2 | 1 | 1 | | | | | | |
| | 3 | | | | 1 | | | | |
| | 4 | | | | | 1 | 1 | | |
| | 5 | | | | | | | 1 | |
| | 6 | | | | | | | 1 | 1 |
| | 7 | 1 | 1 | | | | | | |

To compute the period 404 and phase 403 from the transition signal arrays 421 shown in TABLE 1 and TABLE 2, the transition signal array 421 is first unwrapped so that there is at most a single edge indication (one) per column and so that no edge indication has another edge indication one row above and one column to the right. Unwrapping can be accomplished by keeping a wrap count w(i) for the $i^{th}$ row, e.g., row r(i). The wrap count is the number of edge indications in column 7 on rows above row r(i). For example, for TABLE 2 the wrap counts w(i) for i=0 to 7 are 0, 0, 1, 1, 1, 1, 1, 2. After computing the wrap count, each row in the transition signal array 421 is displaced (N+1)w(i) columns to the right, e.g., rows 0 through 7 are displaced 0, 0, 8, 8, 8, 8, 8, 16 columns. Expressed differently, for the case where N=7, and for m(i,j) entries of the transition signal array 421, each entry of the unwrapped transition signal array 423, u(i,j) may be computed as:

$$u(i,j)=m(i,j(\text{mod } 8))\&(w(i)==(j>>3)).$$

In sum, the wrap count is used to demultiplex each row into a respective unwrapped position. Note that when none of the columns in the transition signal array 421 includes more than one edge indication, the transition signal array 421 equals the unwrapped transition signal array 423. The unwrapped version of TABLE 2 is shown in TABLE 3.

TABLE 3 phase = 1 7/8 UI and relative period = 7/11

| | | Clk 202 sub-phase (j) | | | | | | | | | | | | | | | | | |
|---|---|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 | 16 | 17 |
| Clk 201 sub-phase (i) | 0 | | | | | | 1 | 1 | | | | | | | | | | | |
| | 1 | | | | | | | | 1 | | | | | | | | | | |
| | 2 | | | | | | | | | 1 | 1 | | | | | | | | |
| | 3 | | | | | | | | | | | 1 | | | | | | | |
| | 4 | | | | | | | | | | | | 1 | 1 | | | | | |
| | 5 | | | | | | | | | | | | | | 1 | | | | |
| | 6 | | | | | | | | | | | | | | | 1 | 1 | | |
| | 7 | | | | | | | | | | | | | | | | | 1 | 1 |

The unwrap unit 424 is configured to generate the unwrapped transition signal array 423 from the transition signal array 421. Once the transition signal array 421 is unwrapped, the period 404 and phase 403 may be computed based on the slope 422, the intercept 428, and the update 425 signals output by the edge detection unit 430. The edge identification unit 426 may compute the slope 422 and vertical intercept 428 (intercept of the i axis) of a line specified by at least two edge indications in the unwrapped transition signal array 423. The edge identification unit 426 is configured to compute the slope 422 and the intercept 428 based on the unwrapped transition signal array 423. When less than two edge indications are present in the transition signal array 421, the edge identification unit 426 negates an update 425 signal. When the update 425 signal is asserted, the slope 422 and intercept 428 values are used to update the phase 403 and period 404 values.

Several techniques can be used to determine a line equation, thereby computing the slope 422 and vertical intercept 428. In one embodiment, the position of each edge indication in the unwrapped transition signal array 423 is input into a linear regression. In another embodiment, two edge indications, e.g., any combination of an uppermost edge indication and a lowermost edge indication, are located, and a line is drawn through the two edge indications. Information from previous cycles of the Clk 201 and/or the Clk 202 can be incorporated into the slope and intercept computations to improve the accuracy of the computed intercept 428 and the slope 422.

For example, the two edge indications located to determine a line in TABLE 1 are the edge indications at u(0,3) and u(7,6). The slope 422 is computed as Δi/Δj, resulting in 7/3 for the period 404. Using the line equation, i=7/3(j)+b, where b is the intercept 428 that is computed as −7 which corresponds to −7/8 UI for the phase 403. In another example, the two edge indications located to determine a line in TABLE 3 are the edge indications at u(0,6) and u(7,17). The slope 422 is computed as Δi/Δj, resulting in 7/11 for the period 404. Using the line equation, i=7/11(j)+b, the intercept 428 (b) is computed as −42/11 which corresponds to −21/44 UI. Because of the wrapping the intercept is also 1/4 and 7/8. The intercept can be directly detected by the presence of an edge indication in a column that is a multiple of N+1 (i.e., equal to zero mod (N+1)). When the edge indications at u(0,5) and u(7,17) from TABLE 3 are used, the slope 422 is computed as Δi/Δj, resulting in 7/12 for the period 404. Using the line equation, i=7/11(j)+b, the intercept 428 (b) is computed as −42/12 which corresponds to −7/16 UI.

Figure 4F:
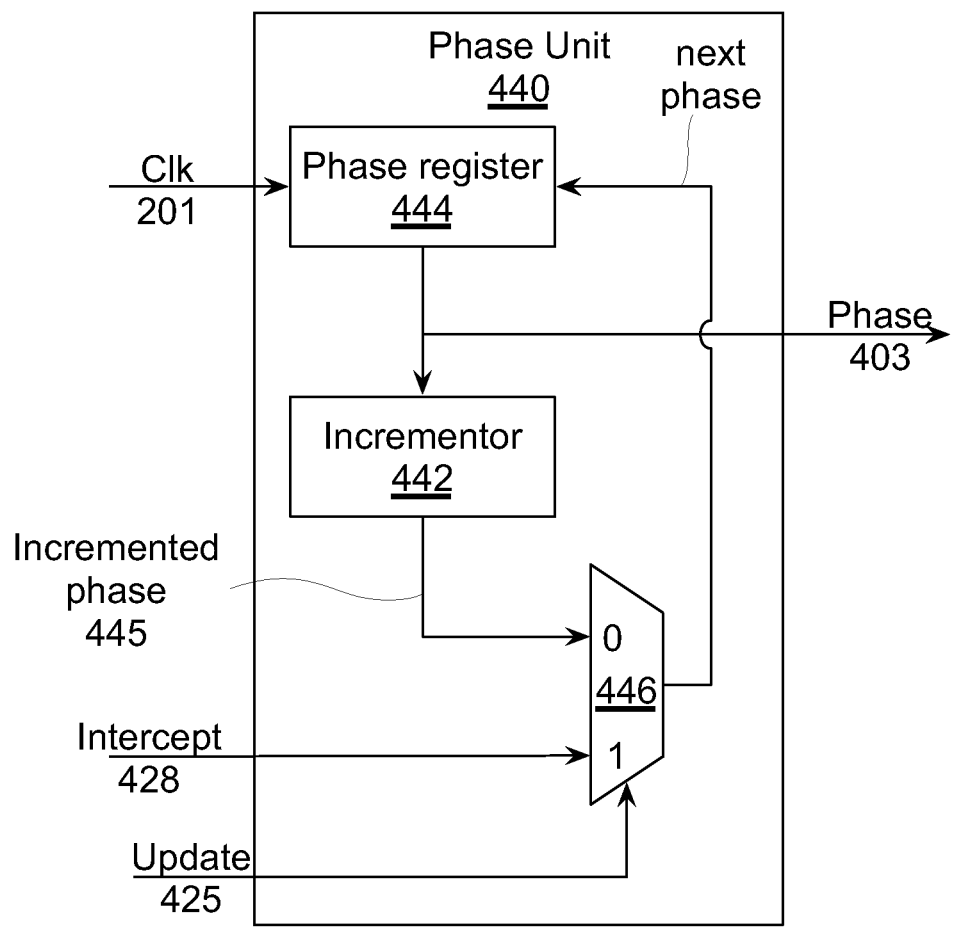
FIG. 4F illustrates a phase unit of FIG. 4C, in accordance with one embodiment.

FIG. 4F illustrates a phase unit 440 of FIG. 4C, in accordance with one embodiment. The phase unit 440 receives the values intercept 235 and update 425 from the edge detection unit 430 and generates the phase 403 value. The phase unit 440 includes a phase register 444, an incrementor 442, and a multiplexor 446. If at least two edge indications are detected (e.g., update 425 is asserted), then the multiplexor 446 selects the intercept 428 value as the output, next phase. When at least two edge indications are not detected (e.g., update 425 is not asserted), then the multiplexor 446 selects the incremented phase 445 as the next phase. The incremented phase 445 value is computed by the incrementor 442 as phase 403 incremented by ONE. The constant ONE represents one period of the Clk 201. In the previous example—where the phase 403 value is represented in eighths of a UI, the constant ONE has the binary value 01000—representing 8/8.

Figure 4G:
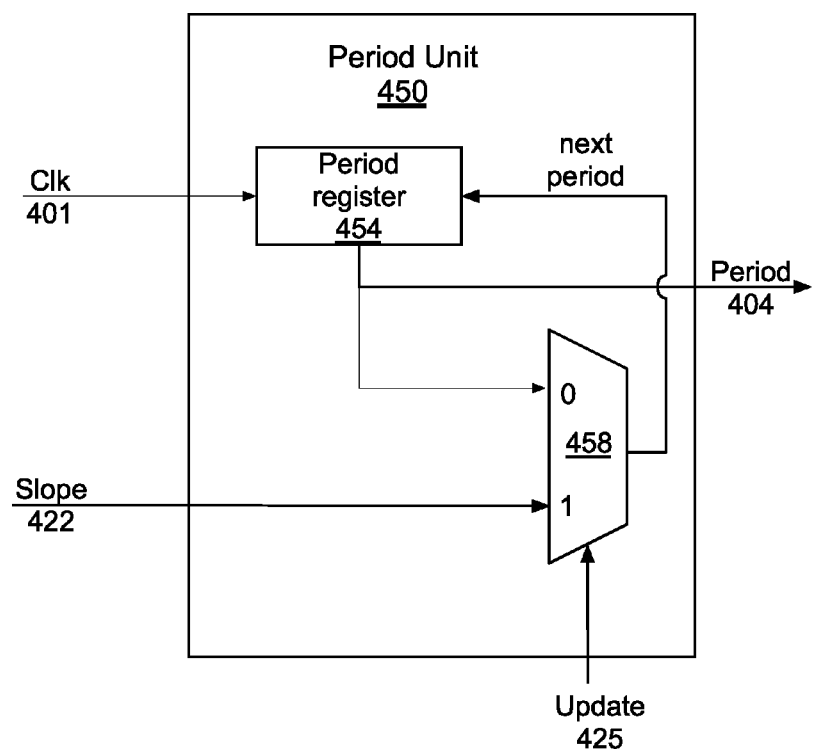
FIG. 4G illustrates a period unit of FIG. 4C, in accordance with one embodiment.

The next_phase value is input to the phase register 444 that outputs the phase 403 signal. The following Verilog may be translated to generate at a least a portion of the logic shown in the phase unit 440, in particular to provide an input (next_phase) to the phase register 444:

assign next_phase=update?intercept:phase+'ONE;

FIG. 4G illustrates a period unit 450 of FIG. 4C, in accordance with one embodiment. The period unit 450 includes a period register 454 and a multiplexor 458. The period unit 450 receives slope 422 and update 425 from the edge detection unit 430 and generates the period 404 output signal. If two or more edge indications are not detected (e.g., update 425 is not asserted), then the next_period (and period 404) is unchanged. Otherwise, if at least two edge indications are detected (e.g., update 425 is asserted), then the next_period is set to the slope 422. The multiplexor 458 selects the slope 422 when the update 425 is asserted. Otherwise, the multiplexor 458 selects the output of the period register 454, the pre-divider period, as the next period. The next_period value is input to the period register 454.

Figure 4H:
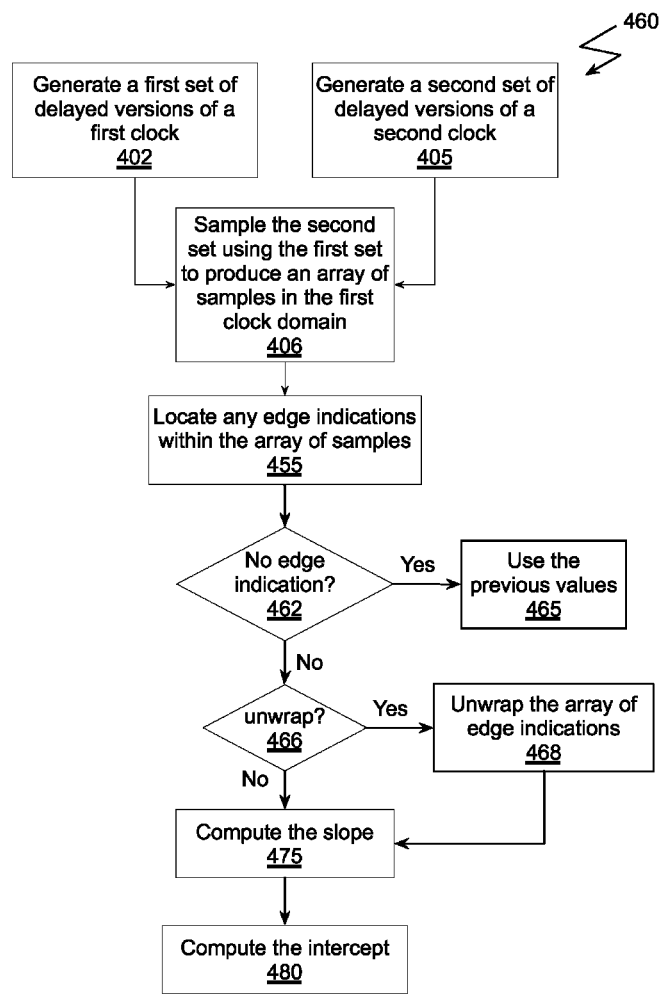
FIG. 4H illustrates another flowchart of a method for determining a phase and a period, in accordance with one embodiment.

FIG. 4H illustrates another flowchart of a method 460 for determining a phase 403 and a period 404, in accordance with one embodiment. Steps 402, 405, and 406 are completed by the high-resolution phase detector 400 to generate the transition signal array 421. At step 455, the edge detection unit 430 locates any edge indications within the transition signal array 421. At step 462, the edge detection unit 430 determines no edge indications were located, and, if so, the update 425 signal is negated so that the phase 403 is extrapolated forward using a previous phase and the period 404 is not updated.

Otherwise, if at least one edge indication is located, then, at step 466, the edge detection unit 430 determines if the transition signal array 421 should be unwrapped, and if so, at step 468, the edge detection unit 430 unwraps the transition signal array 421 to generate the unwrapped transition signal array 423. When unwrapping is not needed, the unwrapped transition signal array 423 equals the transition signal array 421. At step 475, at least two edge indications are processed by the edge detection unit 430 to compute the intercept 428 that equals the phase 403. At step 480, the at least two edge indications are processed by edge detection unit 430 to compute the slope 422 that equals the period 404. When only one edge indication is detected in the current unwrapped transition signal array 423, the latest edge indication detected for a most recent unwrapped transition signal array 423 is used as the second edge indication to compute the slope 422 and intercept 428. Fewer than two edge indications should only occur when the Clk 202 signal is much slower, i.e., the period of the Clk 202 signal is N times longer than the period of the Clk 201 signal.

Figure 5A:
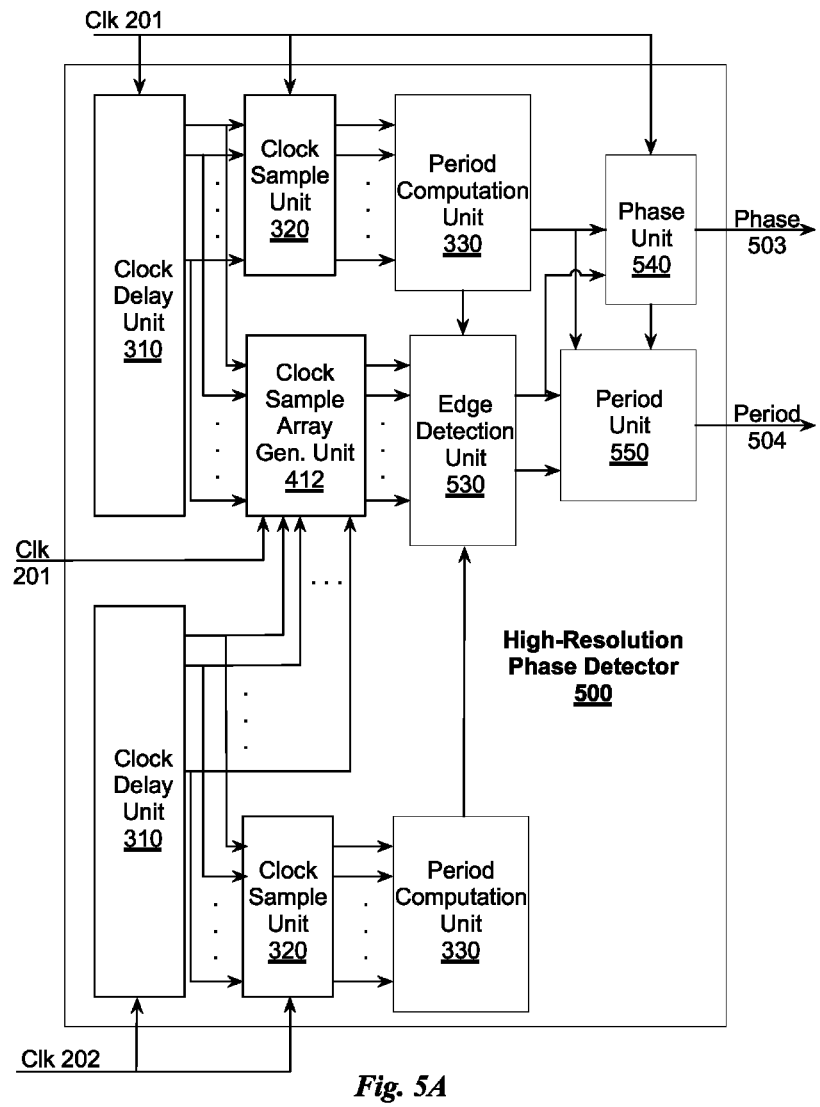
FIG. 5A illustrates another matrix phase detector, in accordance with one embodiment.

FIG. 5A illustrates another matrix phase detector, high-resolution phase detector 500, in accordance with one embodiment. The high-resolution phase detector 500 includes two open-loop clock delay units 310, two clock sample units 320, two period computation units 330, a clock sample array generation unit 412, an edge detection unit 530, a phase unit 540, and a period unit 550. The high-resolution phase detector 500 receives a first clock signal, Clk 201, and a second clock signal, Clk 202, and generates two values, a phase 503 and a period 504. The phase 503 and period 504 values are each encoded by multi-bit signals. The value of phase 503 represents a phase of the second clock signal (Clk 202) relative to the first clock signal (Clk 201). The value of period 504 represents a relative period between the second clock signal (Clk 202) and the first clock signal (Clk 201). At least one of the first clock signal (Clk 201) and the second clock signal (Clk 202) may vary over time. The high-resolution phase detector 500 is designed to continuously measure the phase and period as the frequency of the first clock and/or the second clock varies.

The open-loop clock delay unit 310 replaces the clock delay unit 210 in the high-resolution phase detector 500 compared with the high-resolution phase detector 400. As previously explained in conjunction with FIG. 3B, unlike the clock delay unit 210, the N clock phases produced by the open-loop clock delay unit 310 do not necessarily span exactly one clock cycle because the open-loop clock delay unit 320 does not include a phase comparator 215 to control the amount by which each of the delay elements 311 delays the Clk 201 to generate the delayed versions of the Clk 201. The number of delay elements 311 should be high enough so that at least one period of the Clk 201 is sampled.

As with the closed loop design using the clock delay unit 210, in a preferred embodiment, the clock delay unit 310 associated with the Clk 201 signal should have a delay that tracks variations in the period of the Clk 201 signal due to voltage, temperature, or other variations and the clock delay unit 310 associated with the Clk 202 signal should have a delay that tracks variations in the period of the Clk 202 signal due to voltage, temperature, and other variations.

The clock sample units 320 each include a plurality of flip-flops 322. A first clock sample unit 320 receives the delayed versions of Clk 201 generated by the first clock delay unit 310 and produces a first sequence of samples of the first clock signal, Clk 201. Sampling the first clock signal (Clk 201) is performed to compute the period of the Clk 201 in units of the delay introduced by one delay element 311. The first period computation unit 330 receives the first sequence of samples and computes a period of the Clk 201, rperiod, as previously described in conjunction with FIG. 3D. The rperiod is output by the first period computation unit 330 to the phase unit 540. The period computation unit 330 also generates a first clock mask indicating which rows of the transition signal array are included within a single period of the Clk 201.

A second clock sample unit 320 receives the delayed versions of Clk 202 generated by the second clock delay unit 310 and produces a second sequence of samples of the second clock signal, Clk 202. Sampling the second clock signal is performed to compute the period of the Clk 202 in units of the delay introduced by one delay element 311. The second period computation unit 330 receives the second sequence of samples and generates a second clock mask indicating which columns of the transition signal array are included within a single period of the Clk 202. The first clock mask and the second clock mask are applied to the transition signal array by the edge detection unit 530 to ensure that transitions within the periods of the Clk 201 and 202 are detected.

Figure 5B:
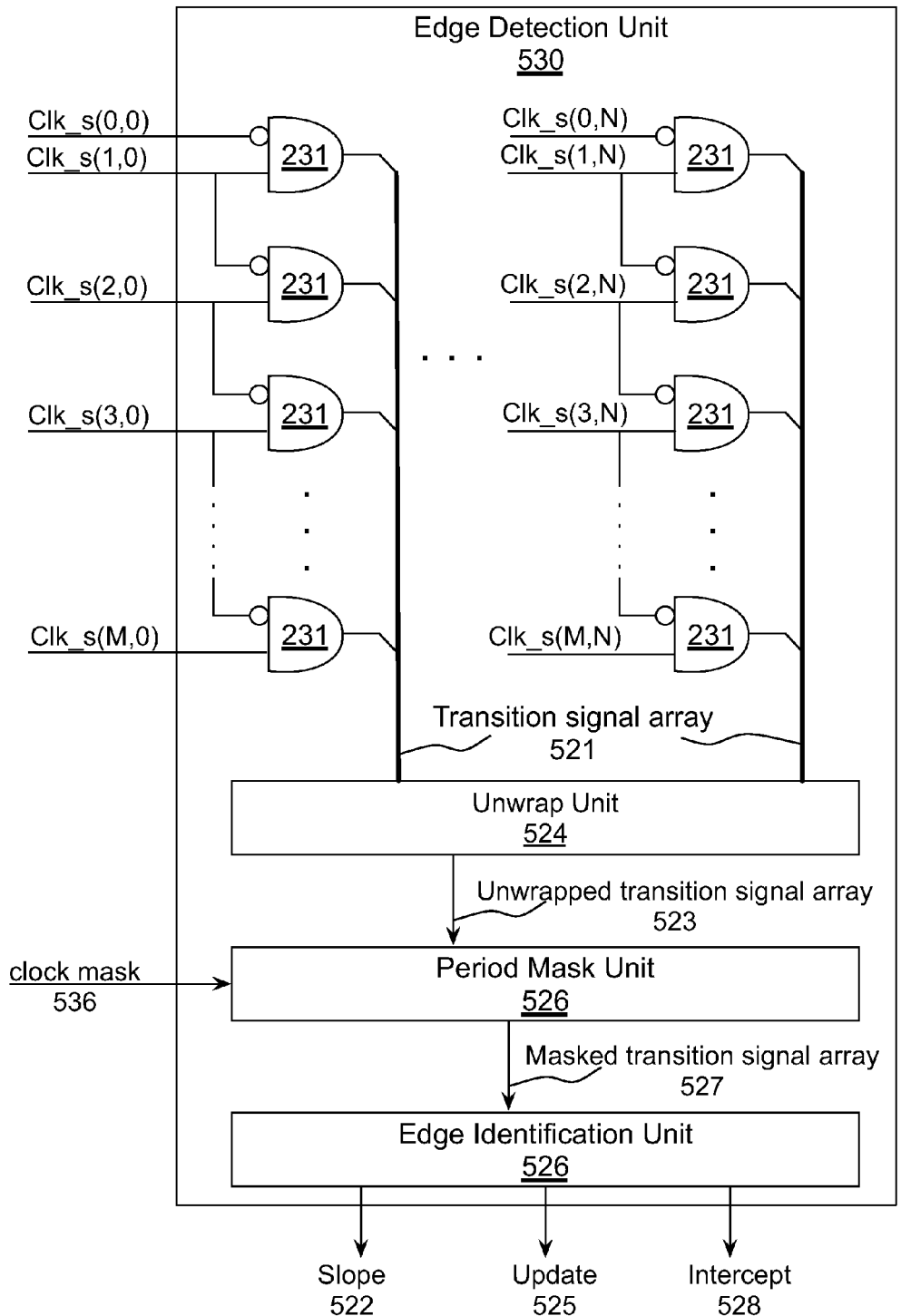
FIG. 5B illustrates an edge detection unit of FIG. 5A, in accordance with one embodiment.

FIG. 5B illustrates an edge detection unit 530 of FIG. 5A, in accordance with one embodiment. The edge detection unit 530 includes an array of AND gates 231, an unwrap unit 524, a period mask unit 526, and an edge identification unit 526. The edge detection unit 530 receives the array of clock samples 414 produced by the clock sample array generation unit 412. The array of clock samples 414 is input to an array of AND gates 231 to locate edge indications, e.g., rising transitions within the array of clock samples. In other words, the array of AND gates 231 detects rising edges of each sub-phase of the clock signal, Clk 202 sampled by the sub-phases of the first clock signal, Clk 201. In one embodiment, the edge detection unit 530 may be configured to locate edge indications that are falling transitions (e.g., by switching the inputs of the AND gates 231) or both falling and rising transitions (e.g., by switching the AND gates with XOR gates). To detect rising edges, clock samples in a column of the array of clock samples 414, i.e., vertically adjacent clock samples, are compared to compute a transition signal array 521, $m(i,j) = \sim Clk\_s(i,j) \ \& \ Clk\_s(i+1,j)$.

The transition signal array 521 is received by the unwrap unit 524 and the unwrapped transition signal array 523 is generated. The transition signal array 521 and the unwrapped transition signal array 523 contain an edge indication (e.g., one or TRUE value) for each sub-phase of the Clk 202 for which a rising edge was detected during at least one cycle of the Clk 201. The period mask unit 526 receives the unwrapped transition signal array 523 and the clock mask 536 and generates the masked transition signal array 527. Because the open-loop clock delay units 310 do not necessarily span exactly one clock cycle a row clock mask and a column clock mask are provided as the clock mask 536 input to the edge detection unit 530. Edge indications within the unwrapped transition signal array 523 that are lie outside of a single period of the Clk 201 and the Clk 202 are zeroed out by the clock mask 536 to generate the masked transition signal array 527.

An edge indication occurs in the column (j) corresponding to the sub-phase of the Clk 202 and in the row (i) corresponding to the sub-phase of the Clk 201 during which that sub-phase of the Clk 202 had a transition. The line formed by connecting at least two edge indications in the masked transition signal array 527 indicates both the relative period and phase of the Clk 202 and Clk 201 signals. The slope of the line indicates the relative period 504, and the intercept of the line with a vertical axis indicates the relative phase 503. The edge identification unit 526 generates the slope 522, intercept 528, and update 525 signals, as previously described in conjunction with FIG. 4E, based on the masked transition signal array 527.

As shown in FIGS. 5A and 5B the open-loop clock delay unit 310 is used to generate the sub-phases of both the Clk 201 and the Clk 202. In another embodiment, the open-loop clock delay unit 310 may be used to generate the sub-phases of either the Clk 201 or the Clk 202 and the closed-loop clock delay unit 310 may be used to generate the sub-phases of the other clock signal.

Figure 5C:
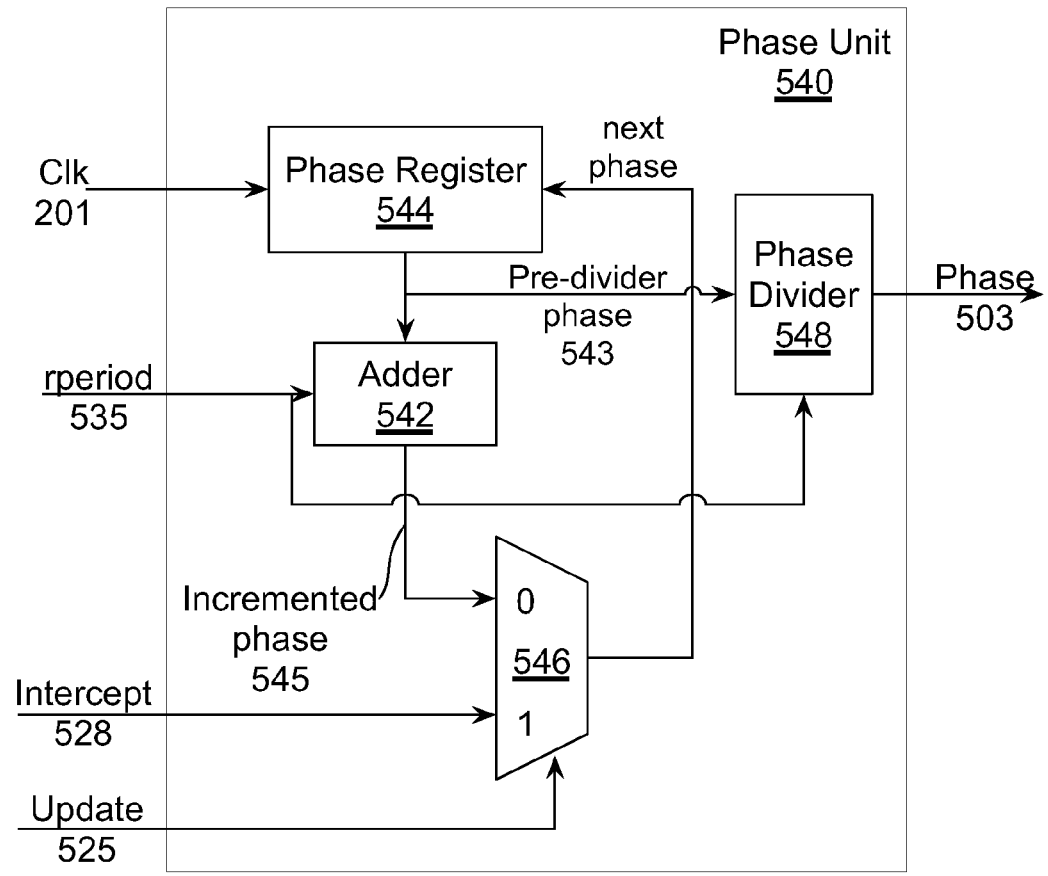
FIG. 5C illustrates a phase unit of FIG. 5A, in accordance with one embodiment.

FIG. 5C illustrates a phase unit 540 of FIG. 5A, in accordance with one embodiment. The phase unit 540 receives the values intercept 528 and update 525 from the edge detection unit 530 and generates the phase 503 value. The phase unit 540 includes a phase register 544, an incrementor 542, a multiplexor 546, and a phase divider 548. If at least two edge indications are detected (e.g., update 525 is asserted), then the multiplexor 546 selects the intercept 528 value as the output, next phase. When at least two edge indications are not detected (e.g., update 425 is not asserted), then the multiplexor 546 selects the incremented phase 545 as the next phase. The incremented phase 545 value is computed by the adder 542 as the pre-divider phase 543 incremented by rperiod 535.

Figure 5D:
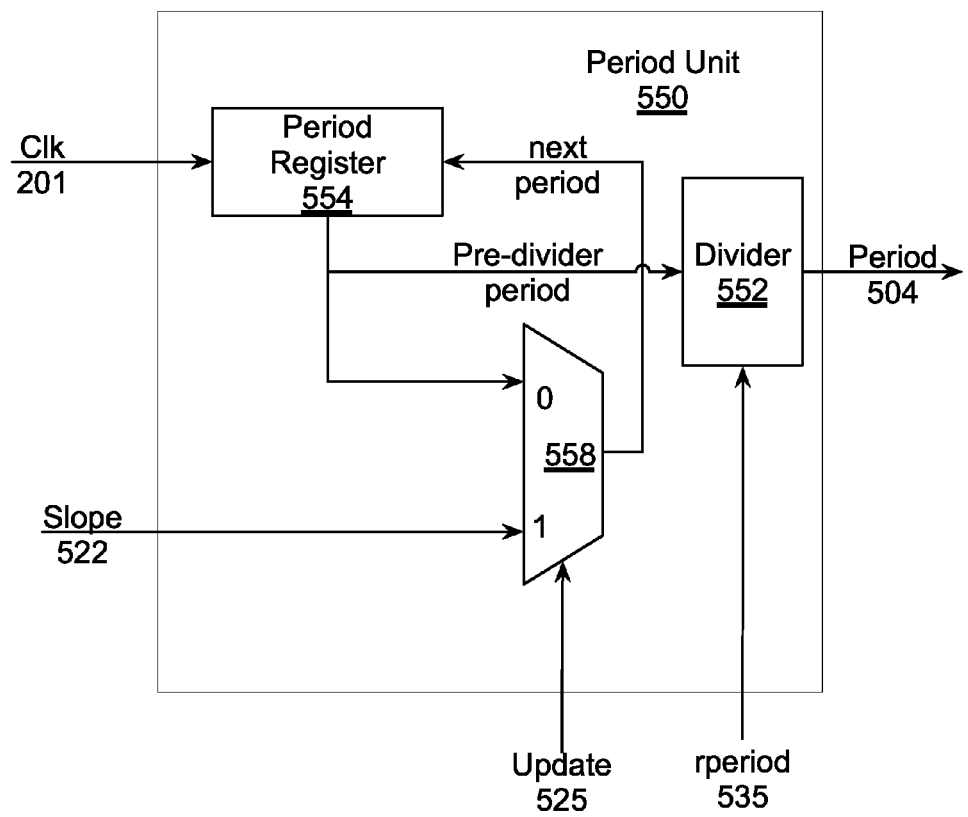
FIG. 5D illustrates a period unit of FIG. 5A, in accordance with one embodiment.

The next_phase value is input to the phase register 544 that outputs the pre-divider phase 543 value. The output of the phase register 544, e.g., pre-divider phase 543, is divided by rperiod 535 within the phase divider 548 to produce the phase 503 value. The following Verilog may be translated to generate at a least a portion of the logic shown in the phase unit 540, in particular to provide an input (next_phase) to the phase register 544:

assign next_phase=update?intercept:predivider_
phase+rperiod;

FIG. 5D illustrates a period unit 550 of FIG. 5A, in accordance with one embodiment. The period unit 550 includes a period register 554, a multiplexor 558, and a divider 552. The period unit 550 receives slope 522 and update 525 from the edge detection unit 530 and the rperiod 535 from the first period computation unit 330 and generates the period 504 output signal. If two or more edge indications are not detected (e.g., update 525 is not asserted), then the next_period (and period 504) is unchanged. Otherwise, if at least two edge indications are detected (e.g., update 525 is asserted), then the next_period is set to the slope 522. In other words, the multiplexor 558 selects the slope 522 when the update 525 is asserted. Otherwise, the multiplexor 558 selects the output of the period register 554, the pre-divider period, as the next period. The next period value is input to the period register 554. The output of the period register 554 (i.e., pre-divider period) is divided by rperiod 535 within the period divider 552 to produce the period 504 value.

Figure 5E:
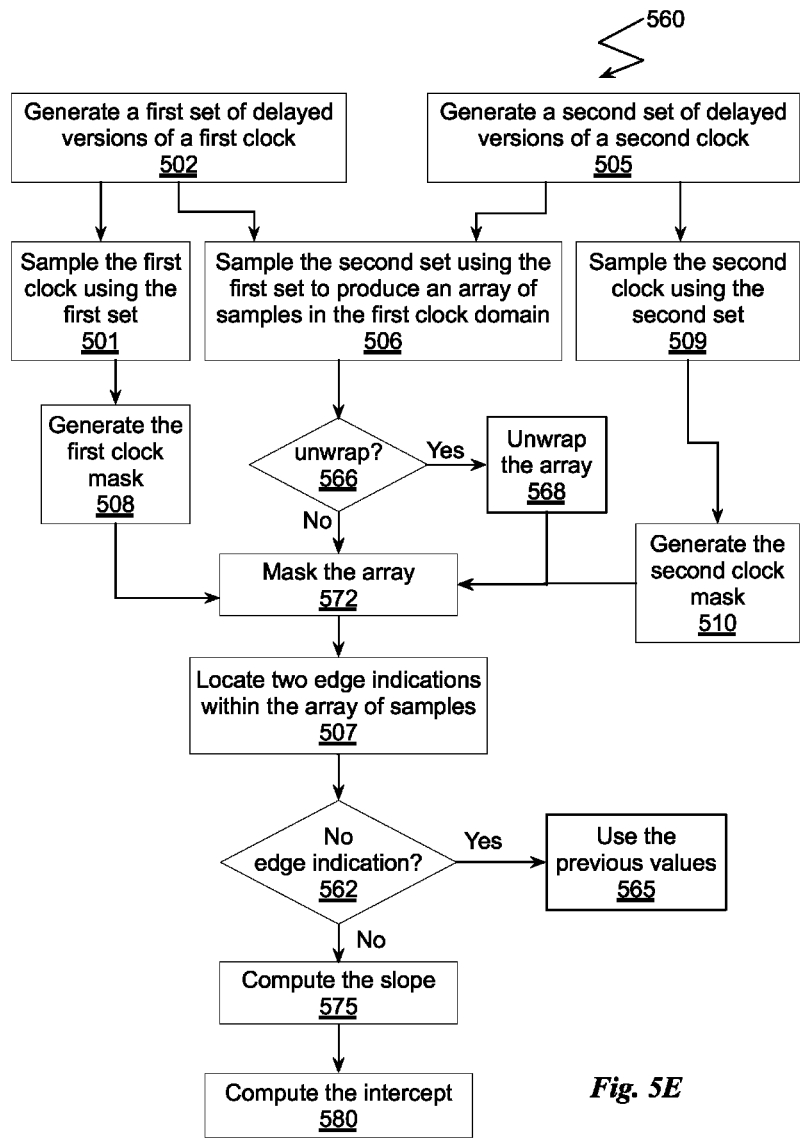
FIG. 5E illustrates another flowchart of a method for determining a phase and a period, in accordance with one embodiment.

FIG. 5E illustrates another flowchart of a method 560 for determining a phase 503 and a period 504, in accordance with one embodiment. At step 502, a first clock delay unit 210 generates a first set of delayed versions of the first clock signal, Clk 201. At step 505, a second clock delay unit 210 generates a first set of delayed versions of the second clock signal, Clk 202. At step 506, the clock sample array generation unit 412 samples the second set of delayed versions of the second clock using the first set of delayed versions of the first clock to produce an array of clock samples in the first clock domain corresponding to the Clk 201.

At step 501, the first clock sample unit 220 samples the first clock signal using the first set of delayed versions of the first clock signal. At step 508, the first period computation unit 230 computes the period of the first clock, rperiod 535, and generates a first clock mask corresponding to a single period of the first clock. At step 509, the clock sample unit 220 samples the second clock signal using the second set of delayed versions of the second clock signal. At step 510, the second period computation unit 230 computes the period of the second clock and generates a second clock mask corresponding to a single period of the second clock.

At step 566, the edge detection unit 430 determines if the transition signal array 521 should be unwrapped, and if so, at step 568, the edge detection unit 530 unwraps the transition signal array 521 to generate the unwrapped transition signal array 523. When unwrapping is not needed, the unwrapped transition signal array 523 equals the transition signal array 521. At step 572, the first and the second clock masks are applied to the unwrapped transition signal array 523 to generate the masked transition signal array 527. At step 507, the edge detection unit 530 locates any edge indications within the masked transition signal array 527. At step 562, the edge detection unit 530 determines if no edge indications were located, and, if so, at step 565, the update 525 signal is negated so that the phase 503 is extrapolated forward using a previous phase and the period 504 is not updated.

Otherwise, if at least two edge indications are located, then, at step 575, at least two edge indications located in the masked transition signal array 527 are processed by the edge detection unit 530 to compute the intercept 528 that equals the phase 503. At step 580, the at least two edge indications located in the masked transition signal array 527 are processed by edge detection unit 530 to compute the slope 522 that equals the period 504. When only one edge indication is detected in the current masked transition signal array 527, the latest edge indication detected for a most recent masked transition signal array 527 is used as the second edge indication to compute the slope 522 and intercept 528. Fewer than two edge indications should only occur when the Clk 202 signal is much slower, i.e., the period of the Clk 202 signal is N times longer than the period of the Clk 201 signal.

Figure 6A:
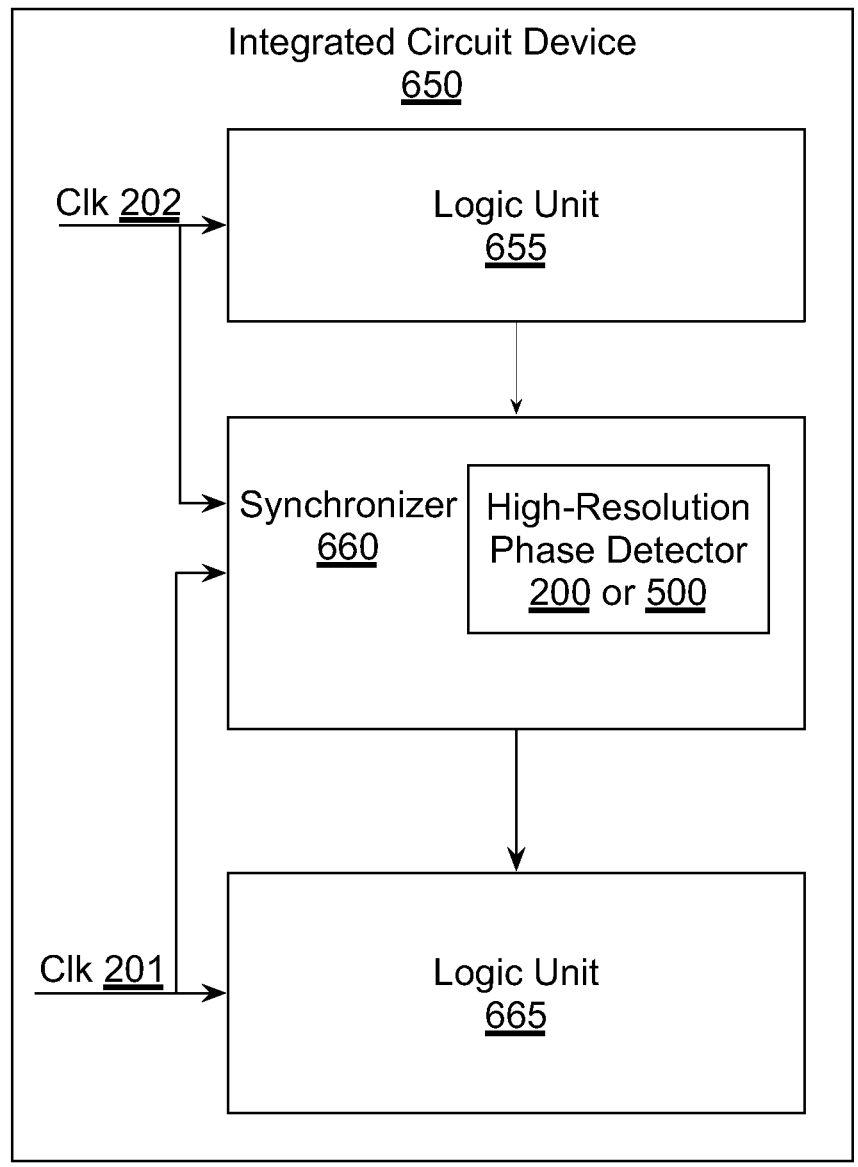
FIG. 6A illustrates an exemplary integrated circuit in which the various architecture and/or functionality of the various previous embodiments may be implemented.

FIG. 6A illustrates an exemplary integrated circuit device 650 in which the various architecture and/or functionality of the various previous embodiments may be implemented. The integrated circuit device 650 includes a logic unit 655, a synchronizer 660, and a logic unit 665. The logic unit 655 receives the clock 202 and generates outputs that are synchronous with the clock 202. The outputs are received by the synchronizer 660 and are transmitted from the clock domain of the clock 202 to the clock domain of the clock 201 using the phase and period values, phase 203, 303, 403, and 503 and period 204, 304, 404, and 504 computed by the high-resolution phase detector 200, 300, 400, or 500. The transmitted outputs that are synchronized to the clock domain of the clock 201 are received by the logic unit 665.

A Variation-Tolerant Periodic Synchronizer

When provided with the phase 203 and period 204 values, a variation-tolerant synchronizer may be configured to synchronize signals transmitted from a second clock domain corresponding to the first clock signal, Clk 202, and received in a first clock domain corresponding to the second clock signal, Clk 201. The variation-tolerant synchronizer can tolerate rapid changes in clock periods of the first and/or second clock signals—subject to a maximum variation in phase per cycle of the first clock signal relative to the second clock signal. Therefore, the variation-tolerant synchronizer can be used in integrated circuit devices that employ voltage-tracking clock generators. The variation-tolerant synchronizer may also synchronize signals with low latency during power state transitions when the first and/or second clock signals can change frequency.

The high-resolution phase detector 200, 300, 400, or 500 may be configured, as previously described, to measure the next phase and next period of the Clk 202 and update the phase 203 and period 204 values at the end of each cycle of the Clk 201, e.g., at the rising edge of the Clk 201. The phase indicates the time from the last transition of the Clk 202 to the last transition of the Clk 201. The period is the time between two transitions of the Clk 202.

To perform synchronization with low latency, the variation-tolerant synchronizer samples the signals to be synchronized at various transitions of the Clk 202. In one embodiment, two registers are used to separately sample "even" and "odd" transitions. In other words, every other cycle of the Clk 202 an "even" register samples and stores the signals to be synchronized. An "odd" register samples and stores the signals to be synchronized on the non-even cycles (odd cycles) of the Clk 202. Each phase 203 value is associated with an indication of whether the measured phase corresponds to an even edge or an odd edge of the Clk 202. When more than two registers sample and store the signals to be synchronized, the indication specifies the respective periodic transition, e.g., first edge, second edge, third edge, etc., of the Clk 202.

Because of retiming and synchronization delays the phase 203 and period 204 values reflect the state of the Clk 202 D cycles of the Clk 201 in the past. To select an output of the proper register sampling the signals to be synchronized (even/odd or first/second/third edge, etc.) one or more values of the phase 203 in the future cycles of the Clk 201 are extrapolated. More specifically, the phase 203 S=D+1 cycles in the future is extrapolated from the current values of the phase 203 and period 204. Intervening future values of the phase 203 are also extrapolated when D is greater than zero. A series of phase values including the extrapolated values of the phase 203 is searched to identify the register sampling the signals to be synchronized that is the most recently written register that is safe to select to generate synchronized signals in the first clock domain that corresponds to the Clk 201.

To reduce the latency incurred by the signals transmitted through the variation-tolerant synchronizer, the edge of the Clk 202 that occurs just before the next edge of the Clk 201, based on the series of phase values, is identified. The edge that is identified needs to have sufficient timing margin so that the sampled signals are stable. The register associated with the identified edge (even/odd or first/second/third edge) is selected for output by the variation-tolerant synchronizer to produce the synchronized signals.

Figure 6B:
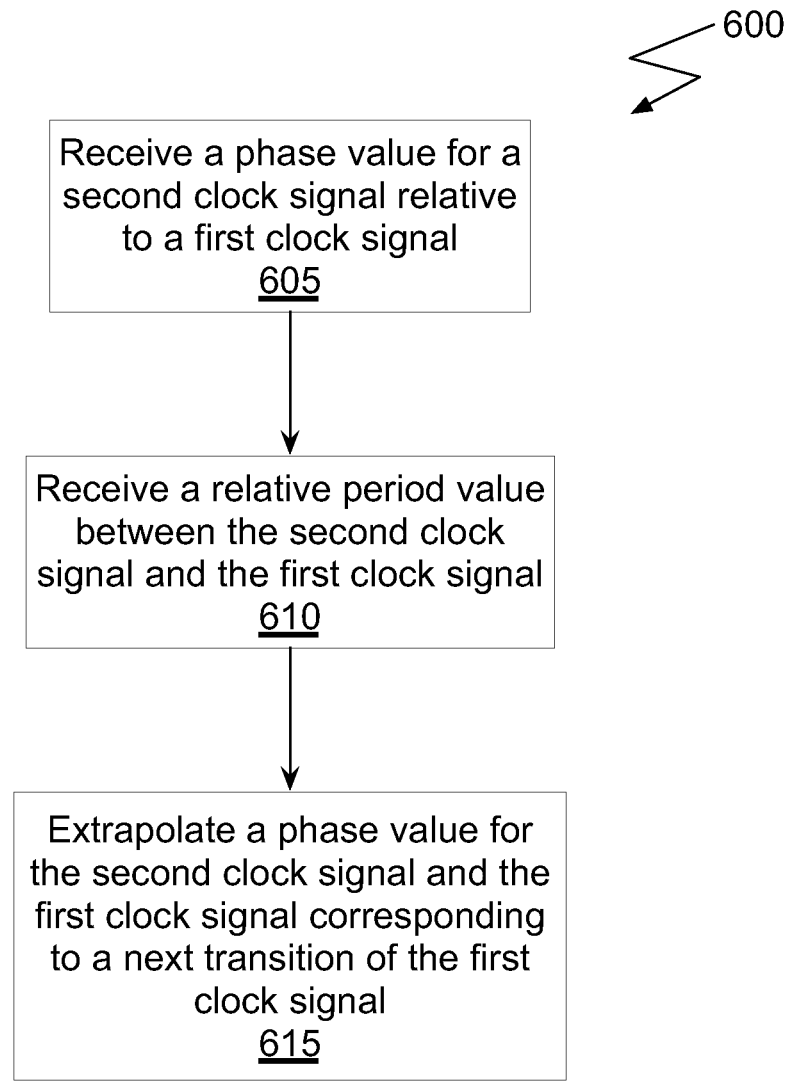
FIG. 6B illustrates a flowchart of a method for synchronizing signals, in accordance with one embodiment.

FIG. 6B illustrates a flowchart of a method 600 for synchronizing signals, in accordance with one embodiment. At step 605 a phase value representing a phase of a second clock signal relative to a first clock signal is received by the variation-tolerant synchronizer. At step 610 a period value representing a relative period between the second clock signal and the first clock signal is received by the variation-tolerant synchronizer. At step 615 an extrapolated phase value of the second clock signal relative to the first clock signal corresponding to a next transition of the first clock signal is computed based on the phase value and the period value.

More illustrative information will now be set forth regarding various optional architectures and features of a variant tolerant synchronizer. It should be strongly noted that the following information is set forth for illustrative purposes and should not be construed as limiting in any manner. Any of the following features may be optionally incorporated with or without the exclusion of other features described.

Given the phase 203 (phase) value and the period 204 (period) value, extrapolated phase values may be computed as:

$$p_i = \text{phase} + S - i \cdot \text{period}$$

for i=[0,X] and S in UI. Where X is selected to ensure at least one extrapolated phase value is greater than one. Greater than one means that the extrapolated phase value occurs after the current edge of the Clk 201, i.e., in the future. Each extrapolated phase value $p_i$ is the time from transition i of the Clk 202 to the next transition of the Clk 201.

Figure 6C:
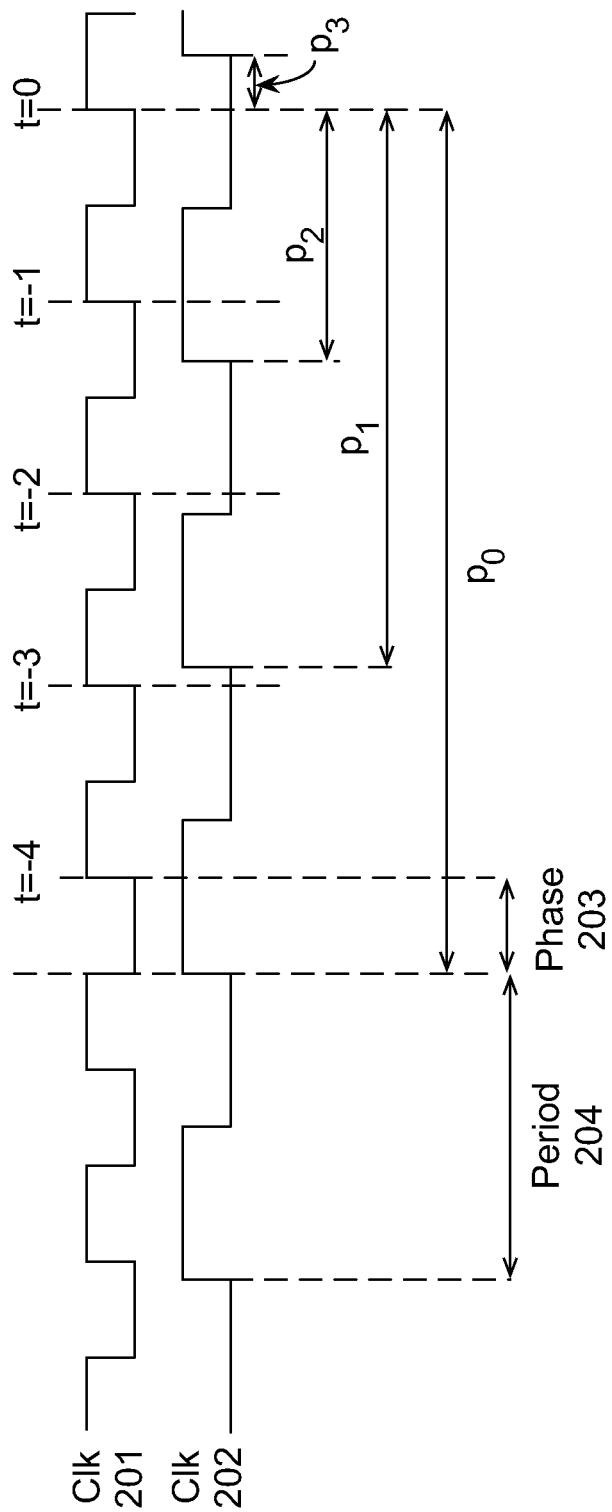
FIG. 6C illustrates waveforms of two clock signals, in accordance with one embodiment.

FIG. 6C illustrates waveforms of two clock signals, the Clk 201 and the Clk 202, in accordance with one embodiment. In the example shown in FIG. 6C, the frequency of the Clk 201 is 1 GHz (1000 ps period) and the frequency of the Clk 202 is 621 MHz (1610 ps period). The phase 203 value is an 8 (four bits to the right of the binary point, phase=0.5). The phase 203 value is associated with an even edge indication. The period 204 value is 26 (1.61 in fixed-point format with four bits to the right of the binary point). The phase 203 and period 204 values reflect the state of the Clk 202 D=3 cycles of Clk 201 in the past, so S=4.

As shown in FIG. 6C, the phase 203 value that is received at time t=0 corresponds to the state of the Clk 201 and the Clk 202 at time t=−4, four cycles of the Clk 201 earlier than time t=0. At time t=0, the variation tolerant synchronizer selects either the even or odd register to sample the signals to be synchronized. As previously explained, the variation tolerant synchronizer first computes extrapolated phase values to generate a series of extrapolated phases based on the phase 203 value and the period 204 value.

At time t=−4 a rising edge of the Clk 202 occurred in the middle of the receiver eye of the Clk 201, i.e., halfway between two rising edges of the Clk 201. Assuming that the high-resolution phase detector 200 or 500 includes N=16 delay elements 211 or 511, respectively, the period 203 value is 26 measured in units of $1/16^{th}$ of the period of the Clk 201 or 1/16 UI. S in units of 1/16 UI is 4*N, so S=64/16 UI. The variation tolerant synchronizer then computes a series of extrapolated phase values $P_i$ in units of 1/16 UI as:

$$p_0 = 8 + 64 = -72 \text{(even)}$$

$$p_1 = 8 + 64 - 26 = -46 \text{(odd)}$$

$$p2 = 8 + 64 - 3 \cdot 26 = 6 \text{(even)}$$

$$p3 = 8 + 64 - 3 \cdot 26 = 6 \text{(odd)}$$

$$p_4 = 8 + 64 - 4 \cdot 26 = 32 \text{(even)}$$

The variation tolerant synchronizer searches the series of extrapolated phase values to find the two extrapolated phase values that straddle the transition of the Clk 201 at time t=0. The two extrapolated phase values that straddle time t=0 provide the timing of the two transitions of the Clk 202 that are closest to the next transition of the Clk 201 occurring at t=0. One of the transitions of the Clk 202 is an even edge and the other is an odd edge. To ensure the largest possible timing margin, the variation tolerant synchronizer may be configured to select the extrapolated phase value having the larger margin. Alternatively to minimize latency, the synchronizer can be configured to select the smallest negative extrapolated phase value providing adequate margin for safe sampling of input signals in the clock domain associated with the Clk 202. The smallest negative phase value is the latest extrapolated phase value that is closest to the next transition of the Clk 201.

As shown in FIG. 6C, the two extrapolated phase values that straddle the edge of the Clk 201 at t=0 are $p_2$=−20 (even)

and $p_3=6$ (odd). In other words, an even edge of the Clk 202 occurs 20/16 of a Clk 201 cycle before the next edge of the Clk 201 (at time t=0) and an odd edge of the Clk 202 occurs 6/16 of a Clk 201 cycle after the next edge of Clk 201. The variation tolerant synchronizer is configured to identify the extrapolated phase value $p_2=-20$ as the safe extrapolated phase value and select the "even" register corresponding to the extrapolated phase value $p_2$. Selecting the extrapolated phase value $p_2$ provides 20/16 of a Clk 201 cycle, i.e., 1375 ps of timing margin. In one embodiment, to reduce latency, the minimum timing margin is added to each extrapolated phase and the variation tolerant synchronizer is configured to select the negative extrapolated phase value closest to t=0.

If the period of the Clk 201 and/or the Clk 202 varies smoothly during a voltage transient, accuracy of the extrapolated phase values may be improved by adding a second order term to the extrapolated phase value equation. The second order term accounts for the slope of a sequence of period 204 values. Whenever the period 204 value is updated, a difference value for each consecutive period 204 value, dperiod, may be computed:

dperiod=new_period–old_period.

The equation to compute extrapolated phase values using the second order term is:

$p_i$=phase+S–i*period–$i^2$*dperiod

However, because the period 204 values reflect the state of the Clk 201 and the Clk 202 in the past, the value of dperiod also lags and the extrapolated phase values will also lag and not account for the changing period for D cycles of the Clk 201.

Figure 6D:
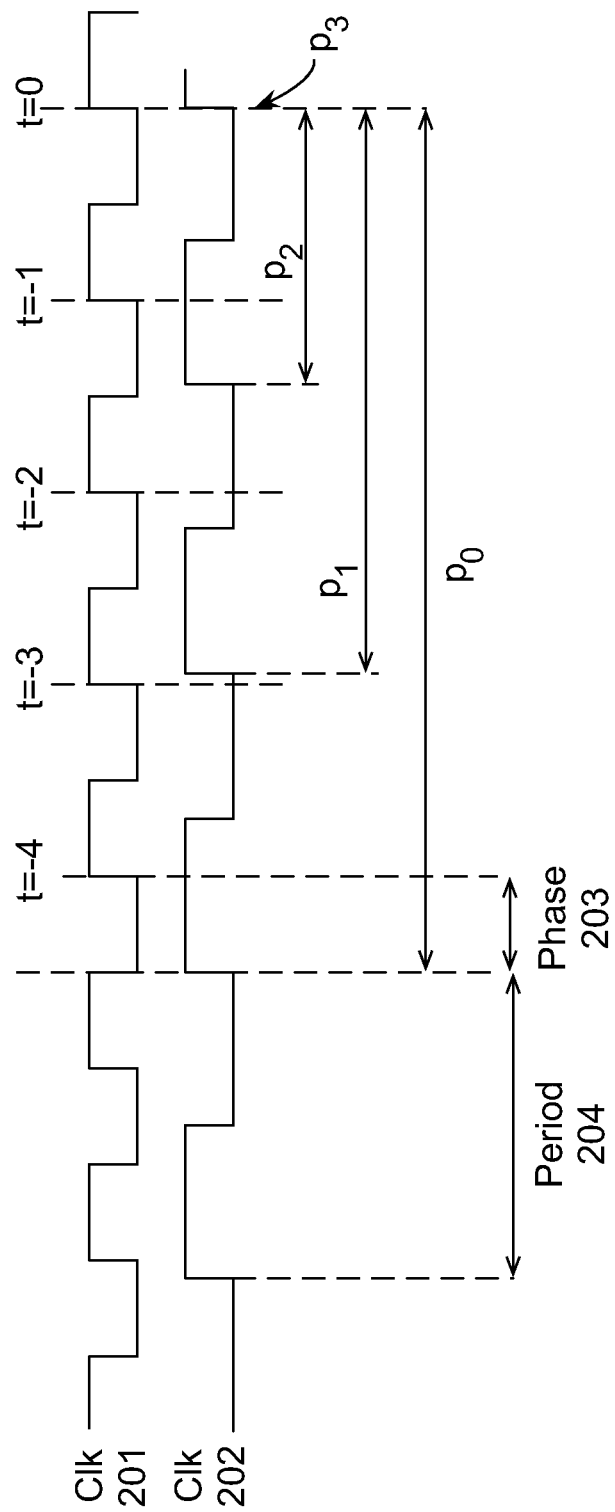
FIG. 6D illustrates other waveforms of two clock signals, in accordance with one embodiment.

FIG. 6D illustrates other waveforms of the two clock signals, Clk 201 and Clk 202, in accordance with one embodiment. At time t=–4 a rising edge of the Clk 202 occurred in the middle of the receiver eye of the Clk 201, i.e., halfway between two rising edges of the Clk 201. Assuming that the high-resolution phase detector 200, 300, 400, or 500 includes 16 delay elements 211, the period 203 value is 26/16 and dperiod is computed as –2/3. The variation tolerant synchronizer then computes a series of extrapolated phase values p, in units of 1/16th of the period of the Clk 201 as:

$p_0$=8+64=–72(even)

$p_1$=8+64–26+(⅔)=–47(odd)

$p_2$=8+64–2*26+4*(⅔)=–22⅔(even)

$p_3$=8+64–3*26+9*(⅔)=0(odd)

$p_4$=8+64–4*26+16*(⅔)=21⅓(even)

The variation tolerant synchronizer searches the series of extrapolated phase values to find the two extrapolated phase values that straddle the transition of the Clk 201 at time t=0. The two extrapolated phase values that straddle time t=0 provide the timing of the two transitions of the Clk 202 that are closest to the next transition of the Clk 201. One of the transitions of the Clk 202 is an even edge and the other is an odd edge. To ensure the largest possible timing margin, the variation tolerant synchronizer may be configured to select the extrapolated phase value having the larger margin. Alternatively the variation tolerant synchronizer may be configured to select the smallest negative phase value with a safe margin.

As shown in FIG. 6D, the two extrapolated phase values that straddle the edge of the Clk 201 at t=0 are $p_2$=–22⅔ (even) and $p_3$=0 (odd). The variation tolerant synchronizer is configured to identify the extrapolated phase $p_2$=–22⅔ as the safe extrapolated phase value and select the "even" register corresponding to the extrapolated phase $p_2$. The extrapolated phase $p_3$=0 should not be selected because the timing margin is 0 and the edges of the Clk 201 and the Clk 202 may be coincident.

The worst-case timing in terms of selecting a safe extrapolated phase value occurs when the even and odd extrapolated phase values are equidistant from t=0 (the current transition of the Clk 201) because the timing margin is half of the period of the Clk 201, $T_r$/2. The timing margin needs to accommodate the errors in the measured phase 203 and period 204 values. Errors in measurement of the phase 203 value include quantization errors of ½ LSB (1/32 of the period of the Clk 201 the previous example) plus any systematic error in the high-resolution phase detector 200, 300, 400, or 500. Errors in measurement of the period 204 value include quantization plus systematic error multiplied by i. The maximum value of i is $Sf_t/f_r$, where $f_t$ and $f_r$ are the frequencies of the Clk 202 and the Clk 201, respectively. The timing margin also needs to accommodate errors due to variations of the periods of the Clk 201 and/or the Clk 202 due to voltage transients integrated over i cycles.

For example, suppose that the measurement error of the phase 203 value and the period 204 value are limited to 1/32 of the period of the Clk 201 (31 ps), that the period of the Clk 202 is at least 1000 ps, that $i_{max}$=6, and that the keepout region is 50 ps wide. The keepout region is a threshold of time on either side of an edge of the Clk 201 during which an extrapolated phase value is not considered safe. The measurement error is a total of 7*31 ps=217 ps. When the measurement error and the keepout region are subtracted from the period of the Clk 202, 1000 ps–217 ps=733 ps remain within which to tolerate a period variation over 6 cycles. 733 ps over 6 cycles averages to over 120 ps/cycle, or assuming a linear variation, a sweep from 0ps/cycle at the start of the interval to 240 ps/cycle at the end of the interval.

If needed, the timing margin may be increased by using more registers in the synchronizer. For example, rather than dividing edges into even and odd, three registers may be used labeling edges as first, second, and third. Using three separate registers provides a full cycle of the Clk 202 as timing margin. Using two registers gives a timing margin of 1/2 of a Clk 202 period. Using three registers gives a timing margin of one Clk 202 period and using four registers gives a timing margin of two Clk 202 periods. The extrapolated phase value that is closest to the current edge of the Clk 201 edge is the latest extrapolated phase value and when the latest extrapolated phase value meets the timing margin requirement it is considered to be the safe extrapolated phase value. The register corresponding to the safe extrapolated phase value is selected to generate the synchronized signals.

Figure 7A:
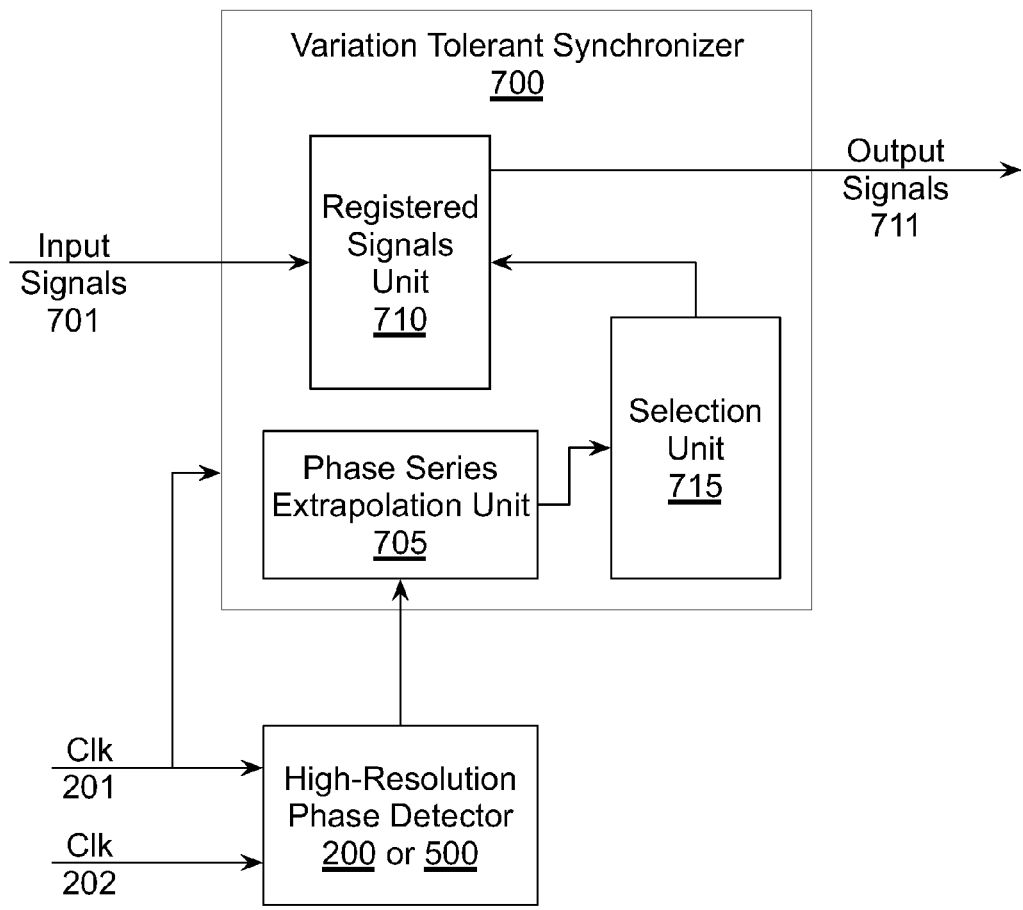
FIG. 7A illustrates a variation-tolerant periodic synchronizer, in accordance with one embodiment.

FIG. 7A illustrates a variation-tolerant periodic synchronizer 700, in accordance with one embodiment. The variation tolerant synchronizer 700 includes a registered signals unit 710, a phase series extrapolation unit 705, and a selection unit 715. A high-resolution phase detector 200, 300, 400, or 500 may be coupled to the variation tolerant synchronizer 700 to provide the phase 203 value and the period 204 value. The variation-tolerant periodic synchronizer 700 receives the input signals 701 that are synchronized to the Clk 202, the Clk 201, the Clk 202, the phase 203 value, and the period 204 value and produces the output signals 711 that are synchronized to the Clk 201.

The registered signals unit 710 receives the input signals 701 that are synchronized to the Clk 202, samples the input signals 701 at different cycles of the Clk 202 (odd/even or first/second/third edges, etc.) and stores the sampled input signals for the different cycles of the Clk 202 in separate registers. The phase series extrapolation unit 705 receives the phase 203 and period 204 values and computes a series of extrapolated phase values that are provided to the selection unit 715. The selection unit 715 identifies a safe extrapolated phase value of the series of extrapolated phase values that is closest to the current transition of the Clk 201 while providing adequate timing margin.

If a safe extrapolated phase value cannot be found, the selection unit 715 indicates that no safe extrapolated phase value was found by negating an enable signal and updating of the output signals 711 is disabled for the current cycle of the Clk 201. When a safe extrapolated phase value is identified by the selection unit 715, the selection unit 715 configures the registered signals unit 710 to select the register corresponding to the safe extrapolated phase value to generate the output signals 711. When adequate timing margin exists for at least one of the extrapolated phase values, the enable signal should be enabled so that one of the separately registered versions of the input signals 701 is selected for output as the synchronized output signals 711. In sum, the variation-tolerant periodic synchronizer 700 selects a sampled version of the input signals 701 that corresponds to the safe extrapolated phase value as the output signals 711 that are synchronized to the Clk 201.

Figure 7B:
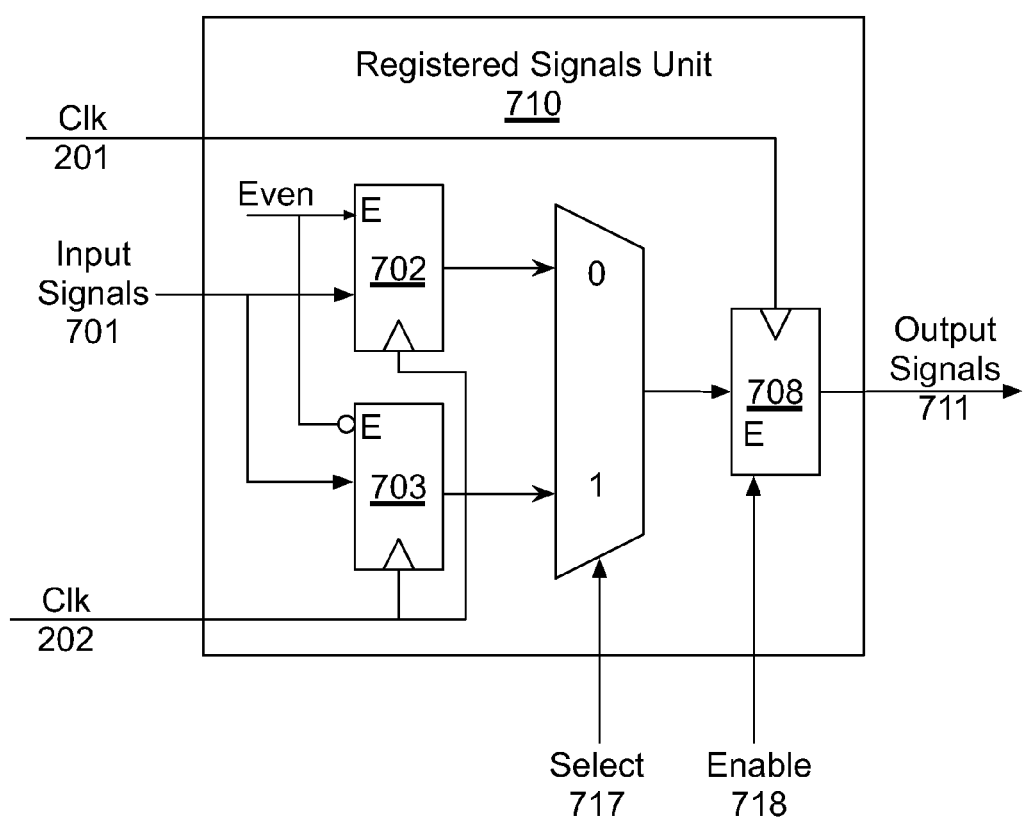
FIG. 7B illustrates the registered signals unit of FIG. 7A, in accordance with one embodiment.

FIG. 7B illustrates the registered signals unit 710 of FIG. 7A, in accordance with one embodiment. The registered signals unit 710 receives the input signals 701, the Clk 201, the Clk 202, a select 717, and an enable 718. The select 717 and enable 718 are generated by the selection unit 715 based on the series of extrapolated phase values. An even register 702 samples the input signals 701 at "even" transitions of the Clk 202 and an odd register 703 samples the input signals 701 at "odd" transitions of the Clk 202. The select 717 selects the output of either the even register 702 or the odd register 703. When the enable 718 is asserted, the selected output of registers 702 and 703 is sampled at the transition of the Clk 201 and output by a register 708 as the output signals 711. When the enable 718 is negated, the output signals 711 are maintained by the register 708 and not updated at the transition of the Clk 201.

Figure 7C:
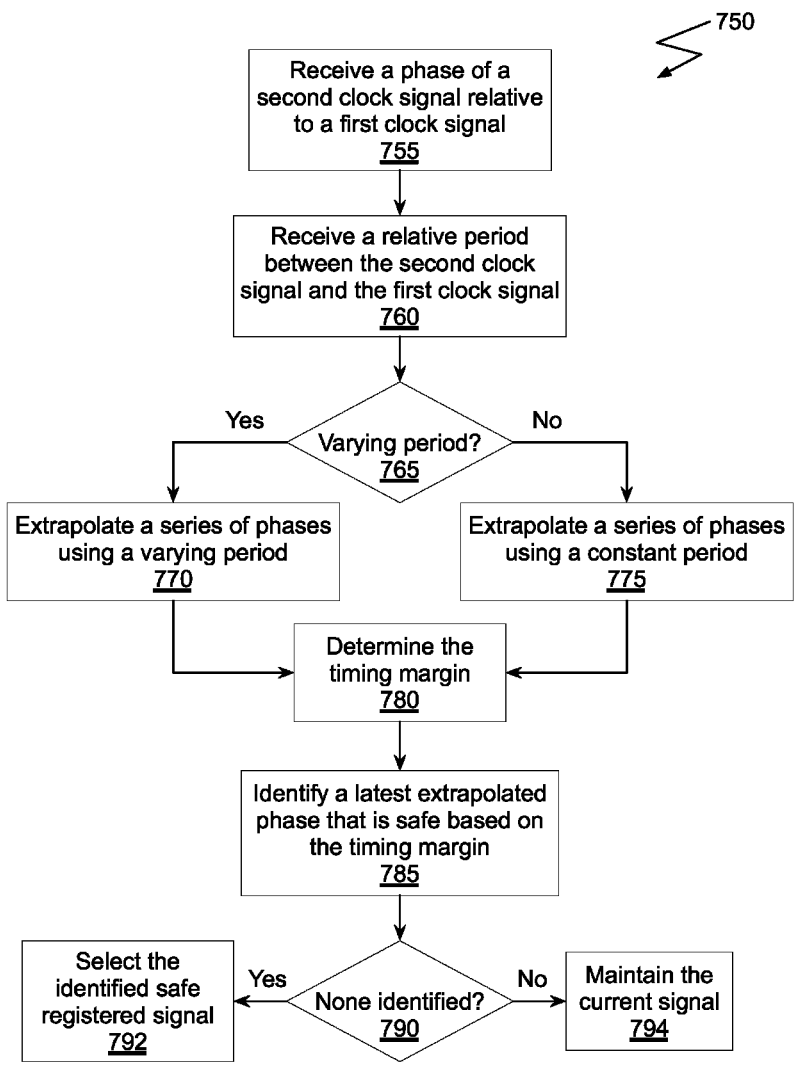
FIG. 7C illustrates another flowchart of a method for synchronizing signals, in accordance with one embodiment.

FIG. 7C illustrates another flowchart of a method 750 for synchronizing signals, in accordance with one embodiment. At step 755, a phase 203 value representing a phase of a second clock signal, e.g., the Clk 202, relative to a first clock signal, the Clk 201, is received by the variation-tolerant synchronizer 700. At step 760, a period 204 value representing a relative period between the second clock signal and the first clock signal is received by the variation-tolerant synchronizer 700. At step 765, the variation-tolerant synchronizer 700 determines if the period 204 value is varying, and, if so, a series of extrapolated phase values is computed using the phase 203 value, the period 204 value, and the varying period value, i.e., the slope of the period 204 value.

If at step 765, the variation-tolerant synchronizer 700 determines that the period 204 value is not varying, then, at step 775, a series of extrapolated phase values corresponding to a next transition of the first clock signal is computed based on the phase 203 value and the period 204 value. Note that for step 775 the slope of the period 204 value is zero, so steps 770 and 775 may be combined in one embodiment. At step 780, the variation-tolerant synchronizer 700 determines a timing margin based on the measurement error of the phase 203 value and the period 204 value and errors due to variations of the period 204 value due to voltage and/or current transients.

At step 785, at a transition of the first clock, the variation-tolerant synchronizer 700 identifies a latest extrapolated phase value in the series of extrapolated phase values that is also a safe extrapolated phase value based on the timing margin. When the extrapolated phase value that is closest to the next transition of the Clk 201 does not satisfy the timing margin, a next latest extrapolated phase value that satisfies the timing margin may be selected as the safe extrapolated phase value. At step 790, the variation-tolerant synchronizer 700 determines if a safe extrapolated phase value is identified, and, if not, at step 794, the variation-tolerant synchronizer 700 maintains the current output signals 711. Otherwise, at step 792, the variation-tolerant synchronizer 700 selects the signals output by the register corresponding to the safe extrapolated phase value to generate the output signals 711.

A Speculative Periodic Synchronizer

When the timing margin is applied, each extrapolated phase value becomes an extrapolated phase value interval or range, e.g., $[p_i-,p_{i+}]$, rather than a single value $p_i$. As the timing margins increase, the size of the extrapolated phase value intervals also increase and it may become more difficult to identify a safe extrapolated phase value for the next edge of the Clk 201. The latest extrapolated phase value interval may include the next transition of the Clk 201. The next latest extrapolated phase value interval may also include the next transition of the Clk 201. If a safe extrapolated phase value interval can be identified, the latency associated with the identified safe extrapolated phase value interval may be several cycles greater than the latency associated with the latest extrapolated phase value interval.

Figure 8A:
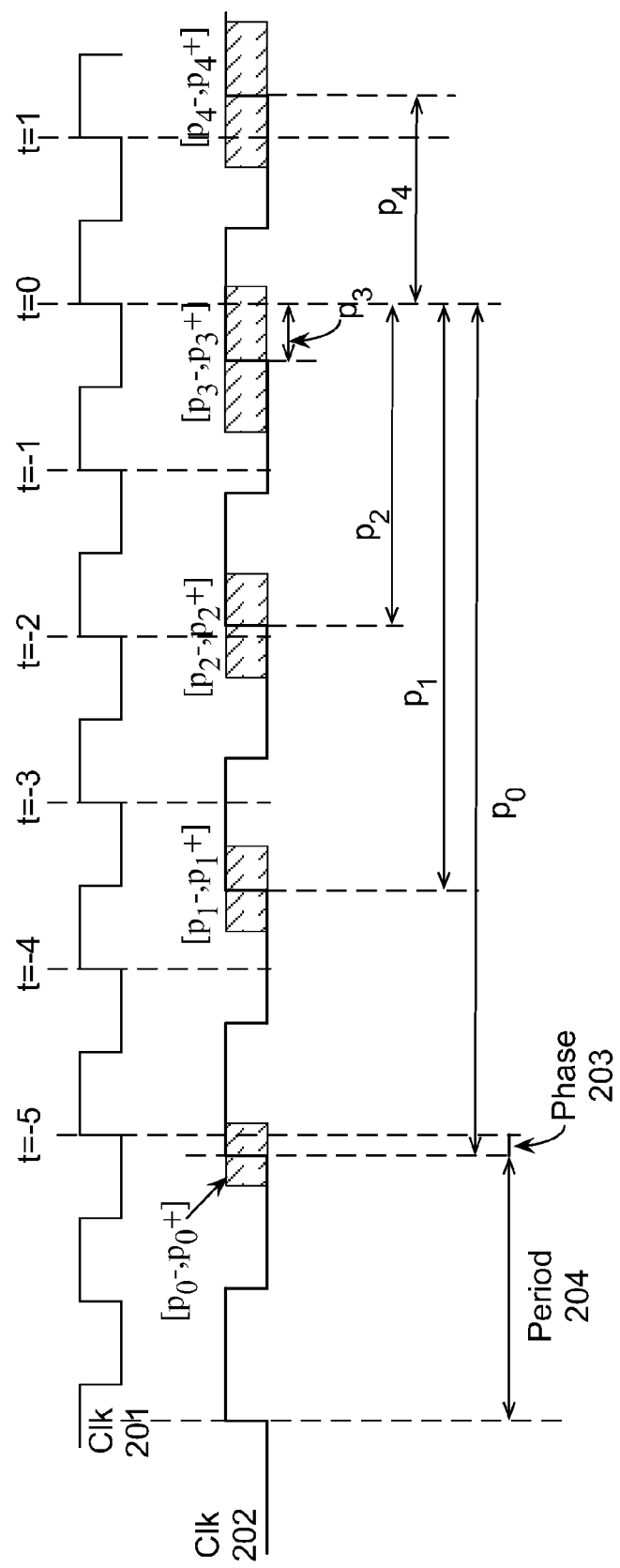
FIG. 8A illustrates waveforms of two clock signals and a series of extrapolated phase intervals, in accordance with one embodiment.

FIG. 8A illustrates waveforms of two clock signals, the Clk 201 and the Clk 202, and a series of extrapolated phase intervals $[p_i-,p_i+]$, in accordance with one embodiment. As i increases, the timing margin also increases, so that the range of each successive extrapolated phase value interval increases from $p_0$ to $p_4$. As shown in FIG. 8A, the pair of extrapolated phase values $p_3$ and $p_4$ straddle the next transition of the Clk 201 at t=0 and the extrapolated phase value $p_3$ is the latest extrapolated phase value. However, the extrapolated phase value interval $[p_3-,p_3+]$ for $p_3$ includes t=0. Therefore, the registered signal corresponding to the extrapolated phase value $p_3$ is not a safe extrapolated phase value because adequate timing margin is not provided. If t=0 were not included within the extrapolated phase value interval $[p_2-,p_3+]$ the extrapolated phase value $p_3$ would be a safe extrapolated phase value. For the example shown in FIG. 8A, the extrapolated phase value $p_2$ is the safe extrapolated phase value. The latency of a variation-tolerant synchronizer increases when the "older" registered signal corresponding to the extrapolated phase value $p_2$ is selected instead of the latest registered signal corresponding to the extrapolated phase value $p_3$.

As previously explained, the timing margin may be reduced by increasing the number of registers that sample the input signals for different transitions of the Clk 202. When the range of the extrapolated phase value intervals is very large the number of registers that sample the input signals may need to be increased to find an extrapolated phase value that is safe. Reducing the timing margin and range of the extrapolated phase value intervals reduces the latency of the variation-tolerant synchronizer. For example, a third register may be included in the registered signals unit 710 shown in FIG. 7B so that instead of sampling on even and odd cycles of the Clk 202, the input signals 701 are sampled every first, second, and third cycles of the Clk 202. Another technique that may be used to perform low-latency synchronization is to use a reduced timing margin, and speculatively synchronize the input signals using reduced extrapolated phase value intervals.

When operating speculatively, a speculative periodic synchronizer operates using reduced timing margins that are adequate to handle some, but not all, variation of clock periods of the Clk 201 and/or the Clk 202. For example, the reduced timing margins may be adequate to handle timing variation during normal operation but not sufficient to handle rare cases of extreme power supply variation that produce extreme variations in the clock periods of the Clk 201 and/or the Clk 202. The reduced timing margins cause the speculative periodic synchronizer to select sampled input signals having lower latency compared with a periodic synchronizer using non-reduced timing margins. However, because the reduced timing margins are speculative, the speculative periodic synchronizer checks each synchronization S cycles of the Clk 202 later, when the measured phase value is more precisely known. When the measured phase value differs from the extrapolated phase value such that the actual phase value does not satisfy the timing margin, i.e., is not safe, the synchronization resulting from the extrapolated phase value is recalled or cancelled. In one embodiment, any intervening synchronizations are also recalled. In an alternate embodiment, only the unsafe synchronization is recalled. Therefore, use of the speculative periodic synchronizer is limited to cases where the output signals generated by the speculative synchronization can be recalled several cycles after the output signals are generated. For example, when the result of speculative synchronizations initiates memory read operations the operations can be cancelled or the result of the read simply ignored and no persistent state is modified. However, the result of a speculative synchronization should not be used to initiate a memory write operation which may irreversibly modify persistent state.

Figure 8B:
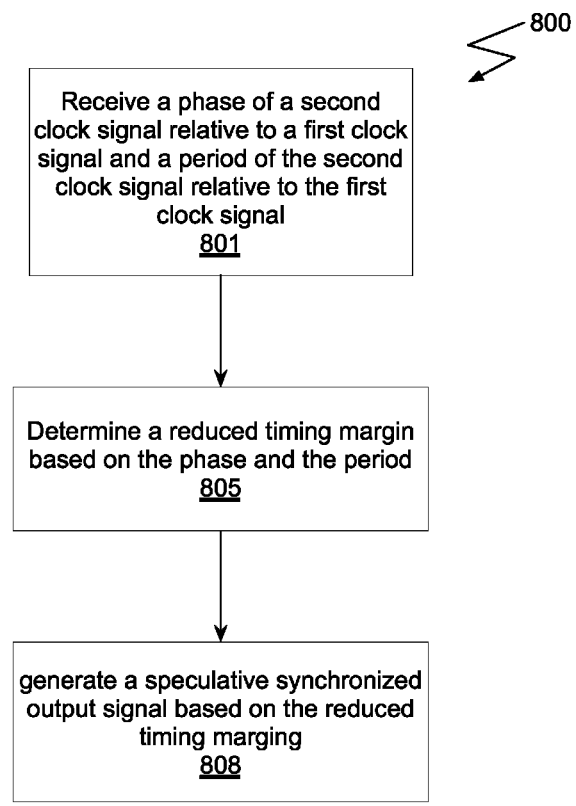
FIG. 8B illustrates a flowchart of a method for speculatively synchronizing signals, in accordance with one embodiment.

FIG. 8B illustrates a flowchart of a method 800 for speculatively synchronizing signals, in accordance with one embodiment. At step 801, a phase of a second clock signal relative to a first clock signal is received that was measured at least one cycle of the second clock signal earlier. At step 801, a period of the second clock signal relative to the first clock signal is received that was also measured at least one cycle of the second clock signal earlier. At step 805, reduced timing margin is determined based on the phase and the period. At step 808, a speculative synchronized output signal is generated based on the reduced timing margin. In one embodiment, a registered input signal is selected based on the reduced timing margin to generate the speculative synchronized output signal.

More illustrative information will now be set forth regarding various optional architectures and features of a speculative periodic synchronizer. It should be strongly noted that the following information is set forth for illustrative purposes and should not be construed as limiting in any manner. Any of the following features may be optionally incorporated with or without the exclusion of other features described.

The phase and the period values are measured for each transition of the Clk 202 and are updated at each cycle of the Clk 201. Retiming and synchronization within the high-resolution phase detector 200, 300, 400, and/or 500 introduce an S cycle delay in the availability of the measured phase 203 (303, 403, and/or 503) and the period 204 (304, 404, and/or 504) values that are output by the high-resolution phase detector 200 (300, 400, or 500). The delayed measurements of the phase 203 and period 204 values (from S cycles in the past) produces the series of extrapolated phase values that are predicted phases of the Clk 202 relative to the next transition of the Clk 201. In one embodiment, a derivative of the measured period 204 values may also be used to produce the series of extrapolated phase values.

When timing margins are applied to the series of extrapolated phase values, each $p_i$ is bounded by a lower extrapolated phase interval bound $p_i-$ and an upper extrapolated phase interval bound $p_i+$:

$$p_i \in [p_i-, p_i+] = [\theta - \Delta\theta + S - iT - 0.5(i^2+i)\Delta T, \theta + \Delta\theta + S - iT + 0.5(i^2+i)\Delta T],$$

where $\theta$ is the phase 203 value and T is the period 204 value. The timing margins account for measurement uncertainty and variations in the period 204 value. A $\Delta\theta$ variation is the uncertainty in the measured phase value. The $\Delta T$ variation has two separate components, a systematic component $\Delta T_S$ and a measurement component $\Delta T_M$, such that $\Delta T = \Delta T_S + \Delta T_M$. $\Delta T_S$ is the variation in the period value due to a variation in the period of the Clk 201 and/or the Clk 202 and $\Delta T_M$ is the uncertainty of the measured period value.

When two registers are used to sample the input signals (odd/even), the series of extrapolated phase value intervals is searched to find the pair of extrapolated phase value intervals spaced by two that straddles t=0. In other words, the series of extrapolated phase value intervals is searched to find the largest i that satisfies the following constraint $$p_i+ < 0 \leq p_{i+2}-.$$

The largest i that satisfies the constraint corresponds to an even or odd clock cycle and the corresponding even or odd register is selected to generate the synchronized output signal. When three registers are used to sample the input signals (e.g., first/second/third), the series of extrapolated phase value intervals is searched to find the pair of extrapolated phase value intervals spaced by three that straddles t=0. When the number of registers that sample the input signals is increased, the span between the extrapolated phase value intervals being searched increases (e.g., with three registers i is paired with i+3), and identification of a pair of extrapolated phase value intervals that satisfies the constraint is more likely.

As previously explained, when one or more of the extrapolated phase value intervals resulting from $\Delta T$ and/or $\Delta\theta$ include the transition of the Clk 201 at t=0, it may not be possible to identify a pair of extrapolated phase value intervals that satisfies the constraint. When a pair of extrapolated phase value intervals is not identified that satisfies the constraint, the synchronized output signal is not updated and the latency incurred by synchronization effectively increases. Speculative synchronization may be used to reduce the latency incurred for synchronization during most of the clock cycles by using reduced timing margins. For the clock cycles when speculative synchronization cannot be used reliably, i.e., when the sampled input signal may be metastable, the speculatively synchronized signals may be recalled (or cancelled) and then synchronized based on non-reduced timing margins, as described further herein.

In the previous analysis the variation in period T is characterized as a slope $\Delta T$. Over the S cycle duration from when the period is measured to when the period is used to compute the series of extrapolated phase values, the period can change by a total of $S\Delta T$. An absolute bound $\delta T$ may be applied as the variation of T, allowing the entire $\delta T$ variation to take place in a single cycle. In this case, the formula for the lower extrapolated phase interval bound $p_i-$ and the upper extrapolated phase interval bound $p_i+$ becomes:

$$p_i \in [p_i-, p_i+] = [\theta - \Delta\theta + S - iT - i\delta T, \theta + \Delta\theta + S - iT + i\delta T].$$

A smaller value for ΔT or δT may be used to compute a reduced timing margin that is applied to the series of extrapolated phase value intervals to generate the speculative series of extrapolated phase value intervals. The latest safe speculative extrapolated phase value interval is identified to generate a speculatively synchronized output signal and output signals that are speculatively synchronized are marked as being speculative. Downstream logic receiving the speculatively synchronized output signals should avoid performing irreversible operations that depend on the speculatively synchronized output signals. After the speculatively synchronized output signals are determined to be safe (and will not be recalled) irreversible operations may be performed using the speculatively synchronized output signals.

The actual (measured) phase value that is received as the phase value 203 S cycles later is compared with the earlier identified speculative extrapolated phase value interval to determine whether the earlier identified speculative extrapolated phase value interval was safe. If the synchronization is performed in cycle k, then on cycle k+S the high-resolution phase detector 200, 300, 400, or 500 outputs the measured phase as the phase 203 value, $\delta_k$ in cycle k. One cycle later, on cycle k+S+1, the high-resolution phase detector 200, 300, 400, or 500 outputs $\theta_{k+1}$. The synchronization in cycle k was safe $$\theta_k > \Delta\theta + t_m \text{ and } \theta_{k+1} > 1 \text{ or } \theta_{k+1} < 1 - \Delta\theta - t_m.$$

where $t_m$ =is the timing margin.

If after taking measurements $\theta_k$ and $\theta_{k+1}$ the synchronization is found to be safe a validate signal is sent to mark the speculatively synchronized output signals as non-speculative. On the other hand, if the synchronization is found to be unsafe, a recall signal is sent to recall the speculatively synchronized output signals. Depending on the structure of the speculative periodic synchronizer, non-speculatively synchronized output signals that are generated based on a series of extrapolated phase value intervals may then be generated with greater latency.

Figure 8C:
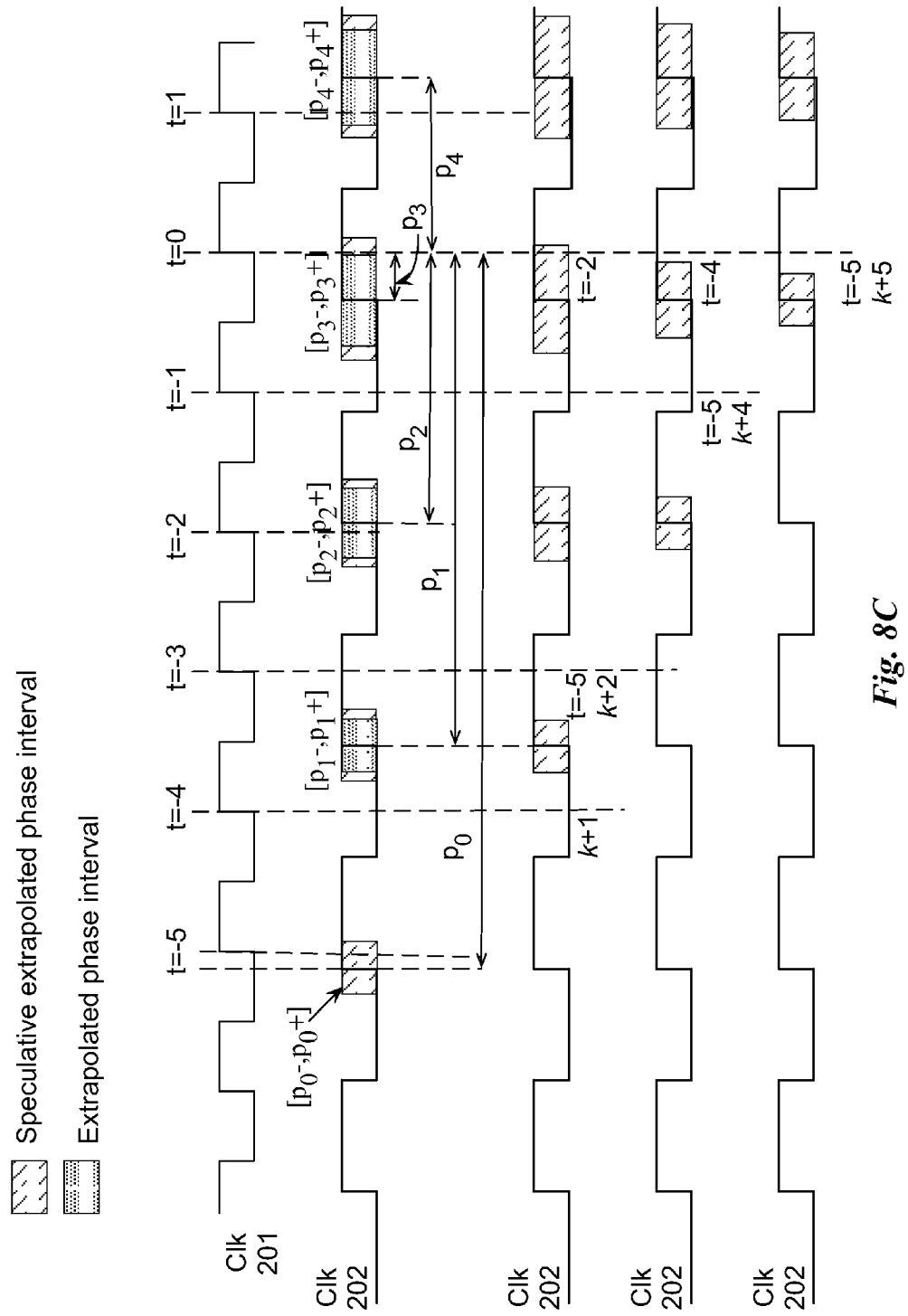
FIG. 8C illustrates waveforms of two clock signals and a speculative series of extrapolated phase intervals, in accordance with one embodiment.

In an alternate embodiment the synchronizer need not wait until cycle k+S to validate the speculative synchronization. Each cycle after the original synchronization for which a new phase measurement is available the full-margin phase interval associated with the synchronization is narrowed. FIG. 8C illustrates waveforms of the clock signals 201 and 202 and a speculative series of extrapolated phase intervals, in accordance with one embodiment. The speculative series of extrapolated phase intervals is generated using the series of extrapolated phase intervals shown in FIG. 8A and reduced timing margins. As shown in FIG. 8A, the phase value $p_2$ is the latest extrapolated phase value having an extrapolated phase value interval that does not include the transition of the Clk 202 at t=0. Therefore, the extrapolated phase value $p_2$ would be selected as the safe phase value. As shown in FIG. 8C, a reduced timing margin is applied and the extrapolated phase value interval [$p_3$-,$p_3$+] shown in FIG. 8A is reduced to generate the speculative extrapolated phase value interval [$p_3$-,$p_3$+] shown in FIG. 8C. As shown in FIG. 8C, the transition of the Clk 202 at t=-0 occurs after and is not included within the speculative extrapolated phase value interval. Therefore, the extrapolated phase value $p_3$ is selected for the speculative synchronization.

After a cycle of the Clk 201 (at k+1), the measured phase value $p_1$ is not yet known because the rising edge of the Clk 202 occurs after t=-4. After another cycle of the Clk 201 (at k+2), the measured the phase value $p_1$ is known and the corresponding interval [$p_1$-,$p_1$+] narrowed such that $p_1$-=$p_1$-Δθ and $p_1$+=$p_1$+Δθ which equals the (non-speculative) extrapolated phase value interval for $p_1$. If the original synchronization had identified the phase $p_1$ as the phase value that was used for the speculative synchronization and the narrowed interval [$p_1$-,$p_1$+] occurs before t=0 and does not include t=0 (now t=-2), then the synchronization may be marked non-speculative. However, $p_3$ was identified as the phase value for the speculative synchronization and the measured phase value $p_3$ is not yet known.

When the speculative extrapolated phase value interval for $p_1$ is narrowed to equal the extrapolated phase value interval for $p_1$, the other intervals in the series of extrapolated phase value intervals may also be updated and narrowed. Specifically, after two cycles of the Clk 201 have transpired at t=2 the extrapolated phase value interval of $p_3$ is computed using i=2 instead of i=3, as was used at t=0. If the updated interval [$p_3$-,$p_3$+] occurs before and does not include t=0 (now t=-2), then the speculative synchronization may be marked non-speculative.

After four cycles of the Clk 201 have transpired at t=4 (k+4) and the extrapolated phase value interval of $p_3$ is computed using i=1 instead of i=3. If the updated interval [$p_3$-, $p_3$+] does not include t=0 (now t=-4), as shown in FIG. 8C, then the speculative synchronization may be marked non-speculative. If the speculative synchronization could not be marked non-speculative at k+4, then, after five cycles of the Clk 201 the measured phase value $p_3$ taken at t=0 is known and the extrapolated phase value interval [$p_3$-,$p_3$+] is updated to [$p_3$-Δθ,$p_3$+Δθ]. If the updated interval occurred before and did include t=0 (now t=-5), then the speculative synchronization would be recalled. A speculative synchronization may be marked as non-speculative as soon as cycle k+1. A speculative synchronization may not be recalled until k=S.

Figure 8D:
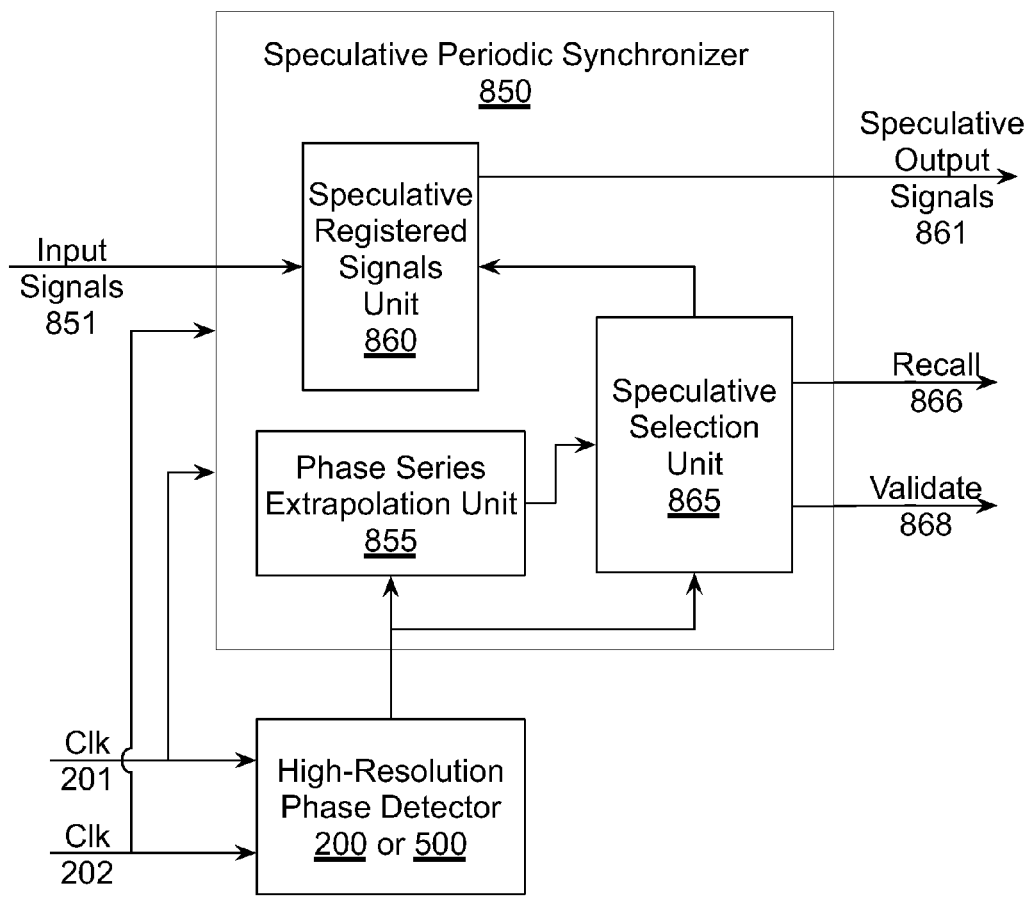
FIG. 8D illustrates a speculative periodic synchronizer, in accordance with one embodiment.

FIG. 8D illustrates a speculative periodic synchronizer 850, in accordance with one embodiment. The speculative periodic synchronizer 850 is coupled to a high-resolution phase detector 200, 300, 400, or 500 that generates the phase 203 value and the period 204 value. The speculative periodic synchronizer 850 includes a phase series extrapolation unit 855, a speculative registered signals unit 860, and a speculative selection unit 865. The phase series extrapolation unit 855 receives the phase 203 value and the period 204 value S cycles after the phase and period are measured and generates a series of extrapolated phase values. The speculative selection unit 865 receives the phase 203 value and the series of extrapolated phase values and applies a reduced timing margin to compute a speculative series of extrapolated phase value intervals, from which a latest speculative extrapolated phase value interval that does not include the Clk 201 transition at t=-0 is identified. The speculative selection unit 865 selects the registered input signals 851 corresponding to the identified latest speculative extrapolated phase value interval to generate the speculatively synchronized output signals, speculative output signals 861. When the speculative selection unit 865 does not identify a speculative extrapolated phase value interval, the speculative output signals 861 are not updated. The speculative selection unit also produces an indication as to whether the output signal generated is speculative or not, e.g., a validate signal 868.

The speculative selection unit 865 tracks the speculative output signals 861 that are output and generates a recall signal 866 or a validate signal 868, as needed. The recall signal 866 is used to recall speculative output signals 861 that were previously output based on the corresponding measured phase 203 value that is received by the speculative selection unit 865 S cycles later. Recalled speculative output signals 861 are discarded by the receiving logic. The validate signal 868 is used to indicate that a previously speculative output signal has been determined to be non-speculative and hence can be safely used in an irreversible operation. The validate signal 868 may be asserted as late as S cycles after speculative output signals 861 are generated. The speculative registered signals unit 860 may include two or more registers, where each register is configured to sample the input signals 851 on a different transition of the Clk 202.

Figure 8E:
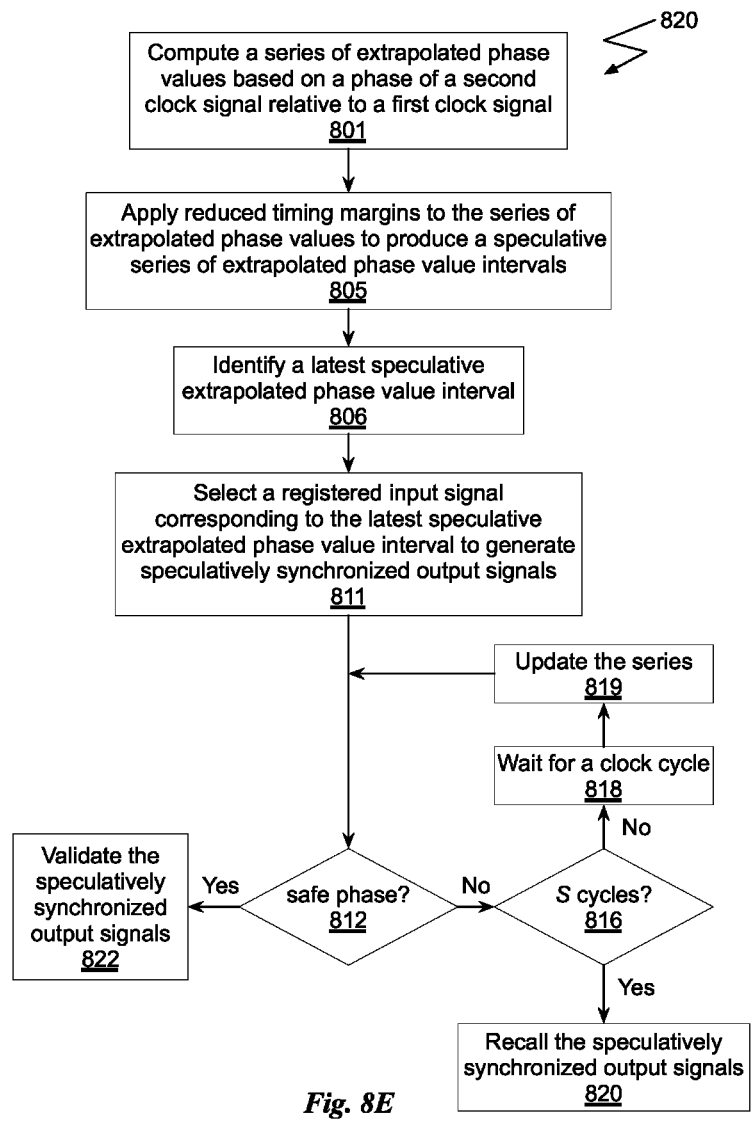
FIG. 8E illustrates another flowchart of a method for speculatively synchronizing signals, in accordance with one embodiment.

FIG. 8E illustrates another flowchart of a method 820 for speculatively synchronizing signals, in accordance with one embodiment. At step 801, the phase series extrapolation unit 855 computes a series of extrapolated phase values based on the phase 203 value and the period 204 value provided by the high-resolution phase detector 200, 300, 400, or 500. At step 805, the speculative selection unit 865 applies a reduced timing margin, e.g., a reduced variation in $\Delta T$ or $\delta T$ to the series of extrapolated phase values to produce a speculative series of extrapolated phase value intervals. At step 806, the speculative selection unit 865 identifies a latest speculative extrapolated phase value interval that does not include a transition of the Clk 201 at t=0. At step 811, the speculative selection unit 865 configures the speculative registered signals unit 860 to select a registered input signal corresponding to the latest speculative extrapolated phase value interval to generate the speculative output signals 861. If the speculative output signals 861 are not speculative, i.e., an extrapolated phase value interval is safe without the reduced timing margins then the validate 868 signal is asserted.

If, at step 812, the speculative selection unit 865 determines that the latest speculative extrapolated phase value interval was safe, then at step 822, the validate 868 signal is asserted and synchronization of the input signals 851 continues. Otherwise, at step 816, the speculative selection unit 865 determines if S cycles of the Clk 201 have occurred since the speculative output signals 861 were generated, and, if so, at step 820, the speculative selection unit 865 recalls the speculative output signals 861 generated S cycles earlier.

Otherwise, at step 818, the speculative selection unit 865 waits for another cycle of the Clk 201 to possibly obtain a phase 203 value corresponding to an extrapolated phase value. At the next cycle of the Clk 201, the series of extrapolated phase value intervals is updated when a new phase 203 value is known. As previously explained in conjunction with FIG. 8C, updating the series of extrapolated phase value intervals when a new phase 203 is received narrows the phase value intervals. At step 812, the narrowed extrapolated phase value intervals are checked to see if the speculative synchronization can be marked as non-speculative. Note, that the speculative selection unit 865 may be configured to generate the speculative output signals 861 while simultaneously performing one or more of steps 812, 816, 818, 822, and 820.

In one embodiment, the speculative periodic synchronizer 850 may be configured to perform both an aggressive synchronization and a safe synchronization. The safe synchronization has a higher latency compared with the aggressive synchronization so that aggressively synchronized signals appear one or more cycles ahead of the signals that are safely synchronized. However, the latency incurred when a recall is needed is reduced because the safely synchronized signal can replace the recalled aggressively synchronized signals within a small number of clock cycles. Output signals that are aggressively synchronized are labeled as speculative and irreversible operations should not be performed using the speculative output signals until the output signals are marked as non-speculative (validated). When a safely synchronized output signal is available that corresponds to a previously output speculative output signal, the safely synchronized output signal is compared to the previously output speculative output signal. If the signals match, the speculative output signal is marked non-speculative and the safely synchronized output signal is discarded. If the signals do not match, then previously output speculative output signal is recalled and replaced by the safely synchronized output signal.

Replacing a recalled speculative output signal 811 may require re-doing reversible work that was done from the time the speculative output signal 811 was received from the speculative periodic synchronizer 850 until the safely synchronized output signal is received from the speculative periodic synchronizer 850. For example in a pipelined circuit that receives the speculative output signal 811, several pipeline stages may need to be flushed and the sequence of inputs, starting with the safely synchronized output signal, may need to be replayed.

Figure 9A:
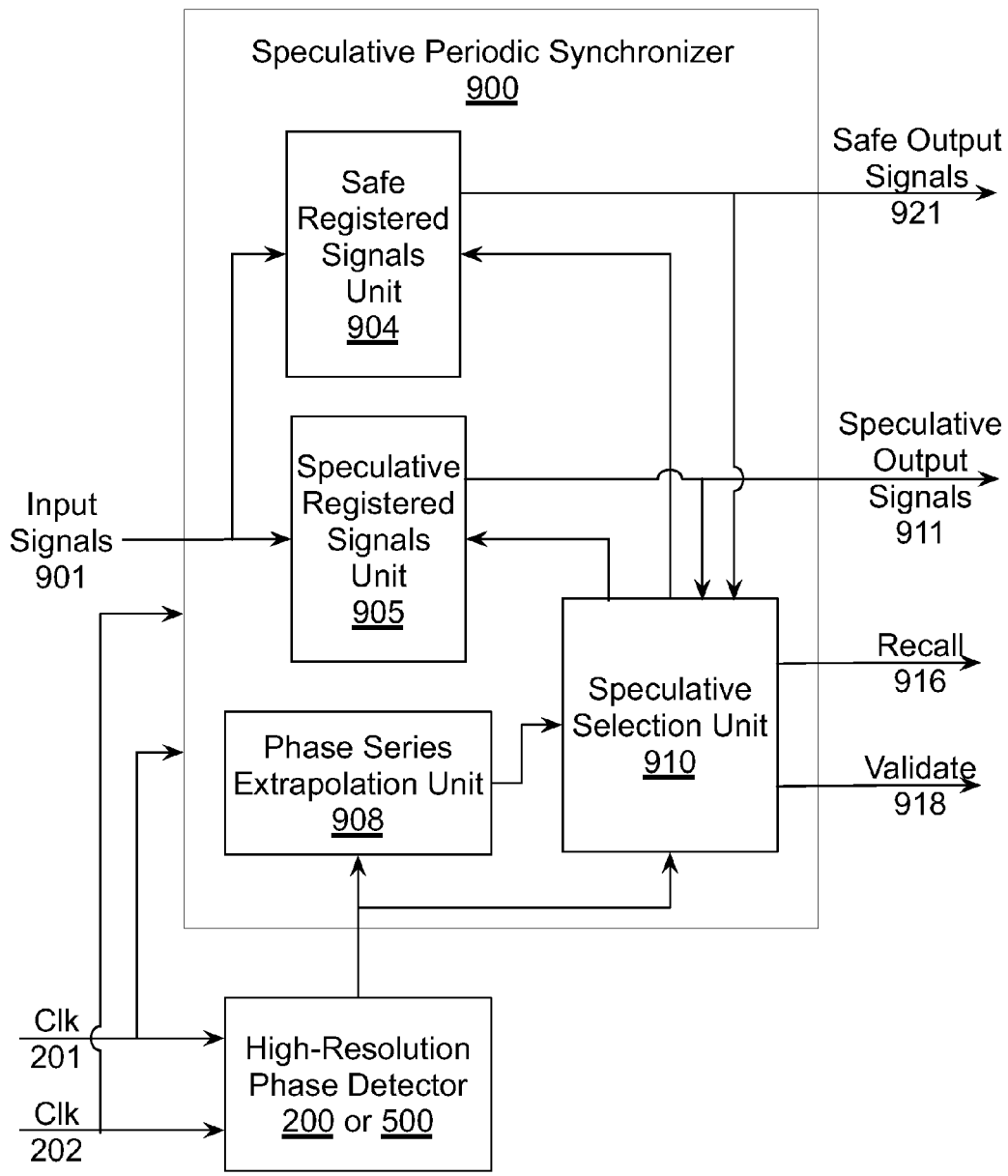
FIG. 9A illustrates another speculative periodic synchronizer, in accordance with one embodiment.

FIG. 9A illustrates a speculative periodic synchronizer 900, in accordance with one embodiment. The speculative periodic synchronizer 900 is coupled to a high-resolution phase detector 200, 300, 400, or 500 that generates the phase 203 value and the period 204 value. The speculative periodic synchronizer 900 includes a phase series extrapolation unit 908, a safe registered signals unit 904, a speculative registered signals unit 905, and a speculative selection unit 910. The phase series extrapolation unit 908 receives the phase 203 value and the period 204 value S cycles after the phase and period are measured and generates a series of extrapolated phase values. The speculative selection unit 910 receives the phase 203 value and the series of extrapolated phase values and applies a reduced timing margin to compute a speculative series of extrapolated phase value intervals, from which a latest speculative extrapolated phase value interval is identified that does not includes a transition of the Clk 201 at t=0. The speculative selection unit 910 configures the speculative registered signals unit 905 to select the registered input signals 901 corresponding to the identified latest speculative extrapolated phase value interval to generate the speculative output signals 911. When the speculative selection unit 910 does not identify a safe speculative extrapolated phase value interval, the speculative output signals 911 are not updated and the validate signal 928 is asserted.

The speculative selection unit 910 also applies a non-reduced timing margin to the series of extrapolated phase values to compute a safe series of extrapolated phase value intervals, from which a latest safe extrapolated phase value interval is identified. The speculative selection unit 910 configures the safe registered signals unit 904 to select the registered input signals 901 corresponding to the latest extrapolated phase value interval to generate the safe output signals 921. When the speculative selection unit 910 does not identify an extrapolated phase value interval, the safe output signals 921 are not updated.

The speculative selection unit 910 tracks the speculative output signals 911 that are output and generates a recall signal 906, as needed, to recall previously output speculative output signals 911 when the previously output speculative output signals 911 do not match the corresponding safe output signals 921 that are received by the speculative selection unit 910 one or more cycles later. Recalled speculative output signals 911 are replaced with the corresponding safe output signals 921 by the receiving logic. The validate signal 928 may be asserted up to S cycles after speculative output signals 911 are generated. The safe registered signals unit 904 and the speculative registered signals unit 905 may include two or more registers, where each register is configured to sample the input signals 901 on a different transition of the Clk 202. In one embodiment, at least a portion of the two or more registers is shared between the safe registered signals unit 904 and the speculative registered signals unit 905.

Figure 9B:
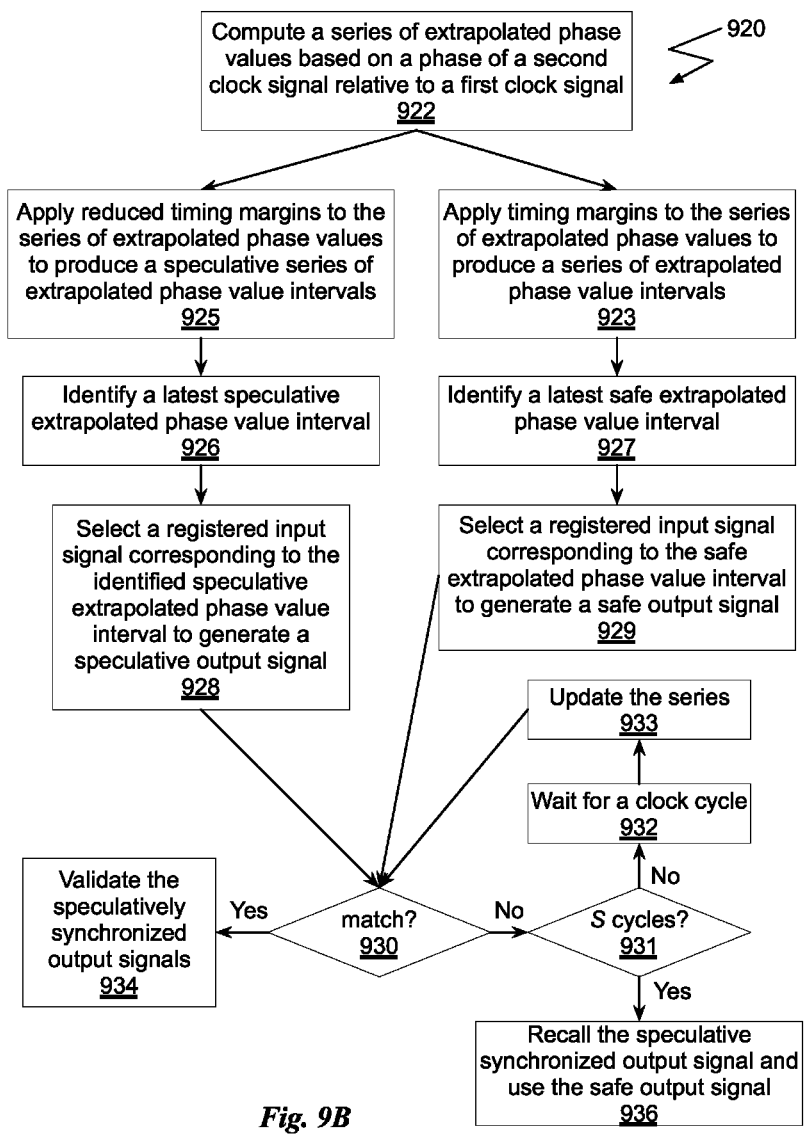
FIG. 9B illustrates another flowchart of a method for speculatively synchronizing signals, in accordance with one embodiment.

FIG. 9B illustrates a flowchart 920 of another method for speculatively synchronizing signals, in accordance with one embodiment. At step 922, the phase series extrapolation unit 908 computes a series of extrapolated phase values based on the phase 203 value and the period 204 value provided by the high-resolution phase detector 200, 300, 400, or 500. At step 925, the speculative selection unit 910 applies a reduced timing margin, e.g., a reduced variation in ΔT or δT to the series of extrapolated phase values to produce a speculative series of extrapolated phase value intervals. At step 926, the speculative selection unit 910 identifies a latest speculative extrapolated phase value interval. At step 928, the speculative selection unit 910 configures the speculative registered signals unit 905 to select a registered input signal corresponding to the identified latest speculative extrapolated phase value interval to generate speculative output signals 911.

At step 923, the speculative selection unit 910 applies a non-reduced timing margin to the series of extrapolated phase values to produce a (safe) series of extrapolated phase value intervals. At step 927, the speculative selection unit 910 identifies a latest safe extrapolated phase value interval. At step 929, the speculative selection unit 910 configures the safe registered signals unit 904 to select a registered input signal corresponding to the latest safe extrapolated phase value interval to generate safe output signals 921. One or more of steps 923, 927, and 929 may be performed in parallel or in series with steps 925, 926, and 928.

At step 930, the speculative selection unit 910 determines if the safe output signals 921 match the corresponding previously output speculative output signals 911. If, at step 930, the speculative selection unit 910 determines that the safe output signals 921 match the corresponding previously output speculative output signals 911, then the previously output speculative output signals 911 are safe, and, at step 934, the validate signal 918 is asserted and synchronization of the input signals 851 continues. In other words, the previously output speculative output signals 911 are marked as non-speculative. Otherwise, if the safe output signals 921 do not match the corresponding previously output speculative output signals 911 at step 931, the speculative selection unit 910 determines if S cycles of the Clk 201 have occurred since the speculative output signals 911 were generated, and, if so, at step 936, the speculative selection unit 910 recalls the speculative output signals 911 corresponding to the safe output signals 921 and the speculative output signals 911 are replaced with the safe output signals 921.

Otherwise, at step 932, the speculative selection unit 900 waits for another cycle of the Clk 201 to possibly obtain a phase 203 value corresponding to an extrapolated phase value. At the next cycle of the Clk 201, the series of extrapolated phase value intervals is updated when a new phase 203 value is known. As previously explained in conjunction with FIG. 8C, updating the series of extrapolated phase value intervals when a new phase 203 is received narrows the phase value intervals. At step 930, the narrowed extrapolated phase value intervals are compared with the corresponding previously output speculative output signals 911 to see if the speculative synchronization can be marked as non-speculative. Note, that the speculative selection unit 910 may be configured to output speculative output signals 911 while simultaneously performing one or more of steps 930, 931, 932, 934, and 936.

In a common use case, the speculative periodic synchronizer 950 may be used to pass first-in first-out (FIFO) buffer head and tail pointers between the clock domains associated with the Clk 201 and the Clk 202. In contrast with conventional synchronizers, the head and tail pointers do not need to be Gray-coded when the speculative periodic synchronizer 950 is used. Non-speculative or safely synchronized pointer values should be used to check for the FIFO full condition—to avoid overwrites. Speculatively synchronized pointer values may be used to check for FIFO empty conditions—to reduce latency. When the FIFO goes from the empty to the non-empty state, speculatively synchronized head and tail pointer values are generated by the speculative periodic synchronizer 950 with low latency. Safely synchronized head and tail pointer values are generated by the speculative periodic synchronizer 950 in the same cycle or one or more cycles later. Note that the speculative periodic synchronizer 950 is configured to provide both the speculatively synchronized head and tail pointer values and the safely synchronized head and tail pointer values, e.g., speculative output signals 911 and safe output signals 921.

Compared with a conventional FIFO, the FIFO synchronizer includes some duplicated circuitry in addition to speculative periodic synchronizers 950 to synchronize the head and tail pointer values. In particular, the pointer registers and pointer comparison logic is duplicated. Importantly, the storage elements within the FIFO, which are the bulk of the cost of the FIFO synchronizer, are not duplicated.

In some circumstances times during which the clock signals Clk 201 and Clk 202 are stable may be detected, and other times during which the period value T may vary as a result of variations in the Clk 201 and/or the Clk 202 signal may be detected. For example, in a system using dynamic voltage and frequency scaling (DVFS) the period value is stable for long durations of time and then varies smoothly for a short interval. In another circumstance, the Clk 201 and/or the Clk 202 signal varies in frequency to track variations in supply voltage, and a variation in the period value, T can be anticipated by use of a voltage sensor or through correlation with a logical event that is known to cause voltage variation.

In any circumstance where changes between a stable period value and a variable period value can be detected or anticipated, different values may be used for the bounds on period variation ΔT or δT to improve synchronization performance. When the period 204 value is stable, a low value of ΔT or δT may be used to reduce the latency incurred during synchronization. When the period 204 value is variable, a higher value of ΔT or δT may be used giving higher latency but safe synchronization. If different degrees of variation in the period 204 value and/or the frequency of either the Clk 201 or the Clk 202 signal can be detected (by a voltage sensor or by correlation) different values of ΔT or δT can be selected depending on the amount of variation detected. More specifically, different values of ΔT or δT may be selected by the speculative periodic synchronization unit 850 and/or 900 and used to compute the reduced timing margins.

Figure 9C:
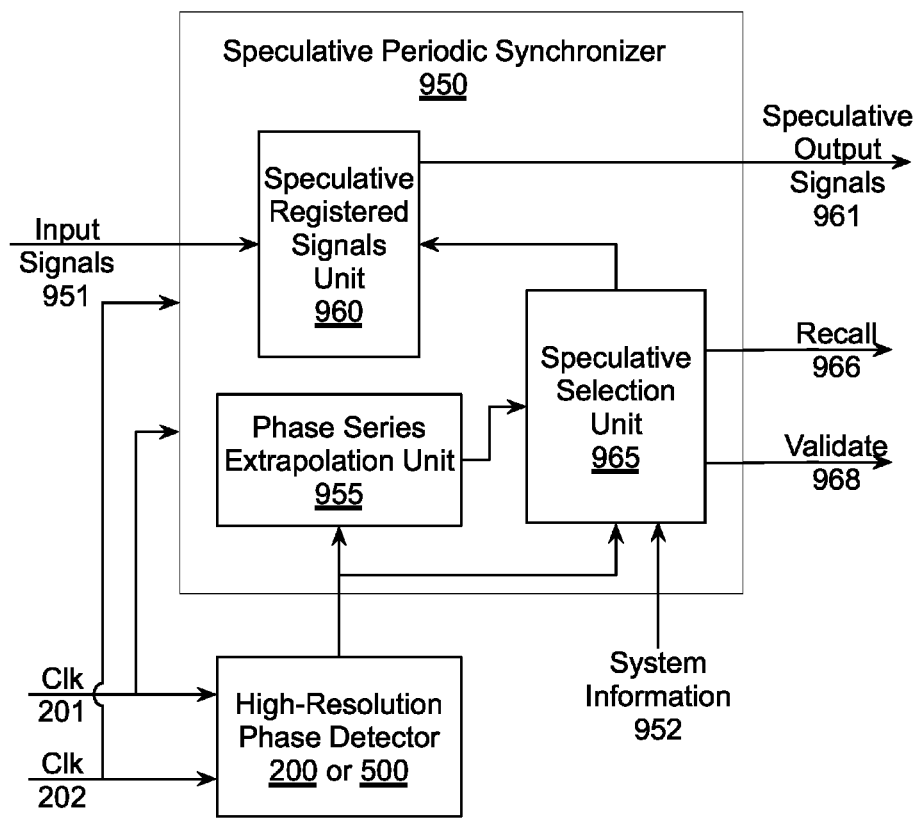
FIG. 9C illustrates another speculative periodic synchronizer, in accordance with one embodiment.

FIG. 9C illustrates a speculative periodic synchronizer 950, in accordance with one embodiment. The speculative periodic synchronizer 950 is coupled to a high-resolution phase detector 200, 300, 400, or 500 that generates the phase 203 value and the period 204 value. The speculative periodic synchronizer 950 includes a phase series extrapolation unit 955, a speculative registered signals unit 960, and a speculative selection unit 965. The phase series extrapolation unit 955 receives the phase 203 value and the period 204 value S cycles after the phase and period are measured and generates a series of extrapolated phase values.

The speculative selection unit 965 receives system information 952 that indicates whether the frequency of the Clk 201 and/or the Clk 202 is stable or varying. In one embodiment, the system information 952 indicates an amount by which the frequency of the Clk 201 and/or the Clk 202 may vary. The speculative selection unit 965 may use the system information 952 to compute the reduced timing margin. In one embodiment, when the system information 952 indicates high variations in the Clk 201 and/or the Clk 202 the speculative selection unit 965 may use a non-reduced timing margin. Note that the speculative periodic synchronizer 900 may also be adapted to receive the system information 952 and compute the reduced timing margin based on the system information 952.

The speculative selection unit 965 receives the phase 203 value and the series of extrapolated phase values and applies the computed reduced timing margin to compute a speculative series of extrapolated phase value intervals, from which a latest speculative extrapolated phase value interval is identified that does not includes a transition of the Clk 201 at t=0. The speculative selection unit 965 configures the speculative registered signals unit 960 to select the registered input signals 951 corresponding to the identified latest speculative extrapolated phase value interval to generate the speculative output signals 961. When the speculative selection unit 965 does not identify a speculative extrapolated phase value interval, the speculative output signals 961 are not updated and the validate signal 928.

The speculative selection unit 965 tracks the speculative output signals 961 that are output and generates a recall signal 966, as needed, to recall speculative output signals 961 that were previously output based on the corresponding phase 203 value that is received by the speculative selection unit 965 S cycles after the phase value is measured. Recalled speculative output signals 961 are discarded by the receiving logic. The validate signal 968 may be asserted up to S cycles after speculative output signals 961 are generated. The speculative registered signals unit 960 may include two or more registers, where each register is configured to sample the input signals 951 on a different transition of the Clk 202.

Figure 9D:
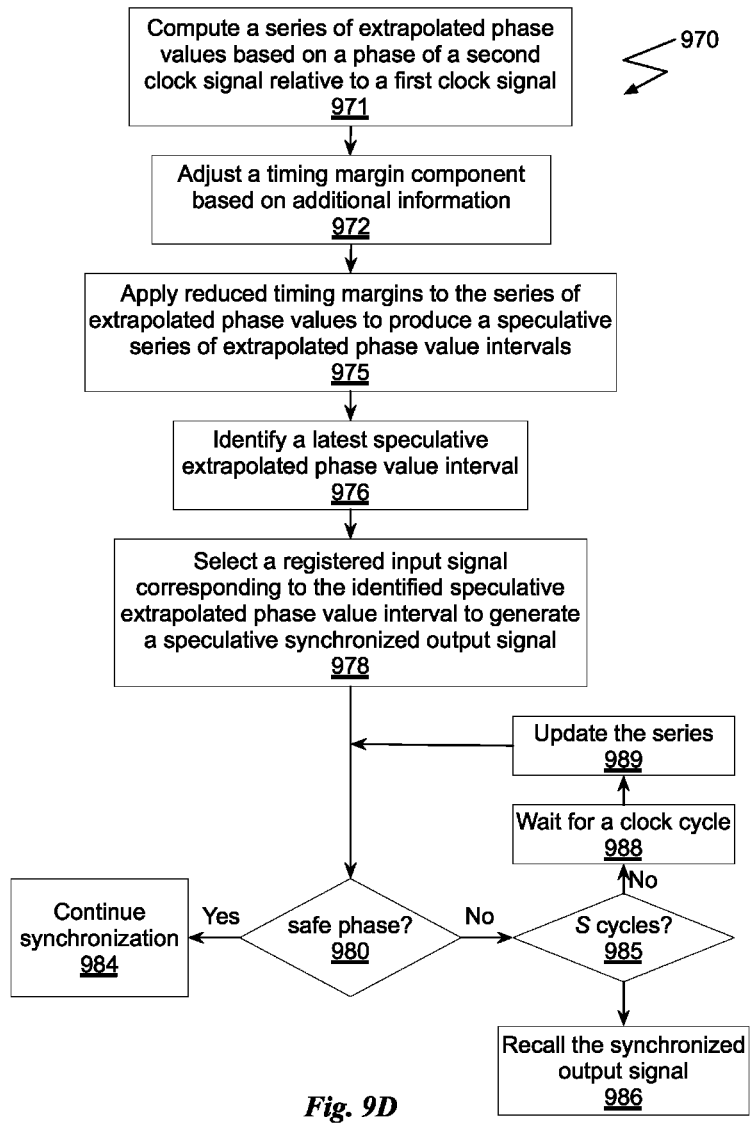
FIG. 9D illustrates another flowchart of a method for speculatively synchronizing signals, in accordance with one embodiment.

FIG. 9D illustrates another flowchart of a method 970 for speculatively synchronizing signals, in accordance with one embodiment. At step 971, the phase series extrapolation unit 955 computes a series of extrapolated phase values based on the phase 203 value and the period 204 value provided by the high-resolution phase detector 200, 300, 400, or 500. At step 972, the speculative selection unit 965 adjusts a timing margin component, e.g., $\Delta Ts$ or $\delta T$, based on the system information 952 and computes a reduced timing margin.

At step 975, the speculative selection unit 965 applies the computed reduced timing margin to the series of extrapolated phase values to produce a speculative series of extrapolated phase value intervals. At step 976, the speculative selection unit 965 identifies a latest speculative extrapolated phase value interval that does not include a transition of the Clk 201 at t=0. At step 978, the speculative selection unit 965 configures the speculative registered signals unit 960 to select a registered input signal corresponding to the latest speculative extrapolated phase value interval to generate the speculative output signals 961.

At step 980, the speculative selection unit 965 determines if the identified latest speculative extrapolated phase value interval was safe. If, at step 980, the speculative selection unit 965 determines that the identified latest speculative extrapolated phase value interval was safe, then at step 984, the validate signal 968 is asserted and synchronization of the input signals 951 continues. Otherwise, at step 985, the speculative selection unit 965 determines if S cycles of the Clk 201 have occurred since the speculative output signals 961 were generated, and, if so, at step 986, the speculative selection unit 965 recalls the speculative output signals 961 generated S cycles earlier.

If, at step 985, S cycles of the Clk 201 have not occurred since the speculative output signals 961 were generated, then at step 988, the speculative selection unit 965 waits for another cycle of the Clk 201 to possibly obtain a phase 203 value corresponding to an extrapolated phase value. At the next cycle of the Clk 201, the series of extrapolated phase value intervals is updated when a new phase 203 value is known. As previously explained in conjunction with FIG. 8C, updating the series of extrapolated phase value intervals when a new phase 203 is received narrows the phase value intervals. At step 989, the narrowed extrapolated phase value intervals are checked to see if the speculative synchronization can be marked as non-speculative. Note, that the speculative selection unit 965 may be configured to generate the speculative output signals 961 while simultaneously performing one or more of steps 980, 984, 985, 986, and 988.

Figure 10:
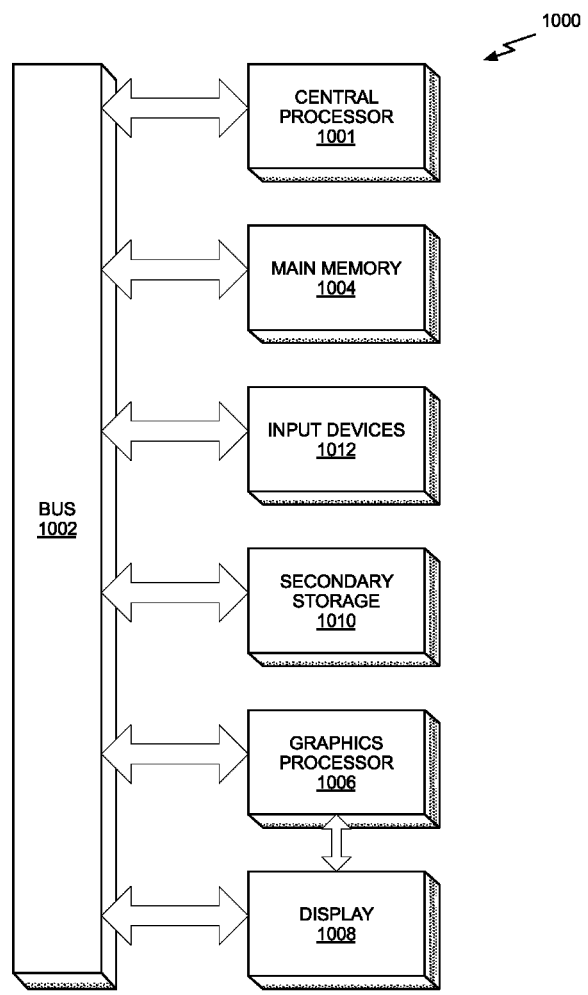
FIG. 10 illustrates an exemplary system in which the various architecture and/or functionality of the various previous embodiments may be implemented.

FIG. 10 illustrates an exemplary system 1000 in which the various architecture and/or functionality of the various previous embodiments of the speculative periodic synchronizer 850, speculative periodic synchronizer 900, or speculative periodic synchronizer 950 may be implemented. As shown, the system 1000 is provided including at least one central processor 1001 that is connected to a communication bus 1002. The communication bus 1002 may be implemented using any suitable protocol, such as PCI (Peripheral Component Interconnect), PCI-Express, AGP (Accelerated Graphics Port), HyperTransport, or any other bus or point-to-point communication protocol(s). The system 1000 also includes a main memory 1004. Control logic (software) and data are stored in the main memory 1004 which may take the form of random access memory (RAM).

The system 1000 also includes input devices 1012, a graphics processor 1006, and a display 1008, i.e. a conventional CRT (cathode ray tube), LCD (liquid crystal display), LED (light emitting diode), plasma display or the like. User input may be received from the input devices 1012, e.g., keyboard, mouse, touchpad, microphone, and the like. In one embodiment, the graphics processor 1006 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. One or more of the integrated circuits shown in FIG. 10 may include the speculative periodic synchronizer 850, speculative periodic synchronizer 900, or speculative periodic synchronizer 950 for transmitting signals between different clock domains.

The system 1000 may also include a secondary storage 1010. The secondary storage 1010 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1004 and/or the secondary storage 1010. Such computer programs, when executed, enable the system 1000 to perform various functions. The memory 1004, the storage 1010, and/or any other storage are possible examples of computer-readable media.

In one embodiment, the architecture and/or functionality of the various previous figures may be implemented in the context of the central processor 1001, the graphics processor 1006, an integrated circuit (not shown) that is capable of at least a portion of the capabilities of both the central processor 1001 and the graphics processor 1006, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1000 may take the form of a desktop computer, laptop computer, server, workstation, game consoles, embedded system, and/or any other type of logic. Still yet, the system 1000 may take the form of various other devices including, but not limited to a personal digital assistant (PDA) device, a mobile phone device, a television, etc.

Further, while not shown, the system 1000 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
   generating a first set of delayed versions of a first clock signal;
   sampling the first clock signal using the first set to produce a sequence of first clock samples in a domain corresponding to the first clock signal;
   generating a second set of delayed versions of a second clock signal;
   sampling the second set using the first set to produce an array of clock samples in the domain corresponding to the first dock signal; and
   locating at least one edge indication within the array of clock samples.

2. The method of claim 1, wherein the first set of delayed versions of the first clock signal track variations in a period of the first clock signal.

3. The method of claim 1, wherein the second set of delayed versions of the second clock signal track variations in a period of the second clock signal.

4. The method of claim 1, further comprising:
   generating a mask based on the first edge indication within the sequence of first clock samples; and
   applying the mask to the array of clock samples.

5. The method of claim 1, further comprising:
   determining that two edge indications of the at least one edge indication reside in a single column of the array of clock samples; and
   unwrapping the array of clock samples.

6. The method of claim 1, wherein the first set of delayed versions of the first clock signal are generated using a open-loop delay circuit.

7. The method of claim 1, further comprising processing a first edge indication and a second edge indication of the at least one edge indication within the array of clock samples to compute a period value representing a relative period between the second clock signal and the first clock signal.

8. The method of claim 1, further comprising processing a first edge indication and a second edge indication of the at least one edge indication within the array of clock samples to compute a phase value representing a phase of the second clock signal relative to the first clock signal.

9. The method of claim 1, wherein a frequency of the first clock signal varies over time.

10. The method of claim 1, wherein a frequency of the first clock signal varies in response to variations in a power supply voltage.

11. The method of claim 1, wherein a frequency of the second clock signal varies over time.

12. A method comprising:
    generating a first set of delayed versions of a first clock;
    generating a second set of delayed versions of a second clock signal;
    sampling the second set using the first set to produce an array of clock samples in a domain corresponding to the first clock signal;
    locating a first edge indication and a second edge indication within the array of clock samples;
    computing a slope of a line formed by the first edge indication and the second edge indication; and
    computing an intercept of the line with an axis.

13. The method of claim 12, wherein the slope represents a relative period value based on the second clock signal and the first clock signal.

14. The method of claim 12, wherein the intercept represents a relative phase value based on the second clock signal and the first clock signal.

15. An integrated circuit comprising:
    first circuitry operating in a first clock domain corresponding to a first clock signal;
    second circuitry operating in a second clock domain corresponding to a second clock signal; and
    a phase detector configured to:
      generate a first set of delayed versions of the first clock signal;
      sample the first clock signal using the first set to produce a sequence of first clock samples in the first clock domain;
      locate a first edge indication within the sequence of first clock samples;
      generate a second set of delayed versions of the second clock signal;
      sample the second set using the first set to produce an array of clock samples in the first clock domain; and
      locate at least one edge indication within the array of clock samples.

16. The integrated circuit of claim 15, wherein the phase detector comprises an open-loop delay circuit that is configured to generate the first set of delayed versions of the first clock signal.

17. The integrated circuit of claim 15, wherein the phase detector is further configured to process the at least one edge indication to compute a phase value representing a phase of the second clock signal relative to the first clock signal.

18. The integrated circuit of claim 15, wherein the phase detector is further configured to process the at least one edge indication to compute a period value representing a relative period between the second clock signal and the first clock signal.

* * * * *